(12) United States Patent
Sakamoto et al.

(10) Patent No.: US 9,245,838 B2
(45) Date of Patent: Jan. 26, 2016

(54) SEMICONDUCTOR ELEMENT

(71) Applicant: IBIDEN CO., LTD., Ogaki-shi (JP)

(72) Inventors: Hajime Sakamoto, Ibi-gun (JP); Dongdong Wang, Ibi-gun (JP)

(73) Assignee: IBIDEN CO., LTD., Ogaki-shi (JP)

(*) Notice: Subject to any disclaimer, the term of this patent is extended or adjusted under 35 U.S.C. 154(b) by 0 days.

(21) Appl. No.: 14/601,541

(22) Filed: Jan. 21, 2015

(65) Prior Publication Data

US 2015/0130079 A1 May 14, 2015

Related U.S. Application Data

(60) Continuation of application No. 12/274,162, filed on Nov. 19, 2008, now Pat. No. 8,959,756, which is a continuation of application No. 12/107,377, filed on Apr. 22, 2008, now Pat. No. 8,524,535, which is a division of application No. 10/380,631, filed as application No. PCT/JP01/03589 on Apr. 25, 2001, now Pat. No. 7,855,342.

(30) Foreign Application Priority Data

| Sep. 25, 2000 | (JP) | 2000-290231 |
| Sep. 25, 2000 | (JP) | 2000-290232 |
| Dec. 15, 2000 | (JP) | 2000-382806 |
| Dec. 15, 2000 | (JP) | 2000-382807 |
| Dec. 15, 2000 | (JP) | 2000-382813 |
| Dec. 15, 2000 | (JP) | 2000-382814 |

(51) Int. Cl.
*H01L 23/49* (2006.01)
*H01L 23/498* (2006.01)
(Continued)

(52) U.S. Cl.
CPC ........ *H01L 23/49838* (2013.01); *H01L 21/568* (2013.01); *H01L 21/6835* (2013.01);
(Continued)

(58) Field of Classification Search
CPC ............ H01L 23/49838; H01L 23/49844
See application file for complete search history.

(56) References Cited

U.S. PATENT DOCUMENTS

| 3,495,324 A | 2/1970 | Guthrie et al. |
| 3,775,844 A | 12/1973 | Parks |

(Continued)

FOREIGN PATENT DOCUMENTS

| EP | 0 465 138 | 1/1992 |
| EP | 0 471 938 | 2/1992 |

(Continued)

OTHER PUBLICATIONS

Michael Gdula, et al., "A High-Speed, High-Density Multiprocessing Module Made with the General Electric High-Density Interconnect Technology" Digital Signal Processing, Academic Press, vol. 2, No. 4, XP-000393639, Oct. 1, 1992, pp. 247-251.

*Primary Examiner* — Jeremy C Norris
(74) *Attorney, Agent, or Firm* — Oblon, McClelland, Maier & Neustadt, L.L.P.

(57) ABSTRACT

A multilayer device has a resin layer, a semiconductor device positioned in the resin layer and including an electronic component and a passivation layer having an opening exposing an electrode of the electronic component, an intermediate layer including metal layers and formed in the opening of the passivation layer such that the intermediate layer is connected to the electrode of the electronic component, and a buildup layer formed on the resin layer and including an insulating layer and a via conductor formed in the insulating layer such that the via conductor is connected to the intermediate layer. The resin layer includes one or more resin material selected from the group consisting of a thermosetting resin material and a thermoplastic resin material.

20 Claims, 70 Drawing Sheets

(51) Int. Cl.
  *H01L 21/56* (2006.01)
  *H01L 21/683* (2006.01)
  *H01L 23/538* (2006.01)
  *H01L 23/00* (2006.01)
  *H05K 1/18* (2006.01)
  *H05K 3/46* (2006.01)

(52) U.S. Cl.
  CPC .... *H01L23/49816* (2013.01); *H01L 23/49822* (2013.01); *H01L 23/49866* (2013.01); *H01L 23/49894* (2013.01); *H01L 23/5389* (2013.01); *H01L 24/19* (2013.01); *H01L 24/24* (2013.01); *H01L 24/27* (2013.01); *H01L 24/97* (2013.01); *H05K 1/185* (2013.01); *H01L 23/49811* (2013.01); *H01L 2224/0401* (2013.01); *H01L 2224/04105* (2013.01); *H01L 2224/1147* (2013.01); *H01L 2224/12105* (2013.01); *H01L 2224/20* (2013.01); *H01L 2224/24137* (2013.01); *H01L 2224/24227* (2013.01); *H01L 2224/274* (2013.01); *H01L 2224/32225* (2013.01); *H01L 2224/32245* (2013.01); *H01L 2224/73267* (2013.01); *H01L 2224/92244* (2013.01); *H01L 2224/97* (2013.01); *H01L 2924/0102* (2013.01); *H01L 2924/0103* (2013.01); *H01L 2924/01004* (2013.01); *H01L 2924/01005* (2013.01); *H01L 2924/01006* (2013.01); *H01L 2924/01011* (2013.01); *H01L 2924/01012* (2013.01); *H01L 2924/01013* (2013.01); *H01L 2924/01015* (2013.01); *H01L 2924/01018* (2013.01); *H01L 2924/01019* (2013.01); *H01L 2924/01024* (2013.01); *H01L 2924/01027* (2013.01); *H01L 2924/01029* (2013.01); *H01L 2924/01033* (2013.01); *H01L 2924/01039* (2013.01); *H01L 2924/01046* (2013.01); *H01L 2924/01047* (2013.01); *H01L 2924/01051* (2013.01); *H01L 2924/01074* (2013.01); *H01L 2924/01078* (2013.01); *H01L 2924/01079* (2013.01); *H01L 2924/01082* (2013.01); *H01L 2924/14* (2013.01); *H01L 2924/1517* (2013.01); *H01L 2924/1532* (2013.01); *H01L 2924/15153* (2013.01); *H01L 2924/15174* (2013.01); *H01L 2924/15311* (2013.01); *H01L 2924/15312* (2013.01); *H01L 2924/15787* (2013.01); *H01L 2924/30107* (2013.01); *H05K 3/4602* (2013.01); *H05K 2201/096* (2013.01); *H05K 2201/09036* (2013.01); *H05K 2201/09563* (2013.01); *Y10T 29/4913* (2015.01); *Y10T 29/49126* (2015.01); *Y10T 29/49128* (2015.01); *Y10T 29/49133* (2015.01); *Y10T 29/49139* (2015.01); *Y10T 29/49144* (2015.01); *Y10T 29/49155* (2015.01); *Y10T 29/49165* (2015.01)

(56) References Cited

U.S. PATENT DOCUMENTS

| | | | |
|---|---|---|---|
| 3,903,590 A | 9/1975 | Yokogawa |
| 4,356,223 A | 10/1982 | Iida et al. |
| 4,372,996 A | 2/1983 | Guditz et al. |
| 4,571,146 A | 2/1986 | Eriksson |
| 4,751,146 A | 6/1988 | Maeda et al. |
| 4,783,695 A | 11/1988 | Eichelberger et al. |
| 4,835,704 A | 5/1989 | Eichelberger et al. |
| 4,894,115 A | 1/1990 | Eichelberger et al. |
| 5,021,016 A | 6/1991 | Currey |
| 5,042,145 A | 8/1991 | Boucquet |
| 5,073,814 A | 12/1991 | Cole, Jr. et al. |
| 5,081,563 A | 1/1992 | Feng et al. |
| 5,108,950 A | 4/1992 | Wakabayashi et al. |
| 5,111,278 A | 5/1992 | Eichelberger |
| 5,126,016 A | 6/1992 | Glenning et al. |
| 5,130,889 A | 7/1992 | Hamburgen et al. |
| 5,161,093 A | 11/1992 | Gorczyca et al. |
| 5,250,843 A | 10/1993 | Eichelberger |
| 5,289,631 A | 3/1994 | Koopman et al. |
| 5,297,006 A | 3/1994 | Mizukoshi |
| 5,304,511 A | 4/1994 | Sakai |
| 5,309,322 A | 5/1994 | Wagner et al. |
| 5,318,923 A | 6/1994 | Park |
| 5,353,498 A | 10/1994 | Fillion et al. |
| 5,386,623 A | 2/1995 | Okamoto et al. |
| 5,410,184 A | 4/1995 | Melton et al. |
| 5,434,751 A | 7/1995 | Cole, Jr. et al. |
| 5,455,459 A | 10/1995 | Fillion et al. |
| 5,521,122 A | 5/1996 | Kuramochi |
| 5,524,339 A | 6/1996 | Gorowitz et al. |
| 5,563,449 A | 10/1996 | Dion et al. |
| 5,596,227 A | 1/1997 | Saito |
| 5,629,564 A | 5/1997 | Nye, III et al. |
| 5,700,716 A | 12/1997 | Sharan et al. |
| 5,710,063 A | 1/1998 | Forehand et al. |
| 5,713,127 A | 2/1998 | Chobot et al. |
| 5,745,984 A | 5/1998 | Cole, Jr. et al. |
| 5,757,072 A | 5/1998 | Gorowitz et al. |
| 5,773,899 A | 6/1998 | Zambrano |
| 5,817,405 A | 10/1998 | Bhatt et al. |
| 5,829,125 A | 11/1998 | Fujimoto et al. |
| 5,841,193 A | 11/1998 | Eichelberger |
| 5,862,583 A | 1/1999 | Ammann et al. |
| 5,887,343 A | 3/1999 | Salatino et al. |
| 5,920,123 A | 7/1999 | Moden |
| 5,937,320 A | 8/1999 | Andricacos et al. |
| 5,940,688 A | 8/1999 | Higuchi et al. |
| 5,943,597 A | 8/1999 | Kleffner et al. |
| 5,969,424 A | 10/1999 | Matsuki et al. |
| 5,972,736 A | 10/1999 | Malladi et al. |
| 5,985,377 A | 11/1999 | Corbett |
| 5,994,771 A | 11/1999 | Sasaki et al. |
| 5,998,859 A | 12/1999 | Griswold et al. |
| 6,025,995 A | 2/2000 | Marcinkiewicz |
| 6,110,806 A | 8/2000 | Pogge |
| 6,111,321 A | 8/2000 | Agarwala |
| 6,153,829 A | 11/2000 | Carapella et al. |
| 6,154,366 A | 11/2000 | Ma et al. |
| 6,162,652 A | 12/2000 | Dass et al. |
| 6,193,132 B1 | 2/2001 | Shibata et al. |
| 6,232,212 B1 | 5/2001 | Degani et al. |
| 6,232,558 B1 | 5/2001 | Tsukada et al. |
| 6,235,453 B1 | 5/2001 | You et al. |
| 6,236,108 B1 | 5/2001 | Sota et al. |
| 6,248,428 B1 | 6/2001 | Asai et al. |
| 6,256,875 B1 | 7/2001 | Watanabe et al. |
| 6,271,469 B1 | 8/2001 | Ma et al. |
| 6,281,046 B1 | 8/2001 | Lam |
| 6,292,366 B1 | 9/2001 | Platt |
| 6,294,741 B1 | 9/2001 | Cole, Jr. et al. |
| 6,317,948 B1 | 11/2001 | Kola et al. |
| 6,324,067 B1 | 11/2001 | Nishiyama |
| 6,327,158 B1 | 12/2001 | Kelkar et al. |
| 6,330,259 B1 | 12/2001 | Dahm |
| 6,337,228 B1 | 1/2002 | Juskey et al. |
| 6,339,197 B1 | 1/2002 | Fushie et al. |
| 6,365,833 B1 | 4/2002 | Eng et al. |
| 6,370,013 B1 | 4/2002 | Iino et al. |
| 6,395,073 B1 | 5/2002 | Dauber |
| 6,399,230 B1 | 6/2002 | Tormey et al. |
| 6,421,225 B2 | 7/2002 | Bergstedt |
| 6,433,360 B1 | 8/2002 | Dosdos et al. |
| 6,560,860 B2 | 5/2003 | Shepherd |
| 6,586,276 B2 | 7/2003 | Towle et al. |
| 6,606,792 B1 | 8/2003 | Andresakis |
| 6,627,997 B1 | 9/2003 | Eguchi |
| 6,657,707 B1 | 12/2003 | Morken et al. |
| 6,667,230 B2 | 12/2003 | Chen et al. |
| 6,750,135 B2 | 6/2004 | Elenius et al. |
| 6,756,295 B2 | 6/2004 | Lin et al. |

(56) References Cited

U.S. PATENT DOCUMENTS

| | | |
|---|---|---|
| 6,782,897 B2 | 8/2004 | Wang et al. |
| 6,909,054 B2 | 6/2005 | Sakamoto et al. |
| 7,008,867 B2 | 3/2006 | Lei |
| 7,189,596 B1 | 3/2007 | Mu et al. |
| 7,405,149 B1 | 7/2008 | Lin et al. |
| 7,435,910 B2 | 10/2008 | Sakamoto et al. |
| 8,079,142 B2 | 12/2011 | Sakamoto et al. |
| 2002/0000239 A1 | 1/2002 | Sachdev et al. |
| 2003/0014863 A1 | 1/2003 | Lee et al. |
| 2003/0134233 A1 | 7/2003 | Su et al. |
| 2004/0014317 A1 | 1/2004 | Sakamoto et al. |
| 2004/0166661 A1 | 8/2004 | Lei |
| 2004/0222522 A1 | 11/2004 | Homma |
| 2005/0014355 A1 | 1/2005 | Chan et al. |
| 2007/0209831 A1 | 9/2007 | Sakamoto et al. |
| 2007/0227765 A1 | 10/2007 | Sakamoto et al. |
| 2008/0148563 A1 | 6/2008 | Sakamoto et al. |
| 2008/0151517 A1 | 6/2008 | Sakamoto et al. |
| 2008/0151519 A1 | 6/2008 | Sakamoto et al. |
| 2008/0151520 A1 | 6/2008 | Sakamoto et al. |
| 2008/0151522 A1 | 6/2008 | Sakamoto et al. |
| 2008/0169123 A1 | 7/2008 | Sakamoto et al. |
| 2008/0201944 A1 | 8/2008 | Sakamoto et al. |
| 2008/0206926 A1 | 8/2008 | Sakamoto et al. |
| 2008/0230914 A1 | 9/2008 | Sakamoto et al. |
| 2009/0070996 A1 | 3/2009 | Sakamoto et al. |
| 2009/0077796 A1 | 3/2009 | Sakamoto et al. |
| 2009/0263939 A1 | 10/2009 | Sakamoto et al. |

FOREIGN PATENT DOCUMENTS

| | | |
|---|---|---|
| EP | 0 777 274 | 6/1997 |
| EP | 0 884 128 | 12/1998 |
| EP | 1 003 209 A1 | 5/2000 |
| EP | 1 024 531 | 8/2000 |
| EP | 1 032 030 A2 | 8/2000 |
| EP | 1 039 789 | 9/2000 |
| EP | 1 259 103 | 11/2002 |
| JP | 02-058345 | 2/1990 |
| JP | 02-312296 | 12/1990 |
| JP | 03-024786 | 2/1991 |
| JP | 03-038084 | 2/1991 |
| JP | 03-050734 | 3/1991 |
| JP | 03-077327 | 4/1991 |
| JP | 03-101234 | 4/1991 |
| JP | 04-025038 | 1/1992 |
| JP | 04-065832 | 3/1992 |
| JP | 04-072656 | 3/1992 |
| JP | 04-154197 A | 5/1992 |
| JP | 04-233265 | 8/1992 |
| JP | 05-046069 | 6/1993 |
| JP | 05-160588 A | 6/1993 |
| JP | 05-275856 | 10/1993 |
| JP | 06-268098 | 9/1994 |
| JP | 06-268101 A | 9/1994 |
| JP | 06-350020 | 12/1994 |
| JP | 07-058276 A | 3/1995 |
| JP | 08-078572 | 3/1996 |
| JP | 08-255855 A | 10/1996 |
| JP | 08-330313 | 12/1996 |
| JP | 09-278494 | 10/1997 |
| JP | 09-321408 | 12/1997 |
| JP | 10-098081 | 4/1998 |
| JP | 10-189635 | 7/1998 |
| JP | 10-199886 | 7/1998 |
| JP | 10-256429 | 9/1998 |
| JP | 10-256737 A | 9/1998 |
| JP | 10-284632 | 10/1998 |
| JP | 10-321634 A | 12/1998 |
| JP | 11-054939 | 2/1999 |
| JP | 11-103166 | 4/1999 |
| JP | 11-111738 | 4/1999 |
| JP | 11-126978 | 5/1999 |
| JP | 11-145174 | 5/1999 |
| JP | 11-163213 A | 6/1999 |
| JP | 11-176977 | 7/1999 |
| JP | 11-220262 A | 8/1999 |
| JP | 11-233678 | 8/1999 |
| JP | 11-251754 A | 9/1999 |
| JP | 11-274734 | 10/1999 |
| JP | 2000-021916 | 1/2000 |
| JP | 2000-150705 | 5/2000 |
| JP | 2000-151079 | 5/2000 |
| JP | 2000-228423 | 8/2000 |
| JP | 2000-243754 | 9/2000 |
| JP | 2000-260902 | 9/2000 |
| JP | 2000-323645 | 11/2000 |
| KR | 121735 | 11/1997 |
| KR | 1999-2341 | 1/1999 |
| WO | 99-30542 | 6/1999 |
| WO | WO 00/63970 | 10/2000 |

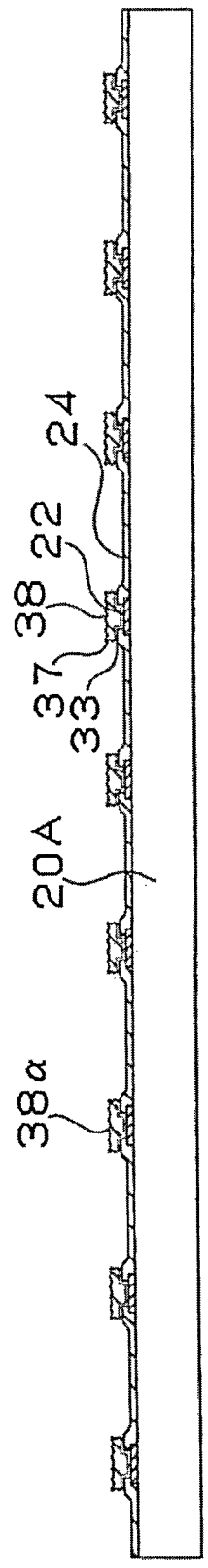
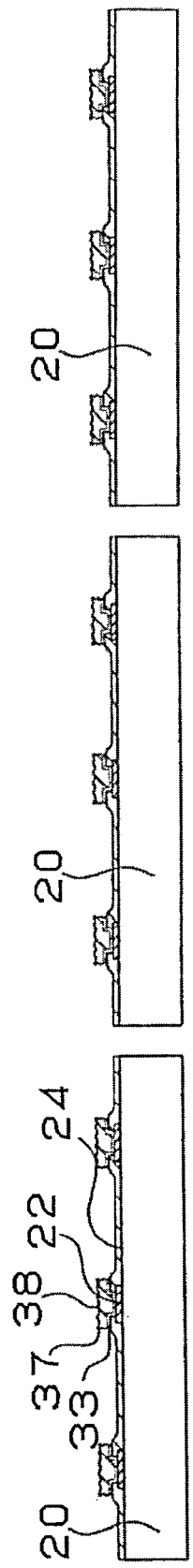
FIG. 3(A)
FIG. 3(B)

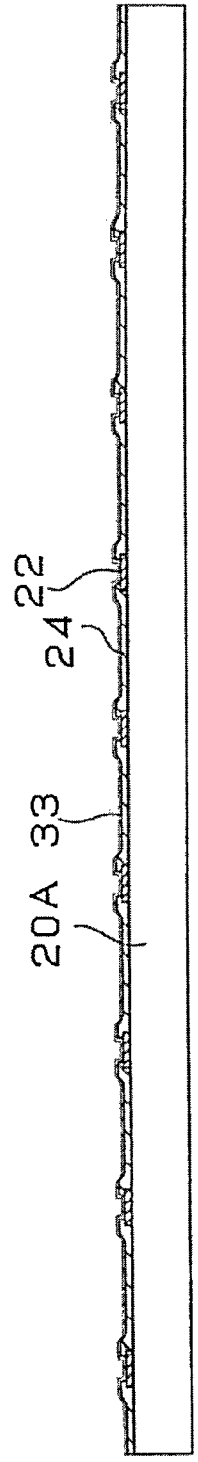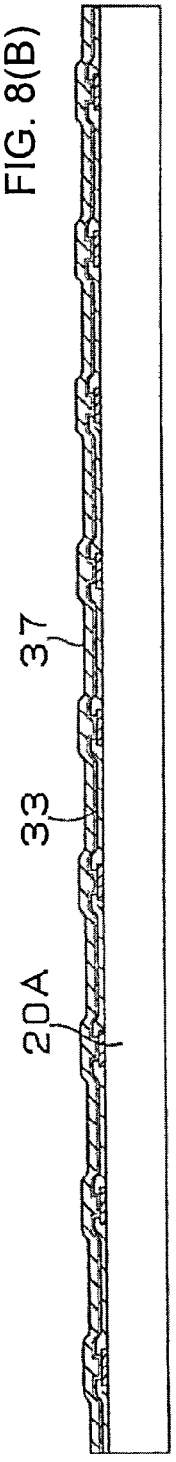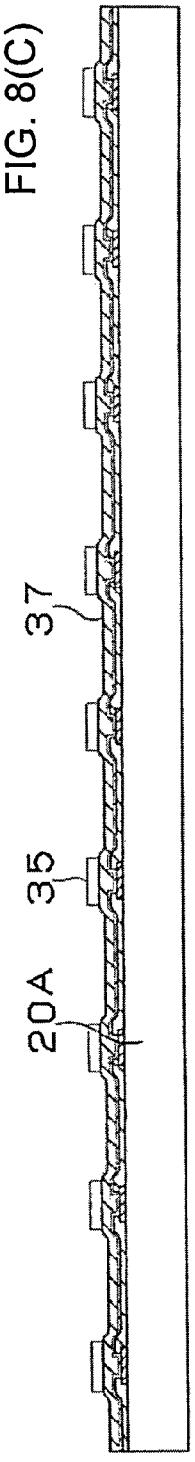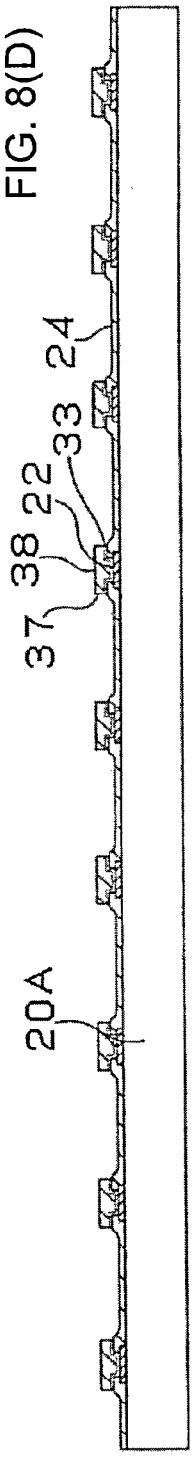

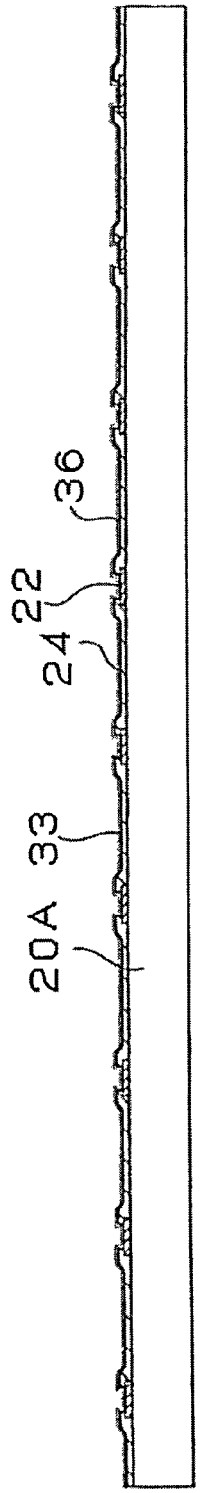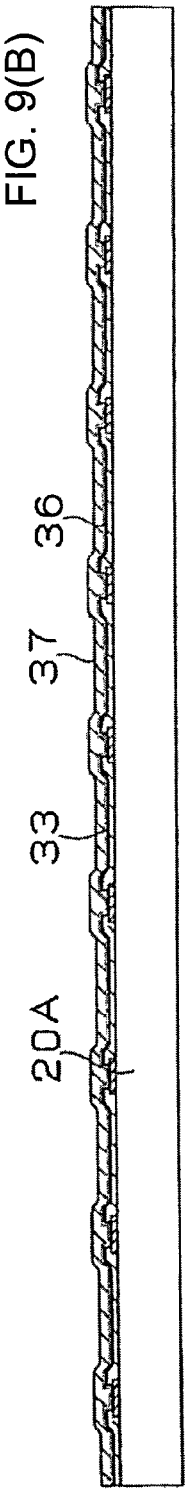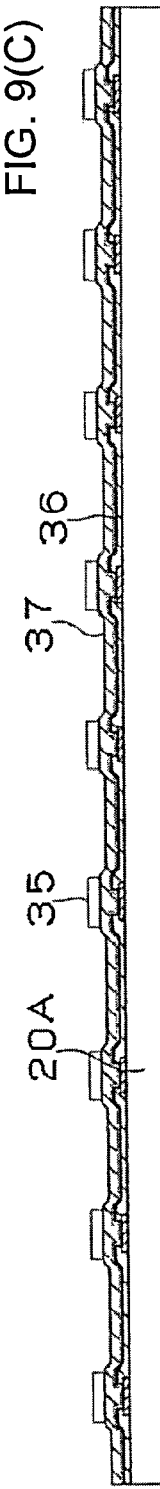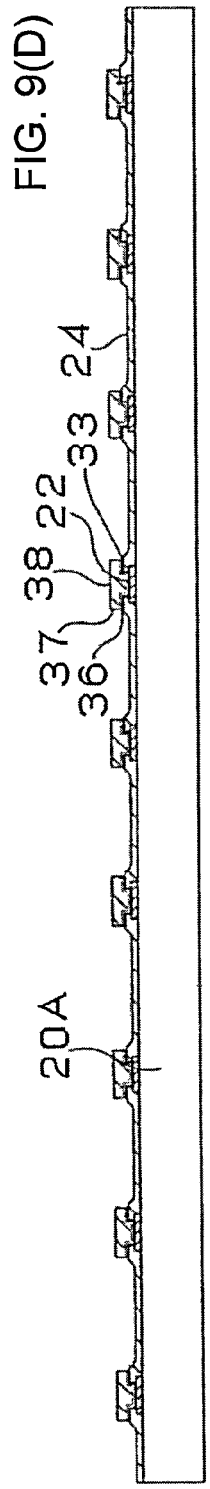

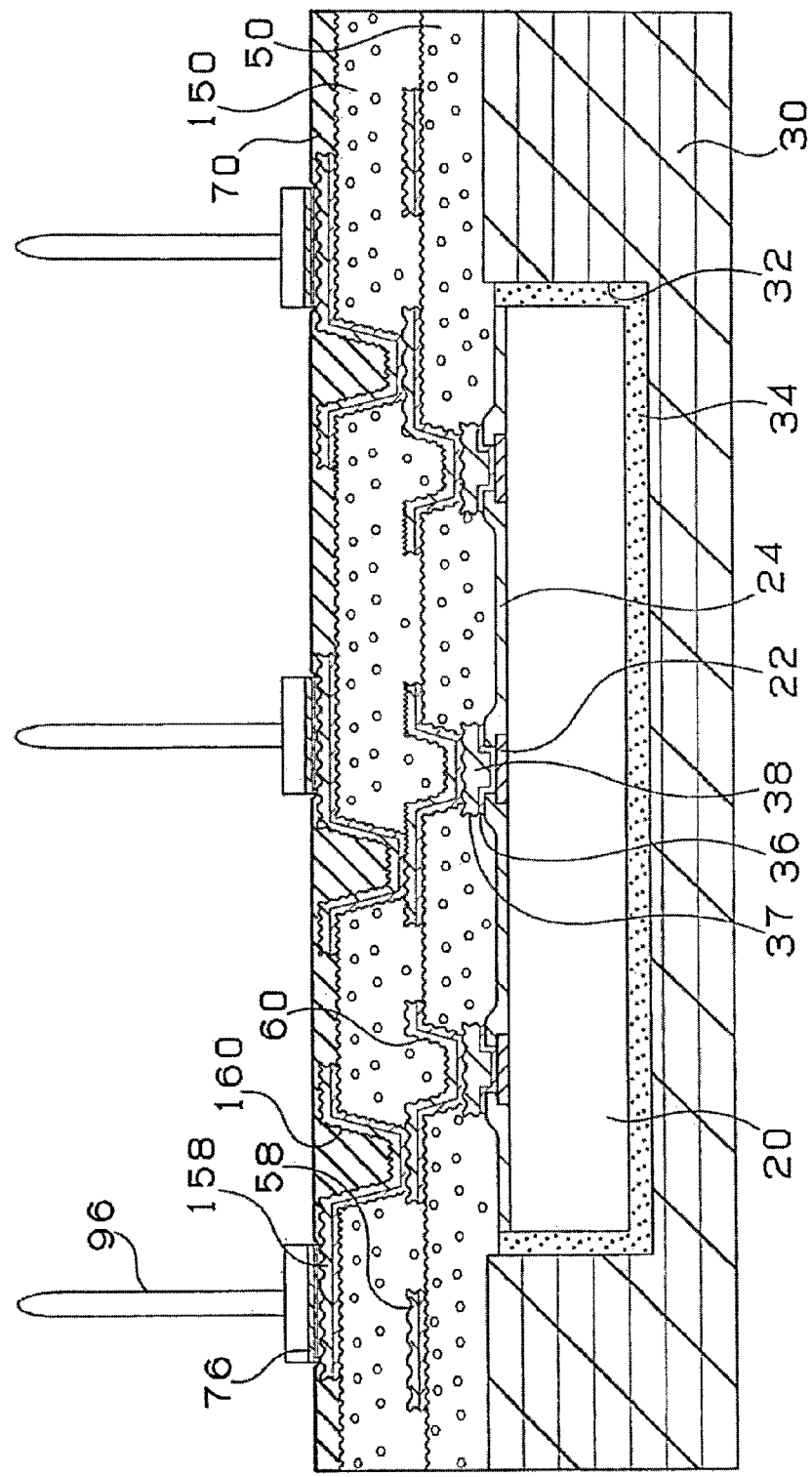

FIG. 17

Result Of Estimation Of Embodiment And Comparison Example

| Semiconductor Device | Multilayer Printed Wiring Board According To The First Embodiment | | | Multilayer Printed Wiring Board According To The First Modification | | |
|---|---|---|---|---|---|---|
| | Discoloration /Dissolution | Formed Or Not Formed | Connection Resistances (Ω) | Discoloration /Dissolution | Formed Or Not Formed | Connection Resistance (Ω) |
| First Embodiment | No | Formed | 0.20 | No | Formed | 0.22 |
| First Other Example Of First Embodiment | No | Formed | 0.18 | No | Formed | 0.18 |
| First Modification | No | Formed | 0.17 | No | Formed | 0.17 |
| First Other Example Of First Modification | No | Formed | 0.22 | No | Formed | 0.19 |
| Second Other Example Of First Modification | No | Formed | 0.20 | No | Formed | 0.20 |
| Third Other Example Of First Modification | No | Formed | 0.17 | No | Formed | 0.20 |
| Fourth Other Example Of First Modification | No | Formed | 0.14 | No | Formed | 0.18 |
| Fifth Other Example Of First Modification | No | Formed | 0.20 | No | Formed | 0.16 |

FIG. 18

Result Of Estimation Of Embodiment And Comparison Example

| Semiconductor Device | Multilayer Printed Wiring Board According To The First Embodiment | | | Multilayer Printed Wiring Board According To The Second Embodiment | | |
|---|---|---|---|---|---|---|
| | Discoloration /Dissolution | Formed Or Not Formed | Connection Resistance (Ω) | Discoloration /Dissolution | Formed Or Not Formed | Connection Resistance (Ω) |
| Second Modification | No | Formed | 0.17 | No | Formed | 0.16 |
| First Other Example Of Second Modification | No | Formed | 0.18 | No | Formed | 0.22 |
| Third Modification | No | Formed | 0.23 | No | Formed | 0.19 |
| First Other Example Of Third Modification | No | Formed | 0.22 | No | Formed | 0.19 |
| Second Other Example Of Third Modification | No | Formed | 0.20 | No | Formed | 0.17 |
| Third Other Example Of Third Modification | No | Formed | 0.20 | No | Formed | 0.18 |
| Fourth Other Example Of Third Modification | No | Formed | 0.18 | No | Formed | 0.22 |
| Fifth Other Example Of Third Modification | No | Formed | 0.15 | No | Formed | 0.20 |
| Comparison Example 1 | Yes | Not Formed | More Than 1 k | Yes | Not Formed | More Than 1 k |
| Comparison Example 2 | Yes | Not Formed | More Than 1 k | Yes | Not Formed | More Than 1 k |

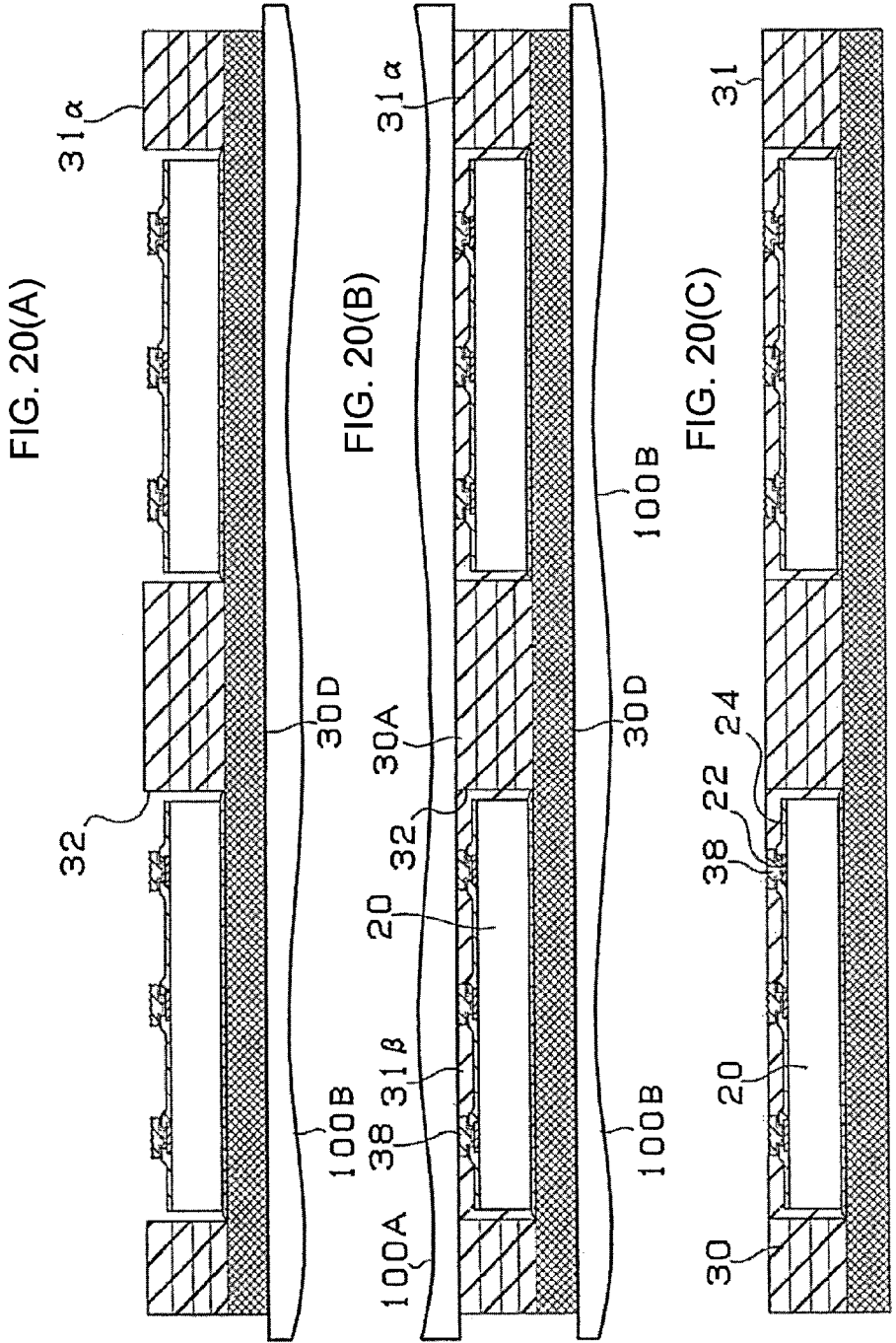

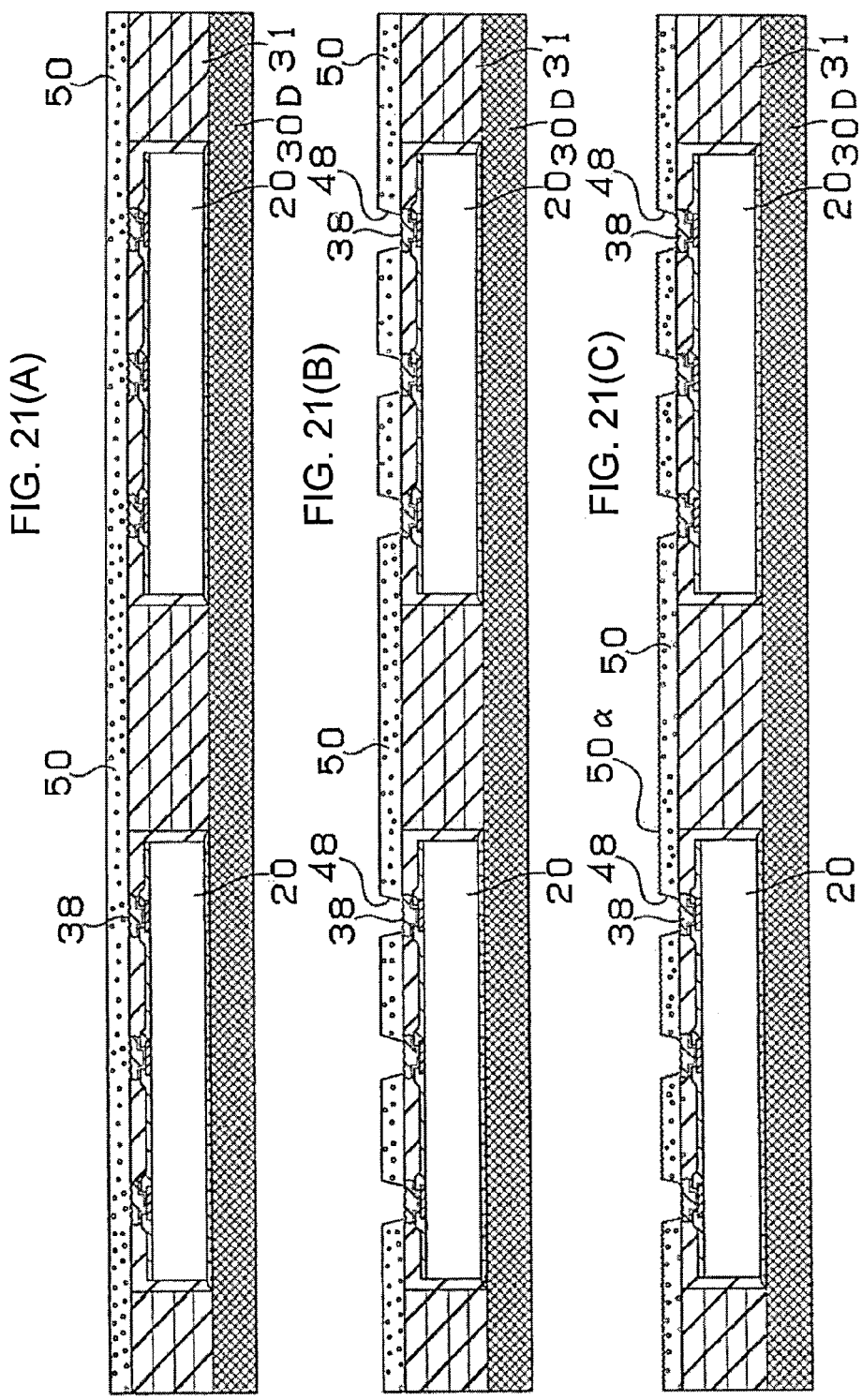

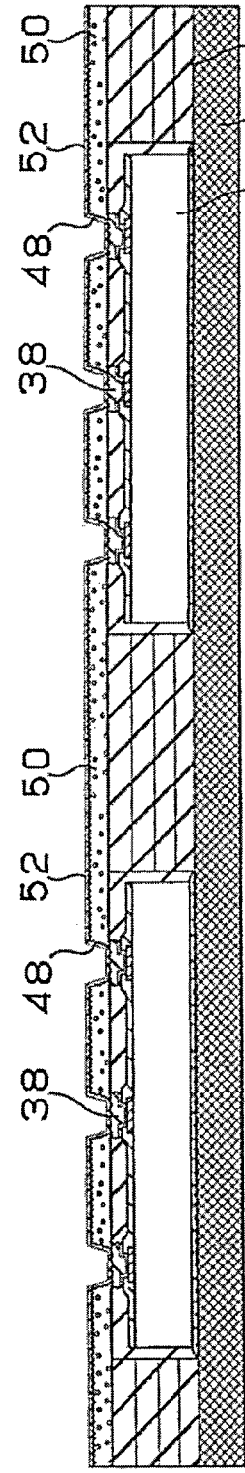
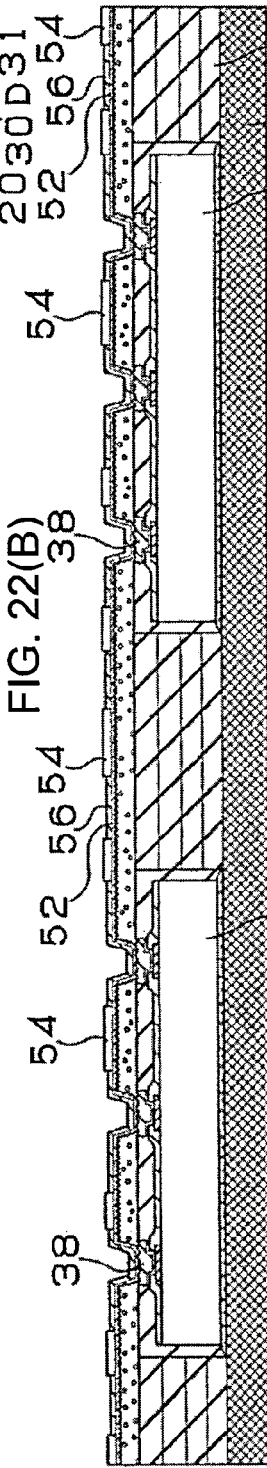
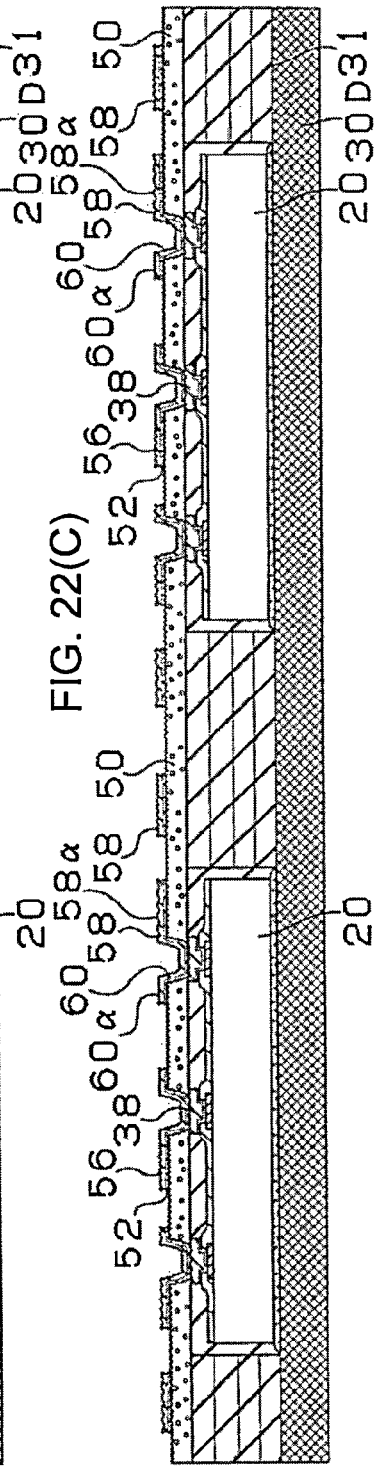
FIG. 22(A)
FIG. 22(B)
FIG. 22(C)

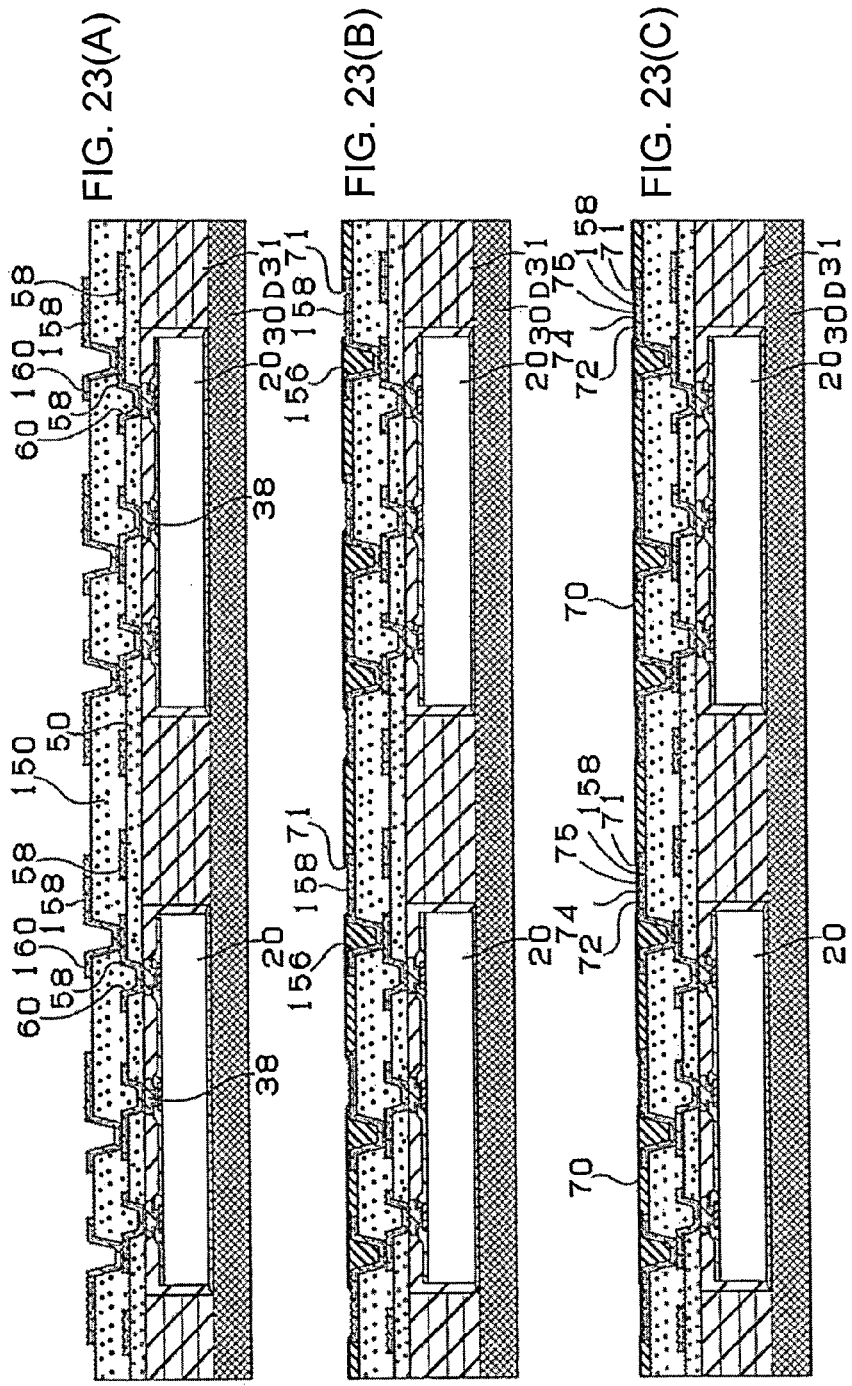

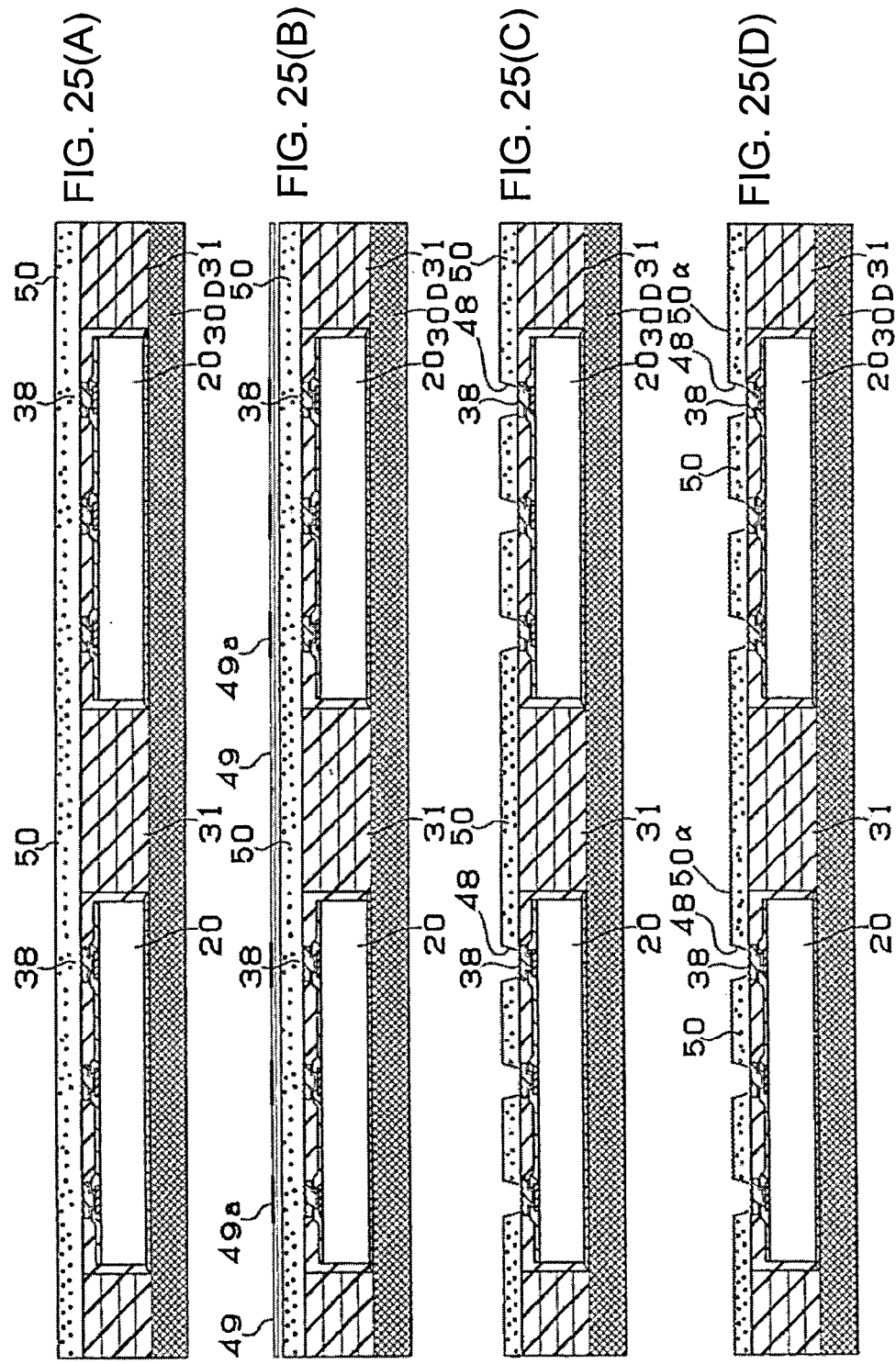

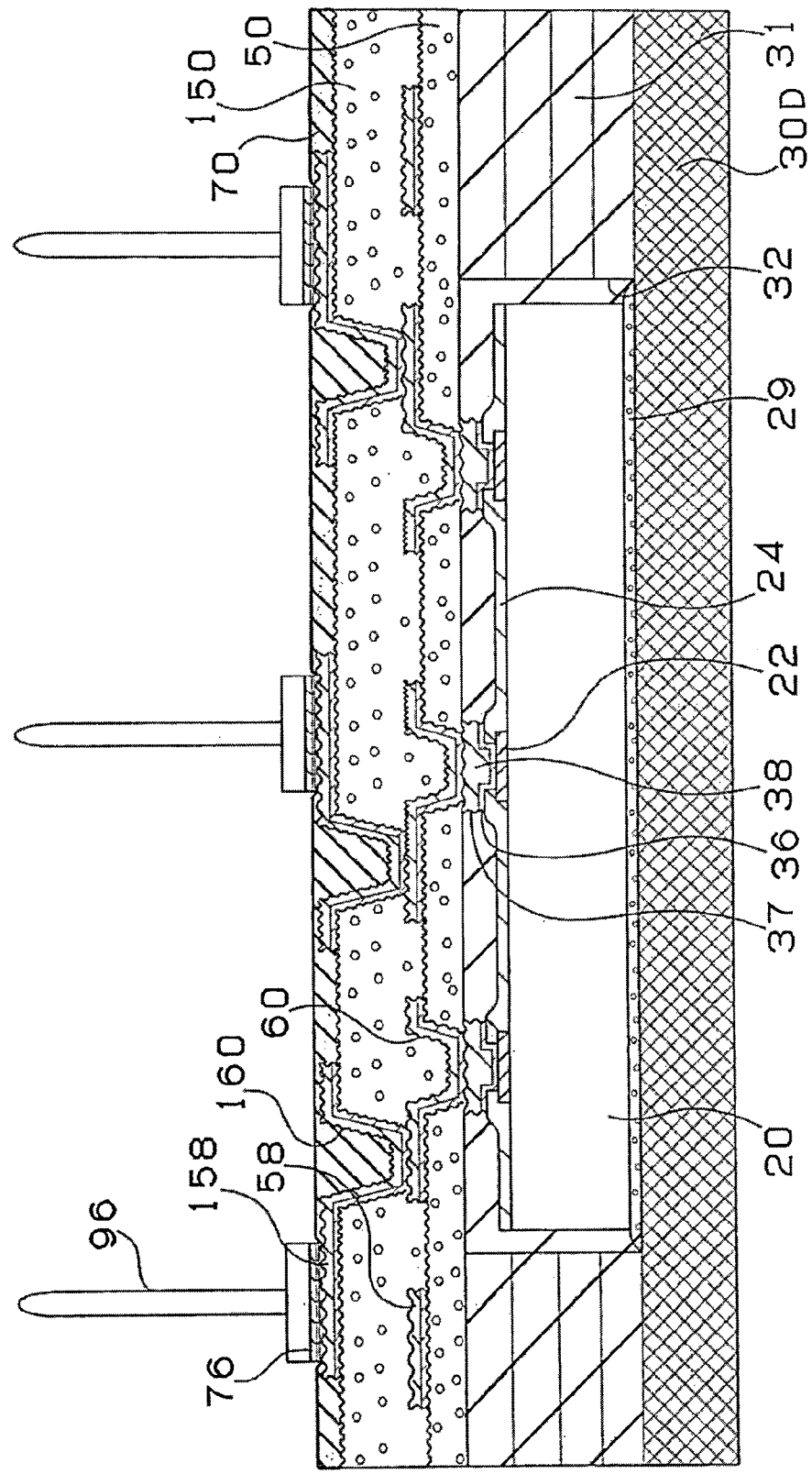

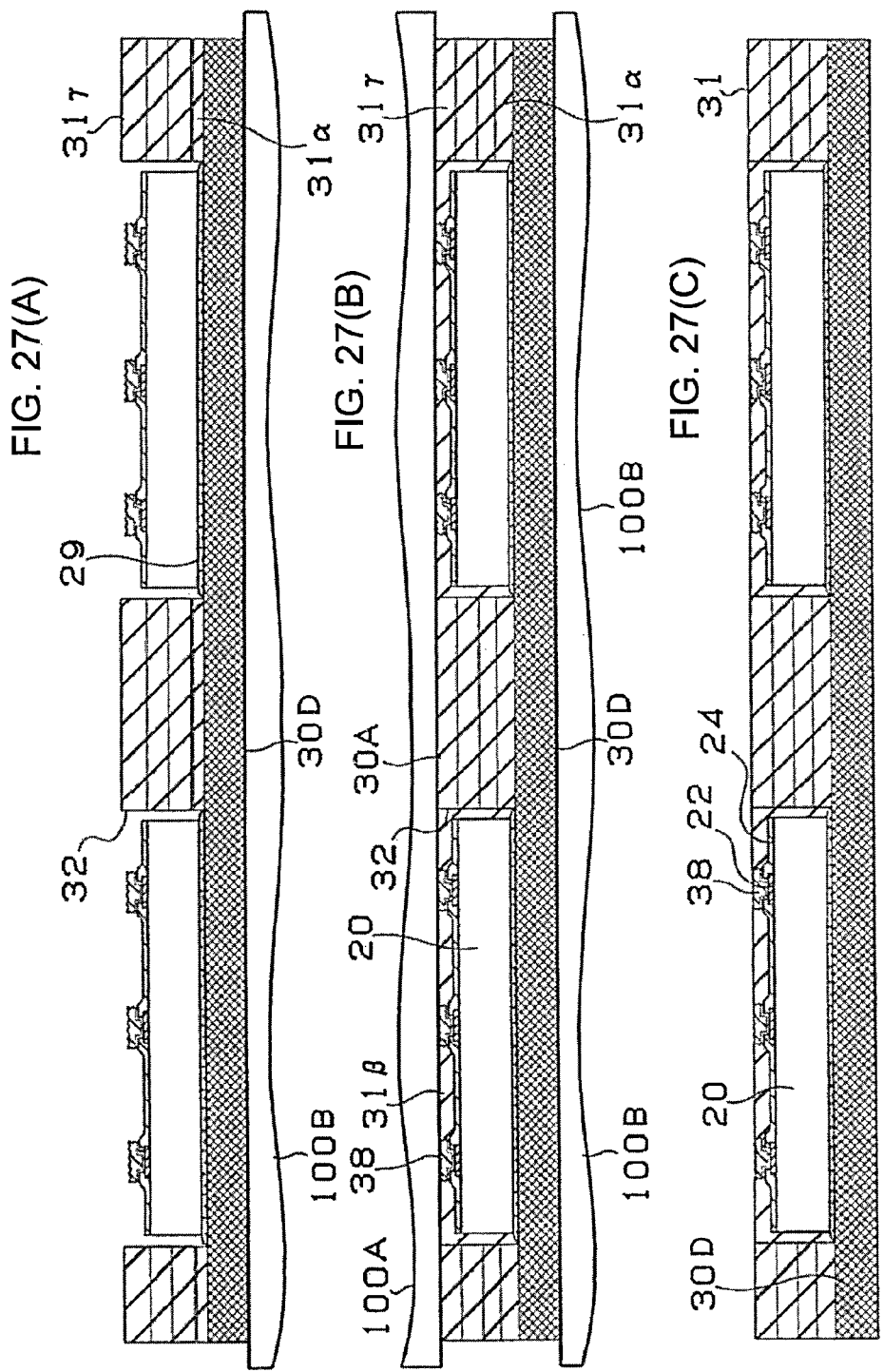

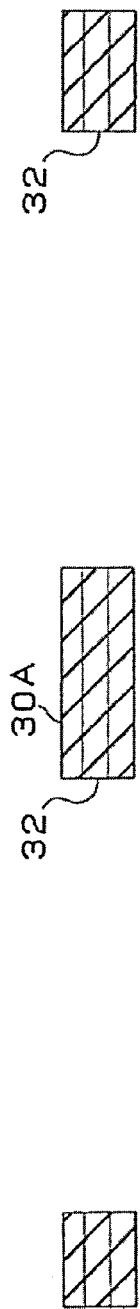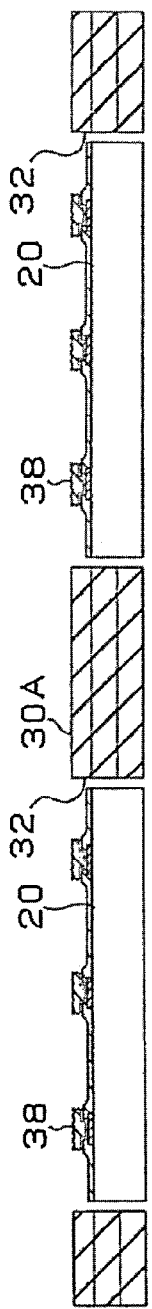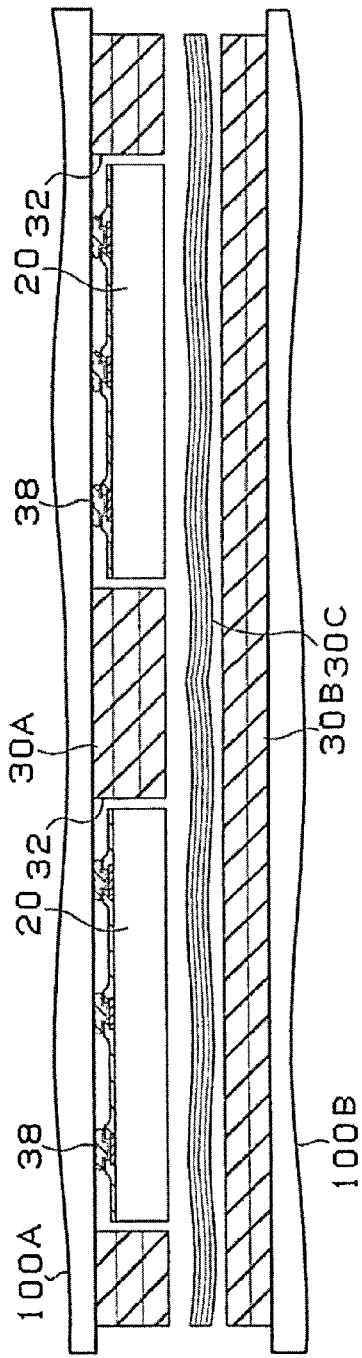

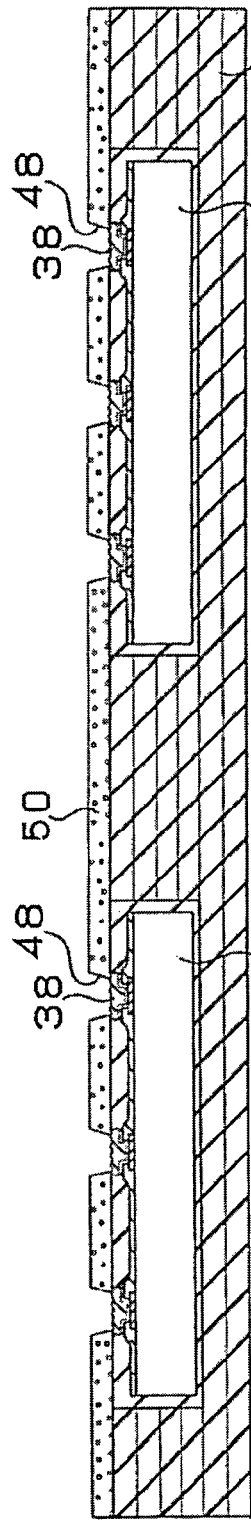
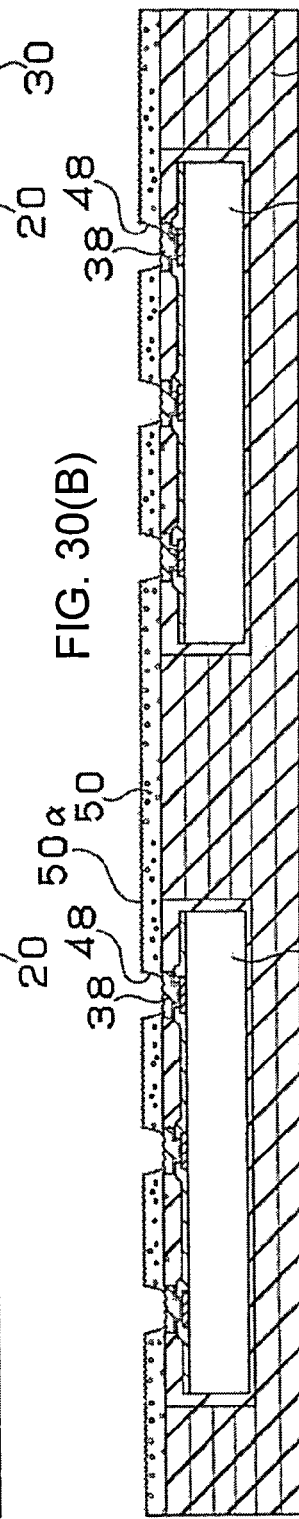
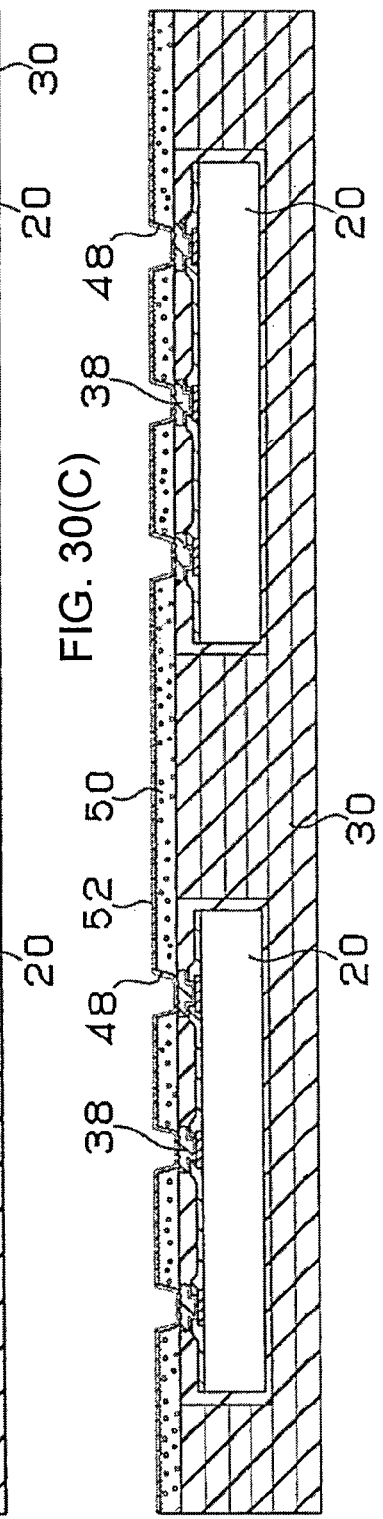

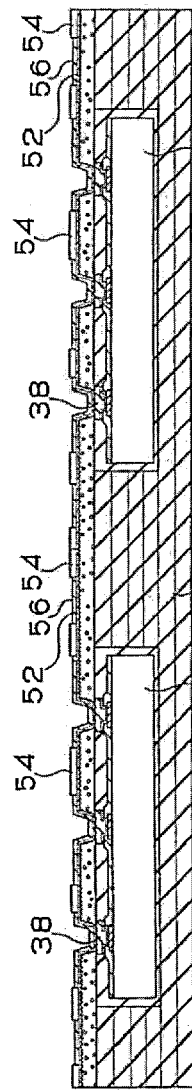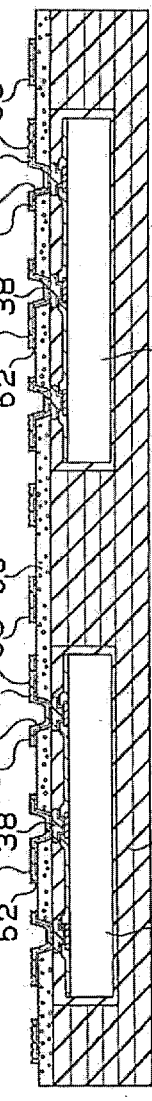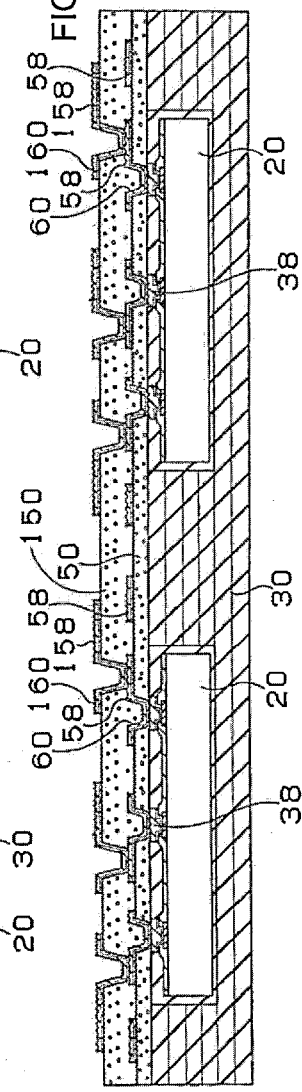

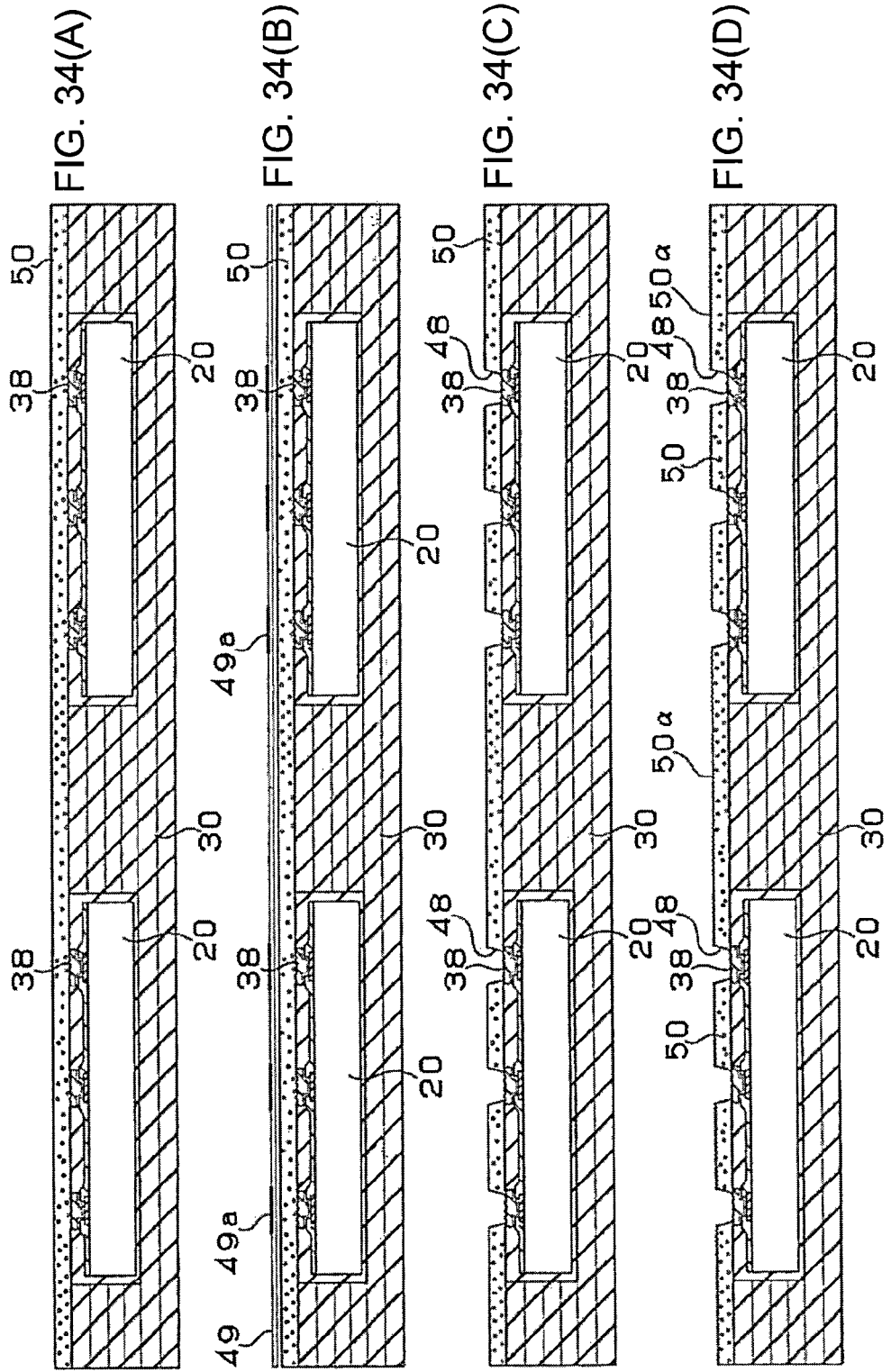

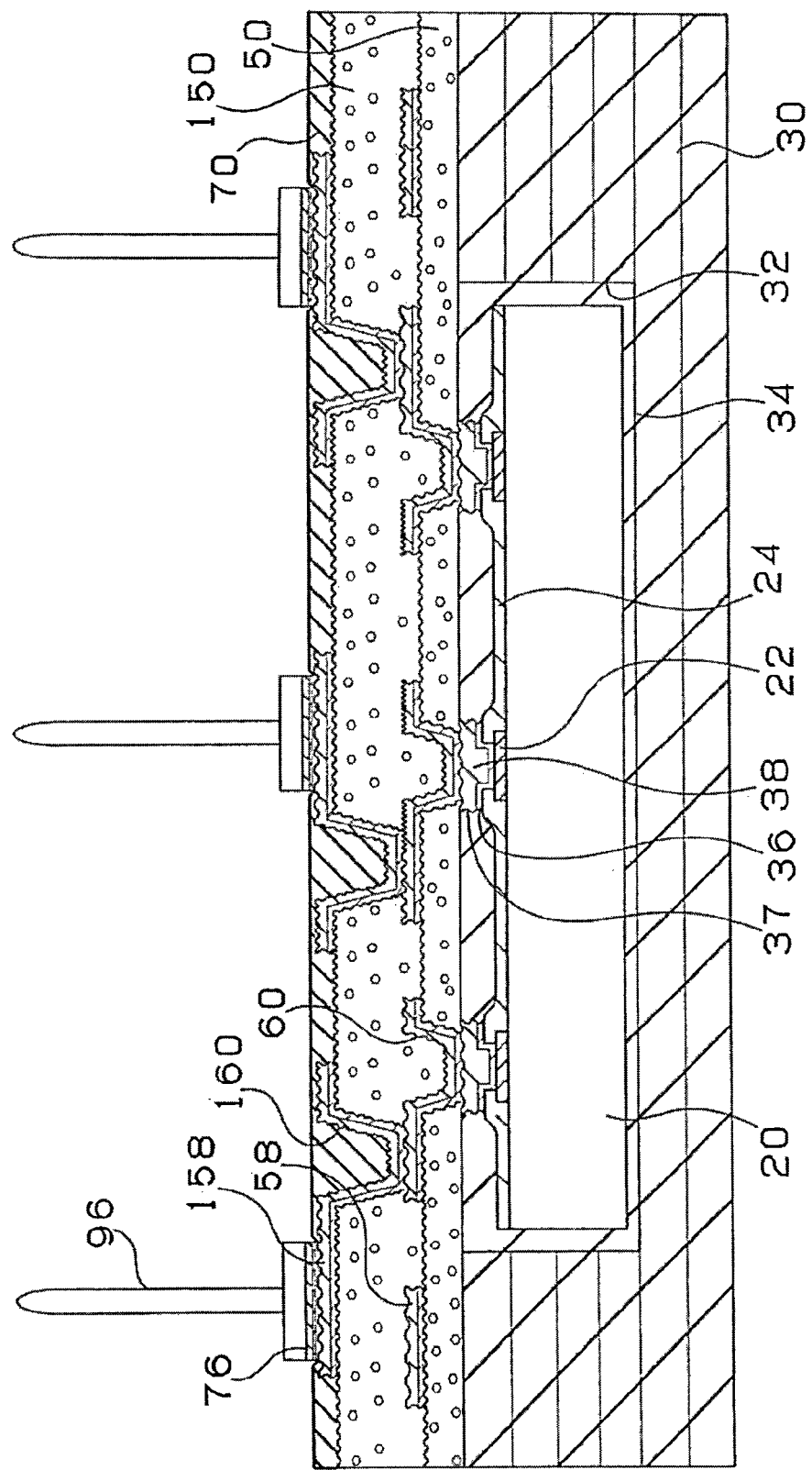

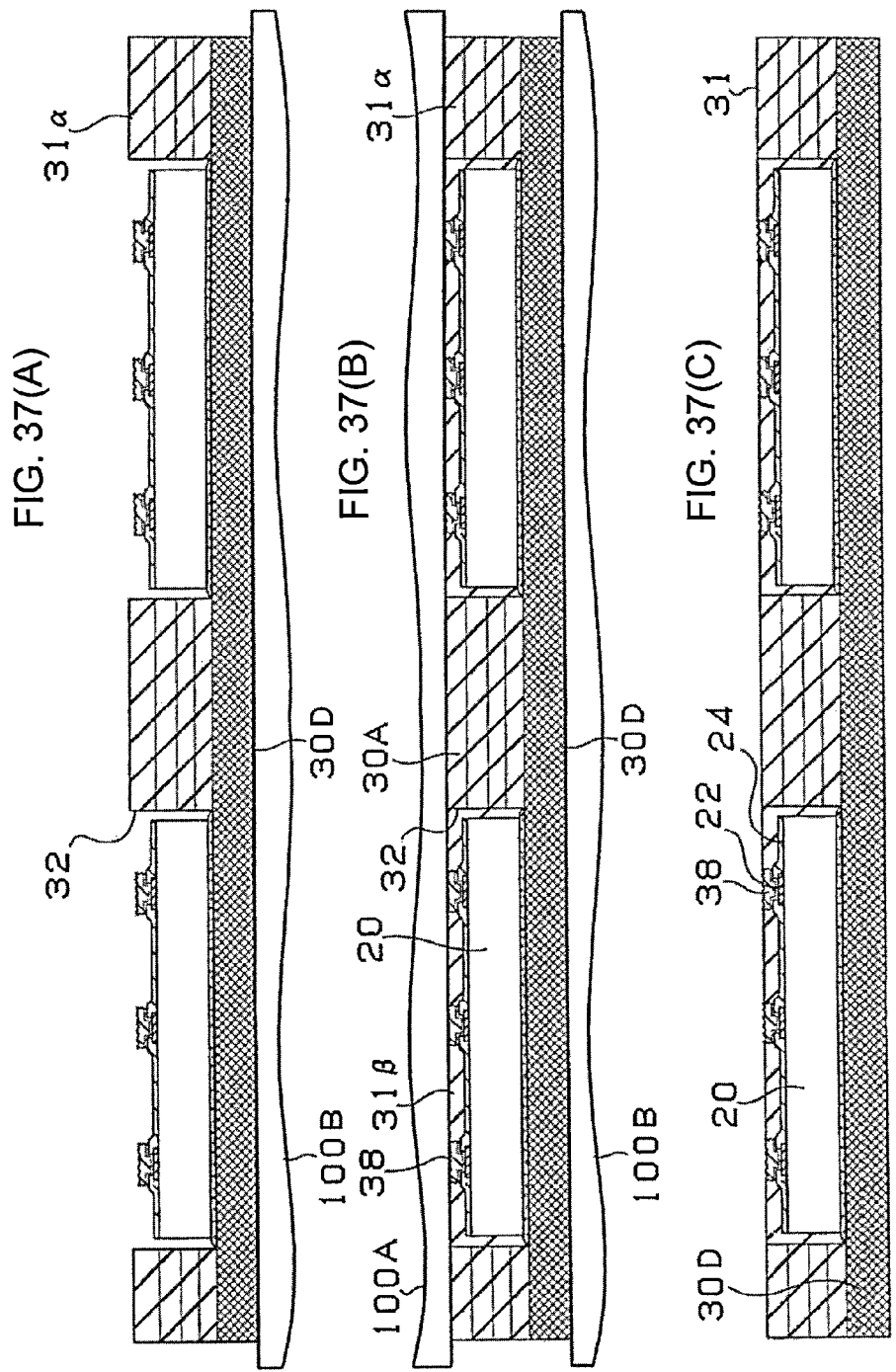

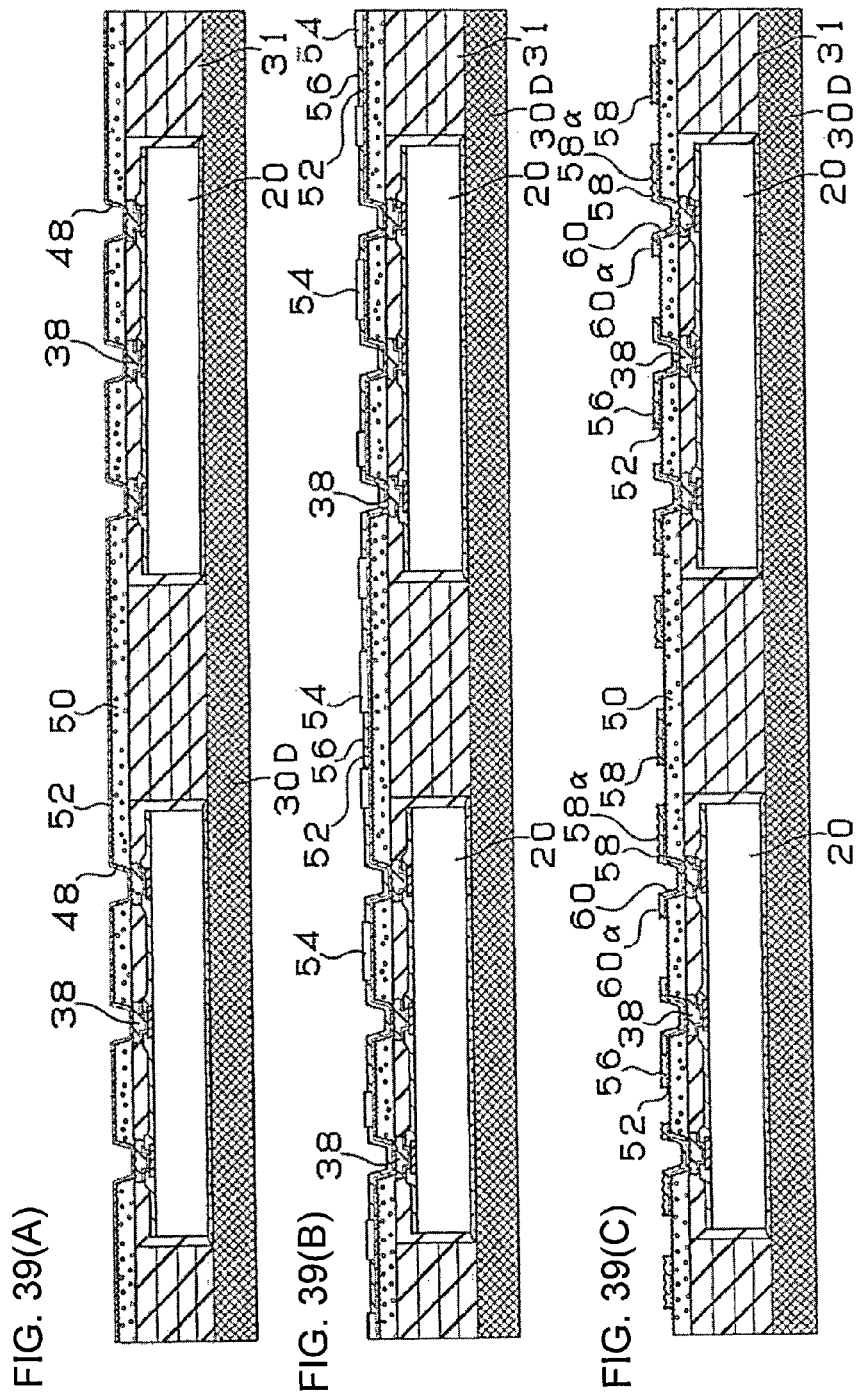

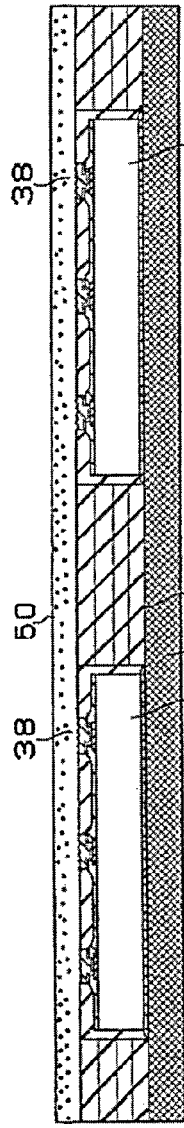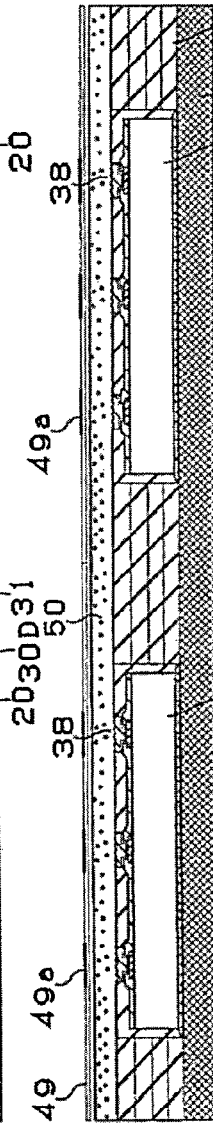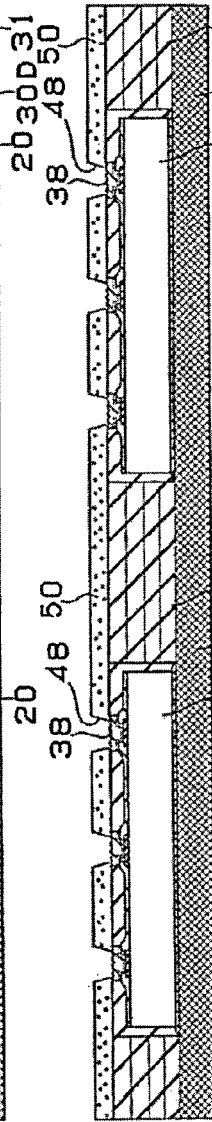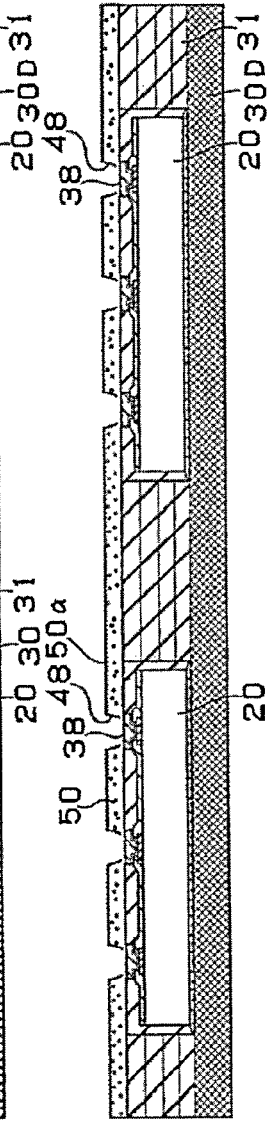

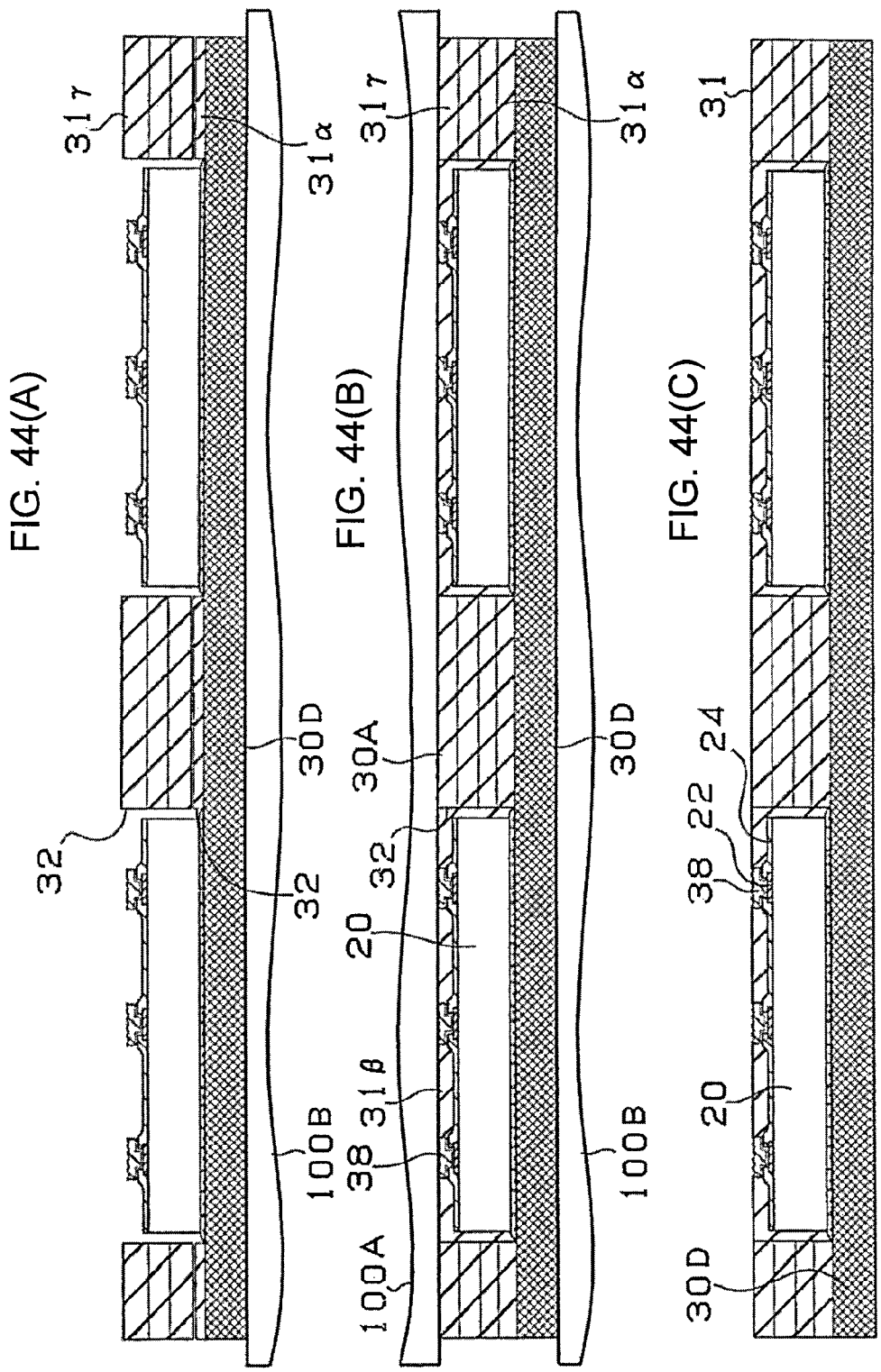

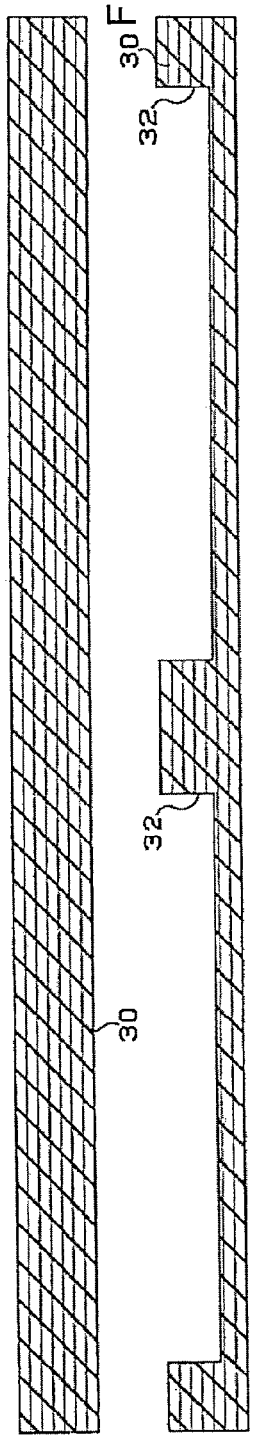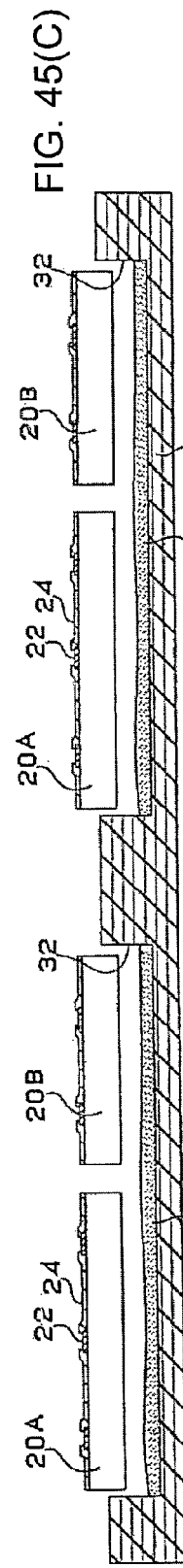

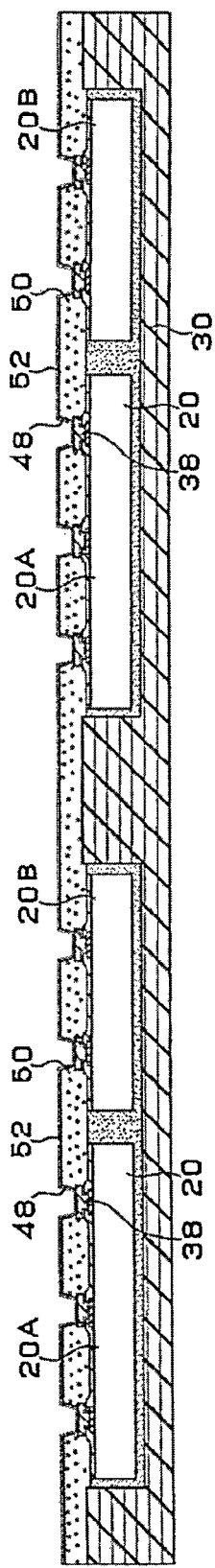
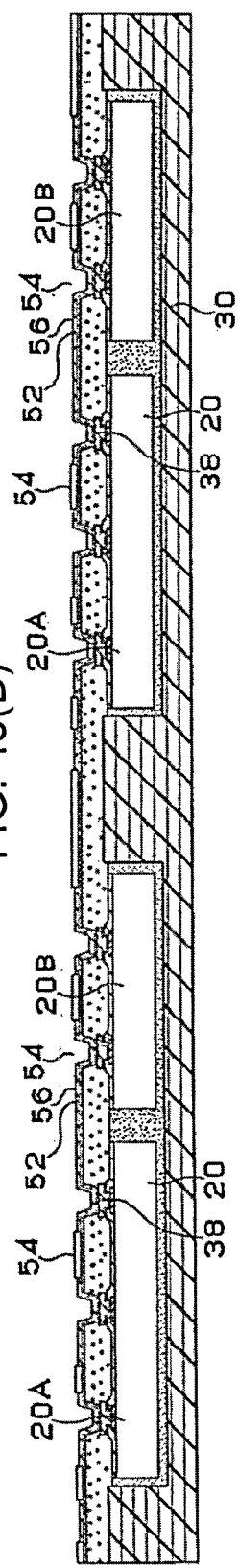
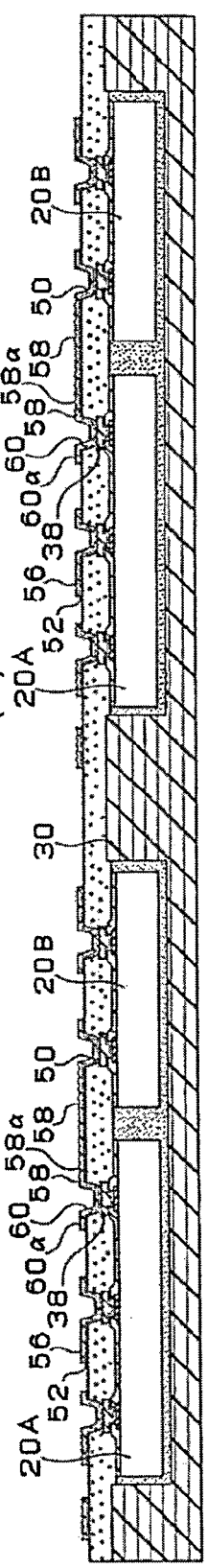
FIG. 48(A)
FIG. 48(B)
FIG. 48(C)

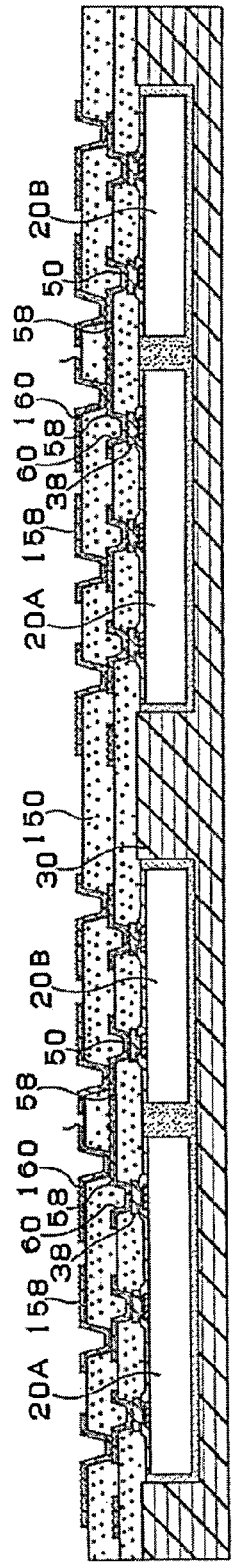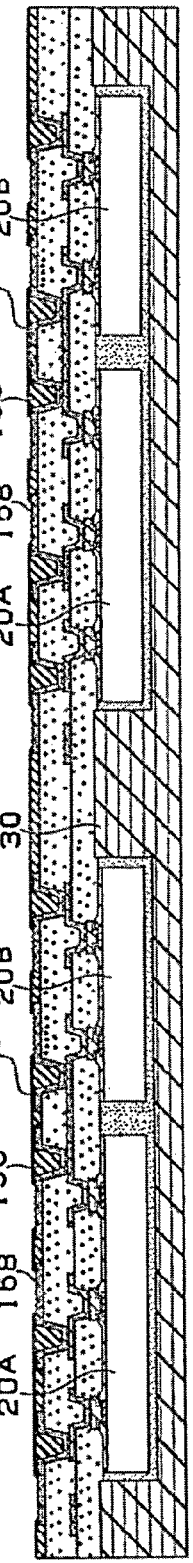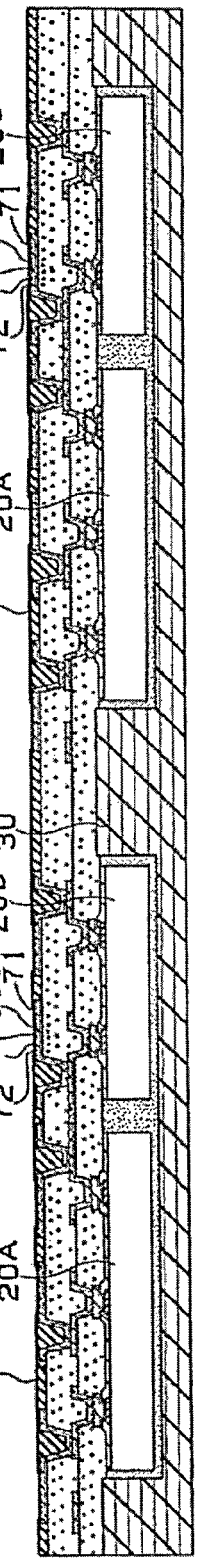

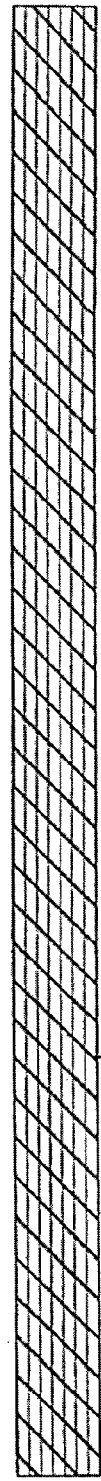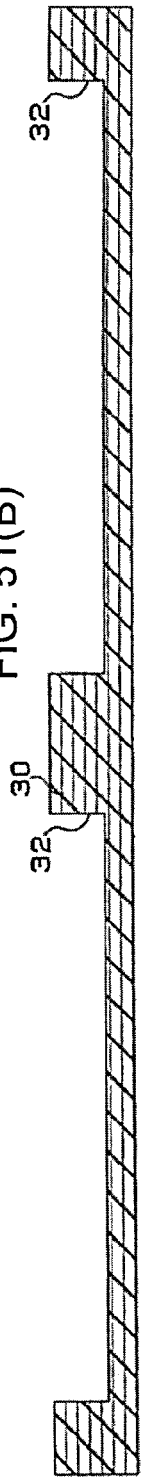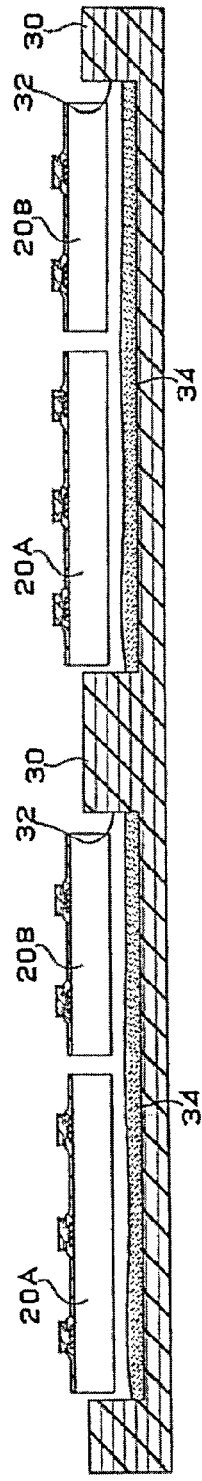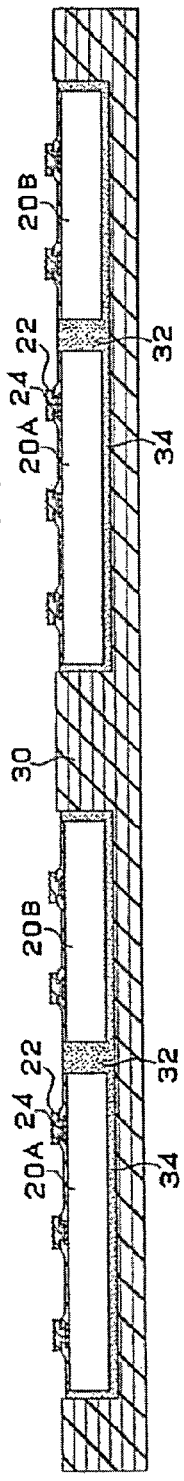
FIG. 51(A)
FIG. 51(B)
FIG. 51(C)
FIG. 51(D)

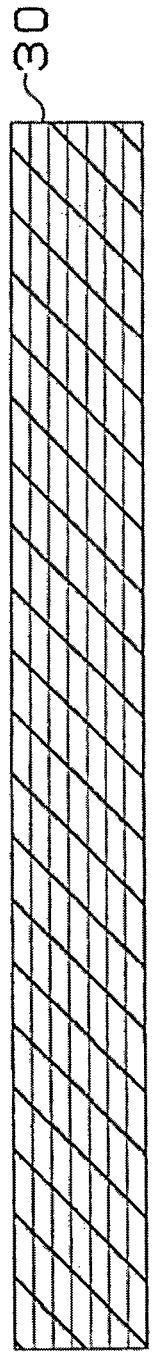
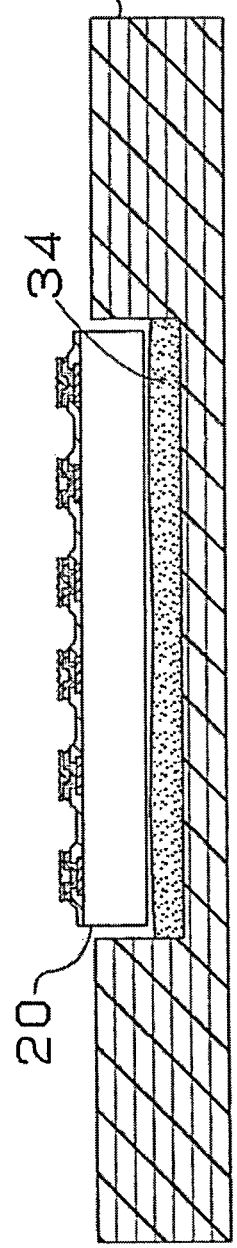
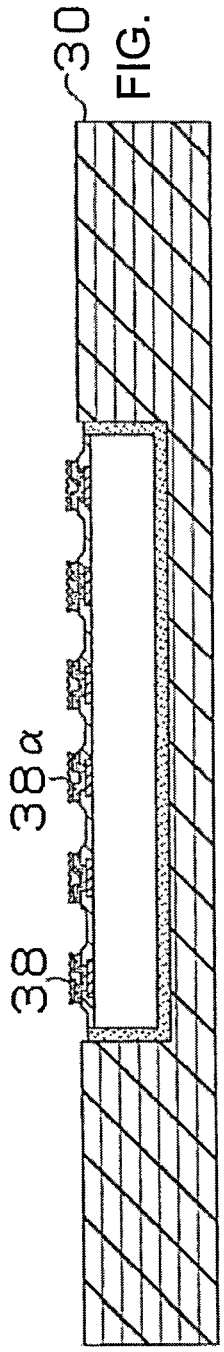

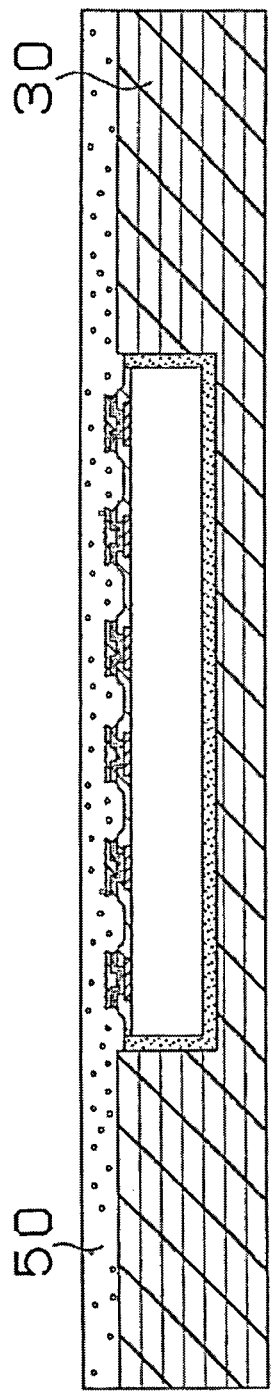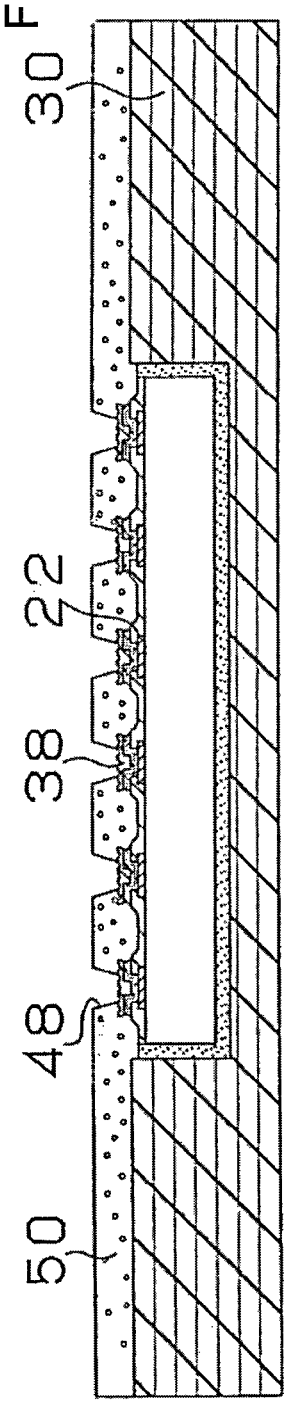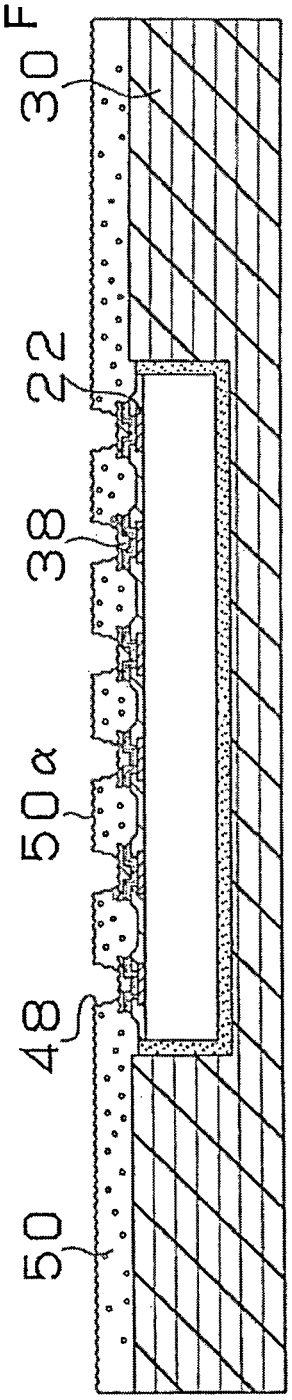

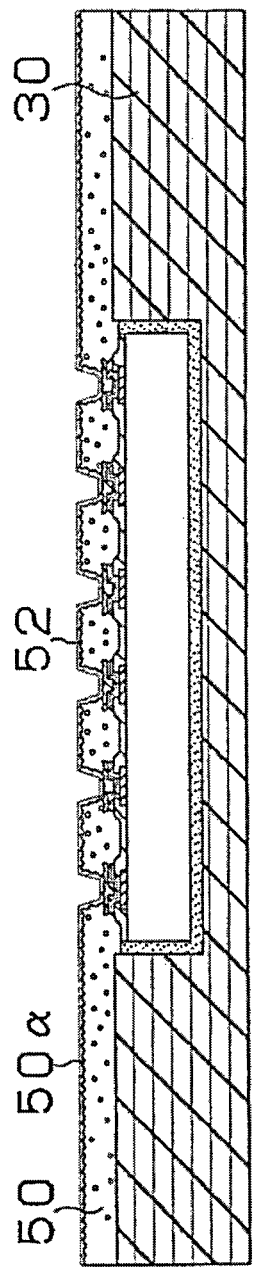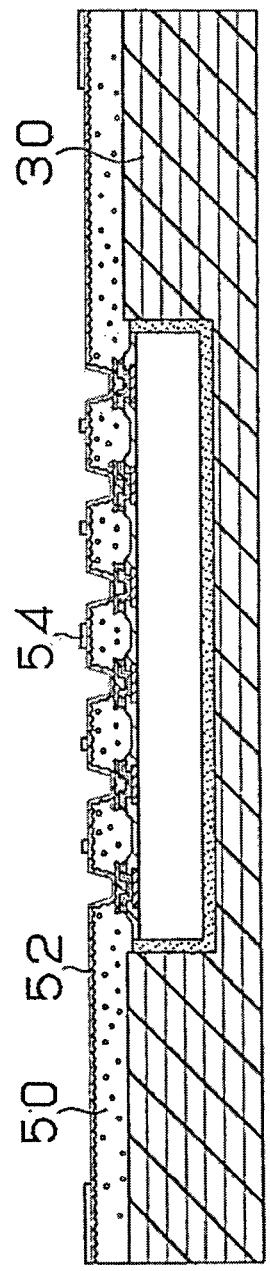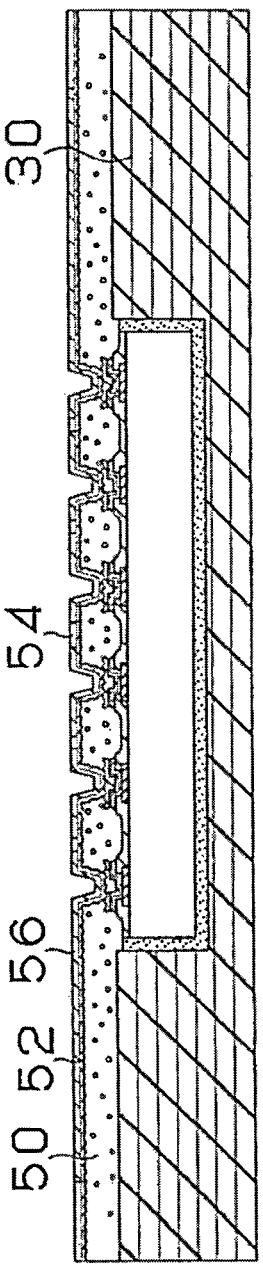

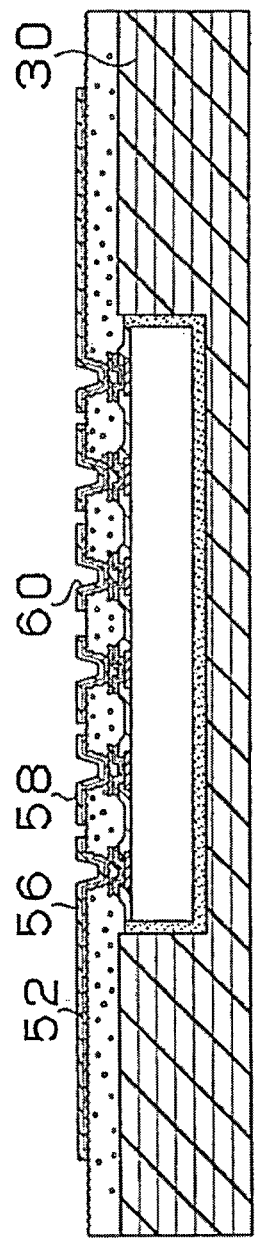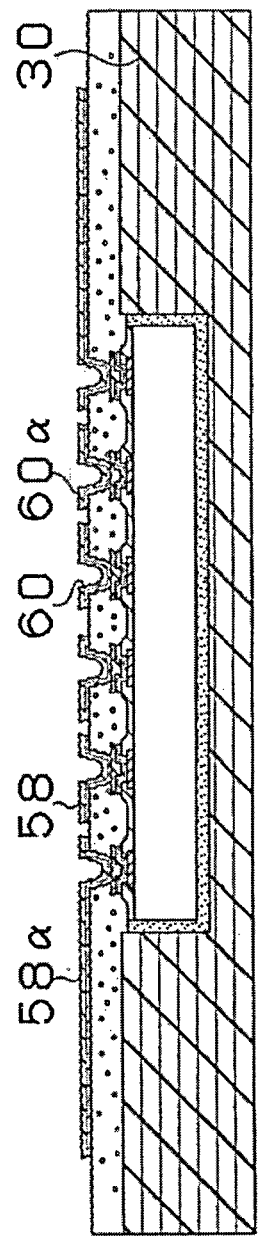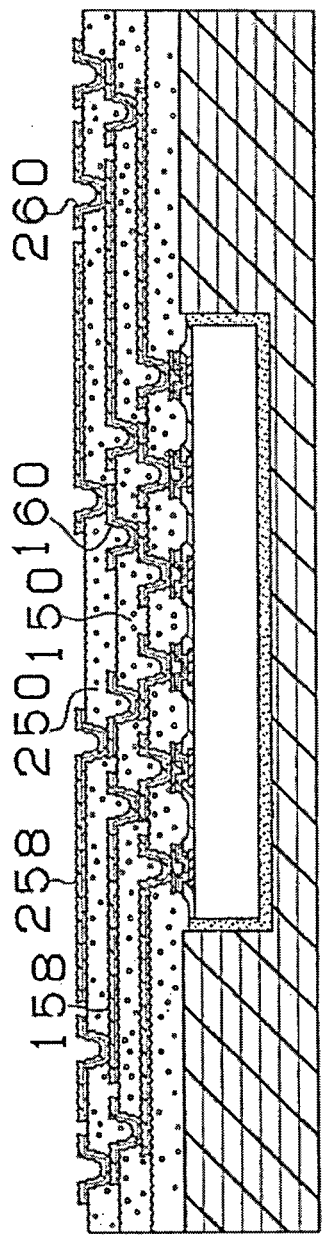

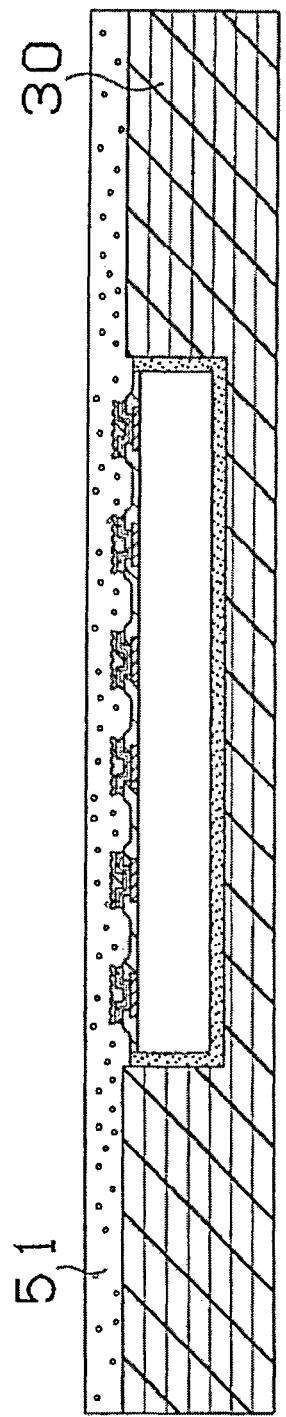
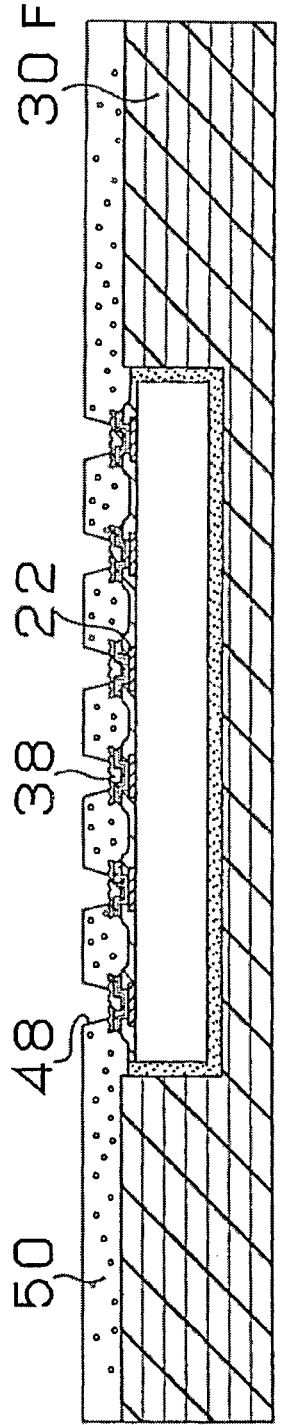
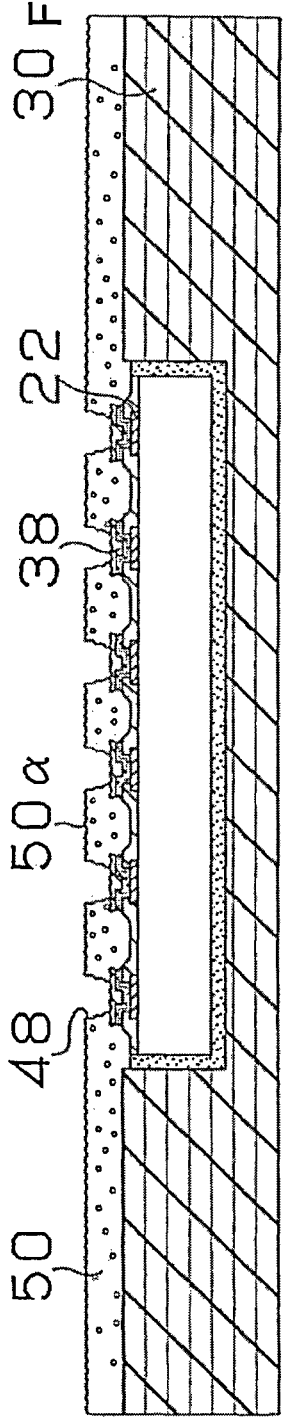

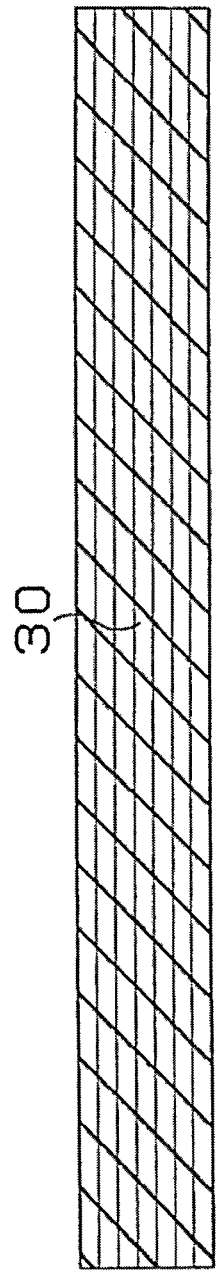
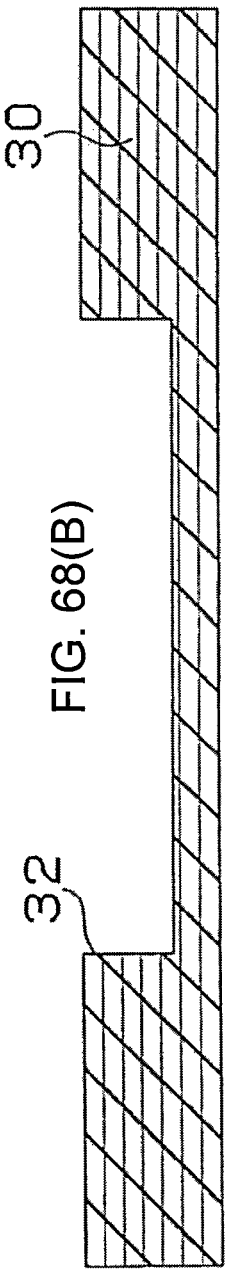
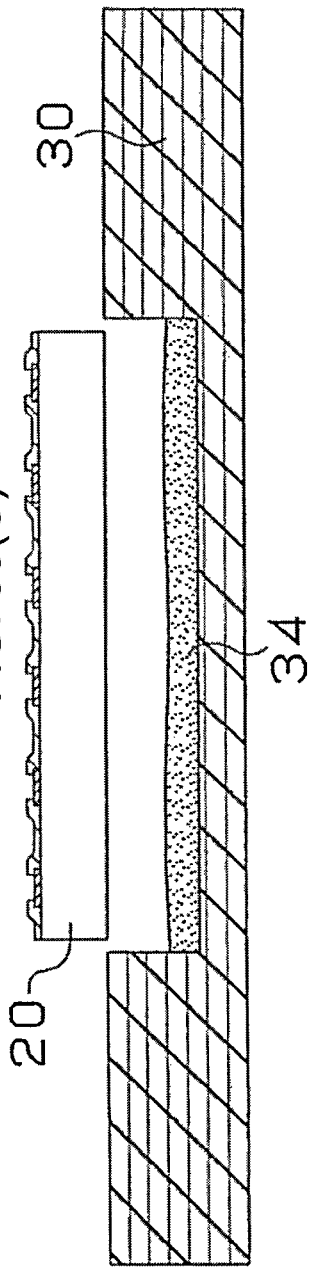
FIG. 68(A)
FIG. 68(B)
FIG. 68(C)

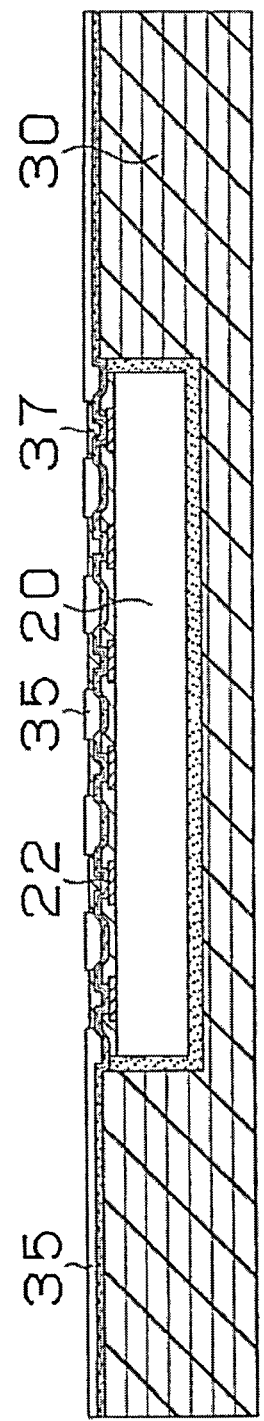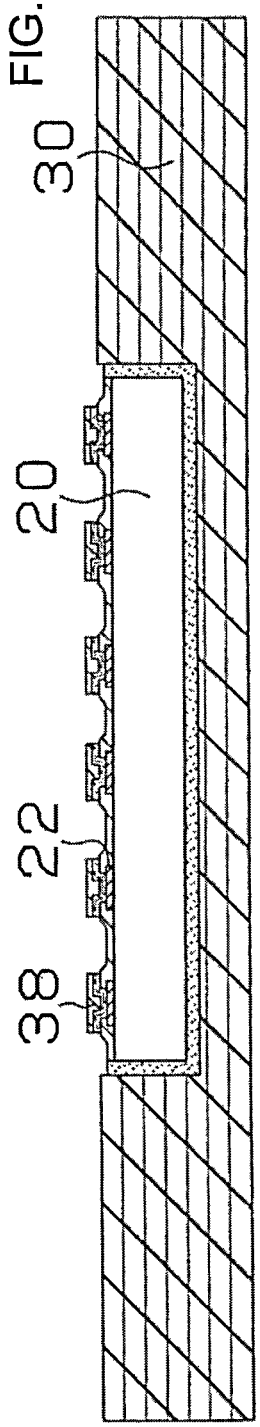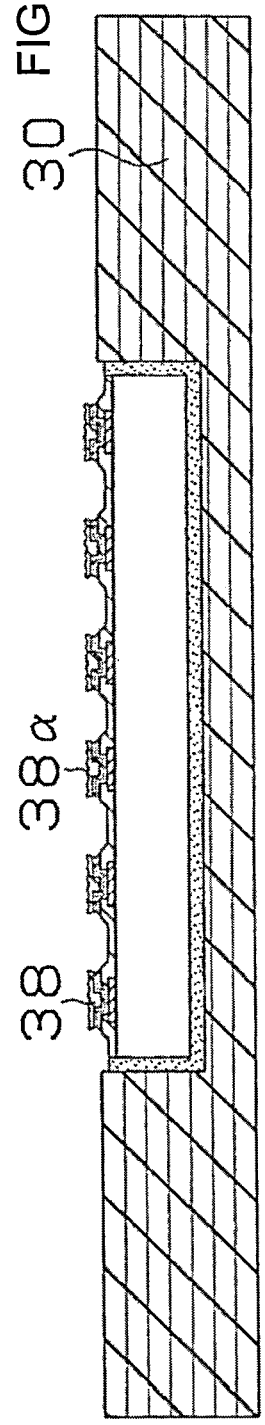

SEMICONDUCTOR ELEMENT

CROSS REFERENCE OF RELATED APPLICATION

This application is a continuation of and claims the benefit of priority under 35 U.S.C. §120 to U.S. Ser. No. 12/274,162, filed Nov. 19, 2008, which is a continuation of U.S. Ser. No. 12/107,377, filed Apr. 22, 2008, now U.S. Pat. No. 8,524,535, which is a divisional of U.S. Ser. No. 10/380,631, filed Mar. 21, 2003, now U.S. Pat. No. 7,855,342, which is a National Stage of International Application No. PCT/JP2001/03589, filed Apr. 25, 2001. The entire contents of these applications are hereby incorporated by reference. This application further is based upon and claims the benefit of priority from the prior Japanese Patent Applications No. 2000-290231, filed Sep. 25, 2000; No. 2000-290232, filed Sep. 25, 2000; No. 2000-382806, filed Dec. 15, 2000; No. 2000-382807, filed Dec. 15, 2000; No. 2000-382813, filed Dec. 15, 2000; and No. 2000-382814, filed Dec. 15, 2000.

TECHNICAL FIELD OF THE INVENTION

The present invention relates to a semiconductor device such as an IC chip, a semiconductor device manufacturing method, a multilayer printed circuit board into which a semiconductor device is integrated and a multilayer printed circuit board manufacturing method.

BACKGROUND OF THE INVENTION

An IC chip is electrically connected to a printed circuit board by a mounting method such as wire bonding, TAB or flip chip bonding.

In the wire bonding method, an IC chip is die-bonded to a printed circuit board by adhesive, the pads of the printed circuit board are connected to the pads of an IC chip by wires such as metallic wires and then a sealing resin such as a thermosetting resin or a thermoplastic resin is applied to protect the IC chip and the wires.

In the TAB method, the wires referred to as leads are connected in the block by a solder or the like and then the bumps of an IC chip and the pads of a printed circuit board are sealed by a resin.

In the flip chip bonding method, the pads of an IC chip are connected to the pads of a printed circuit board through bumps and the gaps between the pads and the bumps are filled with a resin.

In each of these mounting methods, however, the IC chip is electrically connected to the printed circuit board through connection lead members (wires, leads or bumps). The lead members tend to be cut off and eroded, thereby breaking the connection of the printed circuit board with the IC chip and causing malfunctions.

Further, in each mounting method, a thermoplastic resin such as an epoxy resin is applied to seal the IC chip so as to protect the IC chip. If bubbles are contained at the time of filling the resin, the breakage of lead members, the corrosion of the IC pads and the deterioration of reliability are derived from the bubbles. To seal members by a thermoplastic resin, it is necessary to create resin filling plungers and metallic molds in accordance with the respective members. In addition, if a thermosetting resin is employed, it is necessary to select an appropriate resin for the materials of lead members, solder resist and the like, thereby disadvantageously causing cost increase On the other hand, there has been conventionally proposed a technique for electrically connecting an IC chip to a printed circuit board by embedding a semiconductor device into a substrate and forming buildup layers on the substrate instead of attaching the IC chip to the exterior of the printed circuit board (or package substrate) as stated above in Japanese Patent Laid-Open Nos. 9-321408 (or U.S. Pat. No. 5,875,100), 10-256429, 11-126978 and the like.

According to Japanese Patent Laid-Open No. 9-321408 (or U.S. Pat. No. 5,875,100), a semiconductor device having stud bumps formed on die pads is embedded into a printed circuit board and wirings are formed on the stud bumps to thereby electrically connect the printed circuit board to the semiconductor device. However, since the stud bumps are onion-shaped and irregular in height, smoothness is deteriorated if an interlayer insulating layer is formed and electrical connection cannot be established even if via holes are formed. Further, since the stud bumps are provided by bonding one by one, they cannot be provided collectively and productivity is thereby disadvantageously lowered.

Japanese Patent Laid-Open No. 10-256429 shows a structure in which a semiconductor device is contained in a ceramic substrate and the substrate is electrically connected to the semiconductor device by flip chip bonding. However, ceramic is inferior in outline workability and the semiconductor device cannot be appropriately contained in the ceramic substrate. Besides, the bumps are irregular in height. Due to this, the smoothness of an interlayer insulating layer is deteriorated and connection characteristic is deteriorated accordingly.

Japanese Patent Laid-Open No. 11-126978 shows a multilayer printed circuit board wherein an electrical component such as a semiconductor device is embedded into a gap or containing portion, connected to a conductor circuit and built up through via holes. However, since the containing portion is a gap, a positional error tends to occur and the substrate cannot be often connected to the pads of the semiconductor device. Besides, since die pads are directly connected to the conductor circuit, oxide coats tend to be formed on the respective die pads, thereby disadvantageously increasing insulating resistance.

The present invention has been made to improve the above-stated problems. It is an object of the present invention to provide a semiconductor device manufacturing method which allows a semiconductor device to be directly electrical connected to a printed circuit board without using lead members.

Meanwhile, if a semiconductor device is embedded into a printed circuit board made of resin, then the printed circuit board is warped by heat generated in the semiconductor device, internal wirings are cut off and reliability is thereby disadvantageously deteriorated.

The present invention has been made to improve the above-stated problem. It is, therefore, a still further object of the present invention to provide a multilayer printed circuit board into which a semiconductor device is integrated and the method of manufacturing the multilayer printed circuit board.

Furthermore, conventionally, a highly reliable printed circuit board into which a semiconductor device is integrated cannot be efficiently manufactured.

The present invention has been made to improve the above problem. It is, therefore, a still further object of the present invention to provide a manufacturing method capable of efficiently manufacturing a highly reliable multilayer printed circuit board into which a semiconductor device is integrated.

Moreover, if a multilayer printed circuit board comprising a substrate into which a semiconductor device is embedded and contained, is employed as a package substrate, a chip set or the like, the multilayer printed circuit board can fulfill its behaviors by being electrically connected to an external substrate (which is a so-called mother board or a daughter board). Due to this, it is necessary to provide BGA's and conductive connection pins (PGA's) on the multilayer printed circuit board. The BGA's and PGA's are formed by providing solder pads on a solder resist layer on the surface layer of the multilayer printed circuit board.

However, if a behavioral test or a reliability test is conducted while providing solder bumps on the surface layer of a substrate into which a semiconductor device is embedded and electrically connecting the substrate to an external substrate, it is discovered that an interlayer insulating layer, a solder resist layer, an interlayer resin insulating layer, a solder resist, solder bumps and the surroundings of the solder bumps (which means solder layers and corrosion resisting metal) are cracked and peeled, that the solder bumps are detached and that the positions of the solder bumps are slipped. Particularly, cracks occur to the pads of the semiconductor device and the cracks penetrate the interlayer insulating layer. Accordingly, it becomes clear that in the multilayer printed circuit board into which the semiconductor device is integrated, the electrical connection characteristics between solder bumps and conductor circuits is disadvantageously deteriorated and that the reliability of the multilayer printed circuit board is deteriorated accordingly.

The present invention has been made to improve the above-stated problems. It is, therefore, a still further object of the present invention to provide a multilayer printed circuit board or particularly a multilayer printed circuit board into which a semiconductor device is integrated having high electrical connection characteristics and high reliability.

DISCLOSURE OF THE INVENTION

As a result of dedicated studies, the inventor of the present invention devised to form a transition layer on the die pad of a semiconductor device. Even if the semiconductor device having the transition layer is embedded, stored and contained in a printed circuit board and an interlayer insulating layer is provided on the semiconductor device and via holes are formed in the interlayer insulating layer, it is possible to obtain desired size and shape.

The reason for providing the transition layer on the die pad of an IC chip will be described. The die pad of an IC chip is normally made of aluminum or the like. If the via holes of an interlayer insulating layer are formed by photo-etching while no transition layer is formed on the die pad, a resin tends to remain on the surface layer of the pad after exposure and development. Besides, the pad is discolored due to the adhesion of a development solution. On the other hand, if via holes are formed by laser, there is a possibility of burning the aluminum pad. Also, if via holes are formed under the conditions that the pad is not burned, a resin residue on the pad occurs. In addition, if the IC chip is immersed in an acid, an oxidizer or an etching solution in later steps or subjected to various annealing steps, the pad of the IC chip is discolored and dissolved. Moreover, the pad of the IC chip is formed to have a diameter of about 40 µm and a via hole is larger in diameter than the pad to thereby require a location tolerance. As a result, a positional error and a connection defect tend to occur.

By providing a transition layer made of copper or the like on a die pad, by contrast, a via hole formation defect can be improved to make it possible to use a solvent and a resin residue on the pad can be prevented. Also, even if the IC chip is immersed in an oxide, an oxidizer or an etching solution in later steps or subjected to various annealing steps, the pad is not discolored or dissolved. This allows improving the connection characteristics between the pad and the via hole and reliability. Moreover, by interposing the transition layer having a larger diameter than that of the die pad of the IC chip, it is possible to ensure connecting the via hole to the pad. It is preferable that the transition layer is equal to or larger than a via hole diameter or a location tolerance.

Furthermore, since the transition layer is formed, the operation test and electrical test of the semiconductor device can be easily conducted before or after embedding, containing and storing the IC chip which is a semiconductor device in a printed circuit board. This is because the transition layer larger than the pad is formed and a test probe pin can be contacted with the IC chip more easily. As a result, it is possible to determine whether a product is good or defective in advance and to improve productivity and cost effectiveness. Besides, the pad is not lost or damaged by the probe.

Thus, by forming the transition, the IC chip which is a semiconductor device can be appropriately embedded, contained and stored in the printed circuit board. Namely, the semiconductor device having the transition layer may be also referred to as a semiconductor device for embedding, containing and storing the printed circuit board.

The transition layer is constituted by forming a thin film layer on the die pad and a thickening layer on the thin film layer. The transition layer can be formed to comprise at least two layers.

The multilayer printed circuit board functions per se. In some cases, BGA's, solder bumps or PGA's (conductive connection pins) may be provided to connect the multilayer printed circuit board to a mother board or a daughter board serving as an external substrate so that the multilayer printed circuit board functions as a package substrate for a semiconductor device. In addition, with this constitution, wiring lengths can be shortened and loop inductance can be reduced compared with a case of connecting the multilayer printed circuit board to the external substrate by a conventional mounting method.

Now, a transition layer defined in the present invention will be described.

Since the transition layer directly connect an IC chip, which is a semiconductor device, to a printed circuit board without using a conventional IC chip mounting technique, the transition layer signifies an intermediate layer. The transition layer is characterized by being formed out of two or more metallic layers or by being formed to be larger than the die pad of the IC chip which is the semiconductor device. This allows electrical connection characteristics and alignment efficiency to be improved and processing a via hole by laser or photo-etching without damaging the die pad. Due to this, it is possible to ensure embedding, containing, storing and connecting the IC chip in and to the printed circuit board. Besides, it is possible to directly form a metal serving as the conductor layer of the printed circuit board on the transition layer. The conductor layer is exemplified by the via hole of an interlayer resin insulating layer or a through hole on a substrate.

As a resin substrate into which an electronic component such as an IC chip used in the present invention is integrated, a substrate containing an epoxy resin, a BT resin, a phenol resin or the like impregnated with a reinforcement or a core material such as a glass epoxy resin, or a substrate in which prepregs impregnated with an epoxy resin are built up is used. Normally, a substrate used for a printed circuit board is available. Alternatively, a two-sided copper-clad laminated board, a one-side board, a resin board without a metallic film or a resin film can be used. However, if applied with heat at a temperature of 350.degree. C. or higher, the resin is dissolved and carbonated.

Physical deposition such as deposition or sputtering is conducted to the entire surface of the IC chip to thereby form a conductive metallic film on the entire surface. The metallic film is preferably formed of one or more layers of metal such as tin, chromium, titanium, nickel, zinc, cobalt, gold or copper. The thickness thereof is preferably in the range of 0.001 to 2.0 µm, more preferably in the range of 0.01 to 1.0 µm.

It is also possible to further provide a metallic film on the metallic film by electroless plating or the like. The upper metallic film is preferably formed out of one or more layers of metal such as nickel, copper, gold or silver. The thickness thereof is preferably 0.01 to 5.0 µm, more preferably 0.1 to 3.0 µm The metallic film is plated by electroless plating or electroplating. The types of plating materials include nickel, copper, gold, silver, zinc, iron and the like. In view of electrical characteristics, inexpensiveness and the fact that buildup conductor layers formed in later steps mainly comprise, copper is preferably used. The thickness of the plated film is preferably in the range of 1 to 20 µm. If the thickness exceeds that range, undercut sometimes occurs during etching to thereby generate gaps among the transition layers and via holes to be formed, and interfaces. Thereafter, an etching resist is formed, exposure and development are conducted and the metal other than the transition layers are exposed and etching is conducted, thereby forming a transition layer on each pad of the IC chip.

Further, instead of the above-stated transition layer manufacturing method, it is also possible that a dry film resist is formed on a metallic film formed on the IC chip and the core substrate, a portion corresponding to the transition layer is removed, a thickening layer is provided by electroplating, the resist is peeled and that a transition layer is formed on each pad of the IC chip by an etching solution.

As a result of devoted studies, the inventor of the present invention discovered that by attaching a heat sink to the rear surface of a semiconductor device embedded in a printed circuit board, heat generated in the semiconductor device is discharged, warping and breaking do not occur to the printed circuit board and reliability can be obtained. Here, by forming a buildup wiring out of a resin on the semiconductor device, it is possible to appropriately connect the semiconductor device to the printed circuit board.

It is preferable that the heat sink is connected to the semiconductor device through a conductive adhesive. This is because the conductive adhesive is high in heat conductivity and is capable of efficiently discharging heat generated in the semiconductor device toward the heat sink.

In addition, according to the present invention, prepregs having a through hole containing therein the IC chip are built up and pressurized vertically. An epoxy resin is exuded from the prepregs and covers the upper surface of the IC chip. By doing so, the upper surface of the IC chip and that of the core substrate formed by curing the prepregs are completely flattened. Due to this, at the time of forming buildup layers, via holes and wirings can be appropriately formed and the wiring reliability of the multilayer printed circuit board can be, therefore, improved.

According to the present invention, a multilayer printed circuit board provided with semiconductor devices is manufactured for multiple multilayer printed circuit boards. The multilayer printed circuit board is cut into pieces to thereby obtain individual multilayer printed circuit boards. Due to this, highly reliable multilayer printed circuit board can be efficiently manufactured.

In addition, according to the present invention, prepregs having a through hole containing therein the IC chip are built up and pressurized vertically. An epoxy resin is exuded from the prepregs and covers the upper surface of the IC chip. By doing so, the upper surface of the IC chip and that of the core substrate formed by curing a resin such as prepregs are completely flattened. Due to this, at the time of forming buildup layers, via holes and wirings can be appropriately formed and the wiring reliability of the multilayer printed circuit board can be, therefore, improved.

Furthermore, according to a preferred mode of the present invention, a heat sink is attached to the rear surface of a semiconductor device embedded into a printed circuit board. By doing so, it is possible to discharge heat generated into the semiconductor device, to prevent the occurrence of warping and breaking of the printed circuit board and to improve reliability.

A method of manufacturing a multilayer printed circuit board according to one aspect of the present invention is characterized by comprising at least the following steps (a) to (f):

(a) attaching a sheet to a bottom of a through hole formed in a core substrate;
(b) mounting a semiconductor device on said sheet at the bottom of said through hole so that a terminal contacts with said sheet;
(c) filling a resin into said through hole;
(d) pressurizing and curing said resin;
(e) peeling of said sheet; and
(f) forming a buildup layer on an upper surface of said semiconductor device.

The semiconductor device is mounted on the sheet at the bottom of the through hole of the core substrate so that the terminal contacts with the sheet, the resin is filled into the through hole and then the sheet is peeled, thereby forming a buildup layer. That is to say, after mounting the semiconductor device on the sheet so that the terminal thereof contacts with the sheet and peeling the sheet, the buildup layer is formed on the semiconductor device. Due to this, it is possible to appropriately, electrically connect the terminal to the wiring of the buildup layer and to, therefore, manufacture a highly reliable multilayer printed circuit board into which the semiconductor device is integrated.

A method of manufacturing a multilayer printed circuit board according to another aspect of the present invention is characterized by comprising at least the following steps (a) to (i):

(a) attaching a sheet to a bottom of a through hole formed in a core substrate;
(b) mounting said sheet on the bottom of said through hole so that a terminal contacts with said sheet;
(c) filling a resin into said through hole;
(d) pressurizing and temporarily curing said resin;
(e) peeling of said sheet;
(f) polishing a bottom side of said core substrate, and exposing the bottom of said semiconductor device;
(g) actually curing said resin;
(h) attaching a radiating plate to the bottom of said semiconductor device; and
(i) forming a buildup layer on an upper surface of said semiconductor device.

The semiconductor device is mounted on the sheet at the bottom of the through hole of the core substrate so that the terminal of the device contacts with the sheet, the resin is filled into the through hole and then the sheet is peeled, thereby forming a buildup layer. That is to say, after mounting the semiconductor device on the sheet so that the terminal thereof contacts with the sheet and peeling the sheet, the buildup layer is formed on the semiconductor device. Due to this, it is possible to appropriately, electrically connect the terminal to the wiring of the buildup layer and to, therefore, manufacture a highly reliable multilayer printed circuit into which the semiconductor device is integrated.

Furthermore, since the bottom side of the core substrate is polished to exposure the bottom of the semiconductor device, it is possible to attach a radiating plate to the bottom of the semiconductor device and to, therefore, improve the stability of the operation of the semiconductor device.

As a sheet closing the through hole of the core substrate, a UV tape the viscosity of which is lowered if being applied with UV is preferable. Since the UV tape is peeled without leaving the adhesive on the terminal of the semiconductor device by applying UV, it is possible to appropriately, electrically connect the terminal to the wiring of the buildup layer and to, therefore, manufacture a highly reliable multilayer printed circuit board into which the semiconductor device is integrated.

It is also preferable to pressurize the resin under reduced pressure. By reducing the pressure, no bubbles remain between the core substrate and the resin and in the resin, thereby making it possible to improve the reliability of the multilayer printed circuit board.

It is further preferable to provide a taper on the through hole formed in the core substrate. By providing the taper, no bubbles or grooves remain between the through hole of the core substrate and the resin and the reliability of the multilayer printed circuit board can be improved. Besides, the smoothness of the core substrate can be ensured.

In yet another aspect of the invention, a multilayer printed circuit board having interlayer insulating layers and conductor layers repeatedly formed on a substrate in which a semiconductor device is embedded, contained or stored, via holes formed in said interlayer insulating layers, and establishing electrical connection through said via holes, is characterized in that:

an external connection terminal (BGA/PGA) is formed only in a region in said substrate other than a region right above the semiconductor device.

The region on the substrate of the multilayer printed circuit board into which region the semiconductor device is integrated and the region on the substrate into which the semiconductor device is not integrated are differentiated from each other. Then, the external connection terminal (BGA/PGA) is provided in the region of the substrate into which region the semiconductor device is not integrated.

Peeling or cracking which occurs to the surrounding of the above-stated external connection terminal (BGA/PGA) is resulted from the difference in thermal expansion among the semiconductor device, the external substrate, the interlayer insulating layer and the solder resist layer. That is to say, the semiconductor device and the external substrate made of ceramic are high in the coefficient of thermal expansion and expanded less by thermal expansion. The interlayer insulating layer and the solder resist layer made of the resin, by contrast, are higher in the coefficient of thermal expansion than the semiconductor device and the external substrate and, therefore, expanded more by the thermal expansion. Because of this difference in the coefficient of thermal expansion, a stress is concentrated on the surrounding of the external connection terminal (GBA/PGA) or the like and peeling and cracking occur.

In other words, by providing the external connection terminal (BGA/PGA) in the region on the substrate into which region the semiconductor device is not integrated, the influence of thermal expansion can be reduced. Therefore, it is possible to prevent peeling and cracking from occurring to the surrounding of the external connection terminal (BGA/PGA) or the like. Accordingly, it is possible to prevent the detachment and positional error of the external connection terminal (BGA/PGA) and to improve electrical connection characteristics and reliability.

Here, the external connection terminal signifies a terminal for connecting a substrate, on which an IC chip is mounted, to an external substrate or so-called mother board or daughter board. The terminal described herein refers to a BGA, PGA or a solder bump.

In still another aspect of the invention, the multilayer printed circuit board of the foregoing aspect of the invention is technically characterized by forming the transition layer on the pad portion of the semiconductor device so as to be connected to the via hole formed in the lowermost interlayer resin insulating layer.

The transition layer is formed to cover the pad of the semiconductor device. By providing the transition layer made of cupper or the like on the die pad, a solvent can be used and a resin residue on the die pad can be prevented. Further, even if the substrate is immersed in an oxide, an oxidizer or an etching solution in later steps or subjected to various annealing steps, the die pad is not discolored or dissolved. The formation of the oxide film of the die pad is prevented. Thus, it is possible to improve the connection characteristics between the die pad and the via hole and reliability. Also, by interposing the transition layer having a diameter larger than 20 μm on the die pad of the IC chip, it is possible to ensure connecting the via hole to the transition layer. Preferably, the transition layer has a diameter equal to or larger than the diameter of the via hole.

In still another aspect of the invention, a multilayer printed circuit board of the foregoing aspect of the invention is characterized in that:

a resin filling material is filled between a recess or a through hole of said substrate into which the semiconductor device is embedded, stored or contained, and said semiconductor device.

By filling the resin filling material between the recess or the through hole of the substrate and the semiconductor device, the adhesion between the substrate and the semiconductor device can be improved. In addition, to relax a stress generated by thermal expansion, this resin filling material can prevent the cracking of the core substrate and the waviness of the interlayer resin insulating layer and the solder resist layer. Due to this, it is possible to prevent peeling and cracking from occurring to the surrounding of the solder bump or the like. Accordingly, it is possible to prevent the detachment and positional error of the solder bump and to, therefore, improve electrical connection characteristics and reliability. As the resin filling material, a thermosetting resin, a thermoplastic resin or a mixture thereof can be used.

BRIEF DESCRIPTION OF THE DRAWINGS

FIGS. 3(A) and 3(B) are manufacturing step views of the semiconductor device according to the first embodiment of the present invention;

FIGS. 8(A), 8(B), 8(C) and 8(D) are manufacturing step views of a semiconductor device according to the second modification of the first embodiment;

FIGS. 9(A), 9(B), 9(C) and 9(D) are manufacturing step views of the semiconductor device according to the first modification of the first embodiment;

FIG. 16 is a cross-sectional view of the multilayer printed circuit board according to the first modification of the first embodiment;

FIG. 17 is a table showing the results of estimating the semiconductor devices of the first embodiment and the first modifications of the first embodiment;

FIG. 18 is a table showing the results of estimating the semiconductor devices of the second modifications and the third modifications with respect to comparison examples;

FIGS. 20(A), 20(B) and 20(C) are manufacturing step views of the multilayer printed circuit board according to the second embodiment;

FIGS. 21(A), 21(B) and 21(C) are manufacturing step views of the multilayer printed circuit board according to the second embodiment;

FIGS. 22(A), 22(B) and 22(C) are manufacturing step views of the multilayer printed circuit board according to the second embodiment;

FIGS. 23(A), 23(B) and 23(C) are manufacturing step views of the multilayer printed circuit board according to the second embodiment;

FIGS. 25(A), 25(B), 25(C) and 25(D) are manufacturing step views of a multilayer printed circuit board according to the first modification of the second embodiment;

FIG. 26 is a cross-sectional view of the multilayer printed circuit board according to the first modification of the second embodiment;

FIGS. 27(A), 27(B) and 27(C) are manufacturing step views of a multilayer printed circuit board according to the second modification of the second embodiment;

FIGS. 28(A), 28(B) and 28(C) are manufacturing step views of a multilayer printed circuit board according to the third embodiment of the present invention;

FIGS. 30(A), 30(B) and 30(C) are manufacturing step views of the multilayer printed circuit board according to the third embodiment;

FIGS. 31(A), 31(B) and 31(C) are manufacturing step views of the multilayer printed circuit board according to the third embodiment;

FIGS. 34(A), 34(B), 34(C) and 34(D) are manufacturing step views of a multilayer printed circuit board according to the first modification of the third embodiment;

FIG. 35 is a cross-sectional view of the multilayer printed circuit board according to the first modification of the third embodiment;

FIGS. 37(A), 37(B) and 38(C) are manufacturing step views of the multilayer printed circuit board according to the first modification of the third embodiment;

FIGS. 38(A), 38(B) and 39(C) are manufacturing step views of the multilayer printed circuit board according to the first modification of the third embodiment;

FIGS. 39(A), 39(B) and 39(C) are manufacturing step views of the multilayer printed circuit board according to the first modification of the third embodiment;

FIGS. 42(A), 42(B), 42(C) and 42(D) are manufacturing step views of a multilayer printed circuit board according to the first other example of the first modification;

FIGS. 44(A), 44(B) and 44(C) are manufacturing step views of a multilayer printed circuit board according to the second other example of the first modification of the third embodiment;

FIGS. 45(A), 45(B), 45(C), 45(D) and 45(E) are manufacturing step views of a multilayer printed circuit board according to the second modification of the third embodiment;

FIGS. 48(A), 48(B) and 48(C) are manufacturing step views of the multilayer printed circuit board according to the second modification of the third embodiment;

FIGS. 49(A), 49(B) and 49(C) are manufacturing step views of the multilayer printed circuit board according to the second modification of the third embodiment;

FIGS. 51(A), 51(B), 51(C) and 51(D) are manufacturing step views of a multilayer printed circuit board according to the first other example of the second modification of the third embodiment;

FIGS. 58(A), 58(B), 58(C) and 58(D) are manufacturing step views of a multilayer printed circuit board according to the fifth embodiment of the present invention;

FIGS. 59(A), 59(B) and 59(C) are manufacturing step views of the multilayer printed circuit board according to the fifth embodiment;

FIGS. 60(A), 60(B) and 60(C) are manufacturing step views of the multilayer printed circuit board according to the fifth embodiment;

FIGS. 61(A), 61(B) and 61(C) are manufacturing step views of the multilayer printed circuit board according to the fifth embodiment;

FIGS. 67(A), 67(B) and 67(C) are manufacturing step views of a multilayer printed circuit board according to another example of the fifth embodiment;

FIGS. 68(A), 68(B) and 68(C) are manufacturing step views of a multilayer printed circuit board according to first modification of the fifth embodiment of the present invention;

FIGS. 70(A), 70(B) and 70(C) are manufacturing step views of the multilayer printed circuit board according to first modification of the fifth embodiment.

BEST MODES FOR WORKING THE INVENTION

Figure 1A:
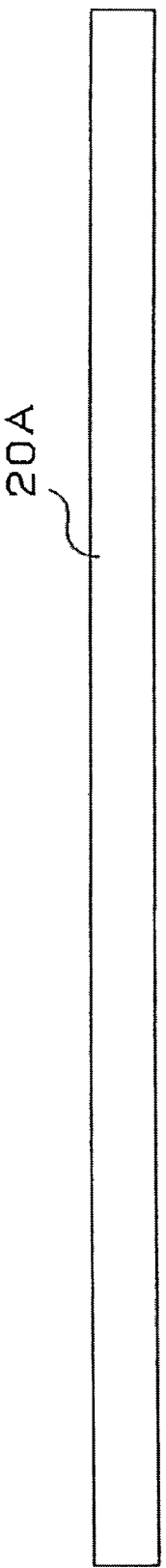
FIGS. 1(A), 1(B) and 1(C) are manufacturing step view of a semiconductor device according to the first embodiment of the present invention.

The embodiments of the present invention will be described hereinafter with reference to the drawings.

A. Semiconductor Device

First, the constitution of a semiconductor device (or an IC chip) according to the first embodiment of the present invention will be described with reference to FIG. 3(A) which is a cross-sectional view of a semiconductor device 20 and to FIG. 4(B) which is a plan view thereof.

[First Embodiment]

As shown in FIG. 3(B), die pads 22 and wirings (not shown) are arranged on the upper surface of the semiconductor device 20, a protective film 24 is applied on the respective die pads 22 and wirings and the openings of the protective film 24 are formed on the respective die pads 22. Transition layers 38 mainly comprising copper are formed on the respective die pads 22. Each transition layer 38 comprises a thin film layer 33 and a thickening layer 37. In other words, the transition layer 38 is formed out of metallic films of two or more layers.

Next, the method of manufacturing the semiconductor device stated above with reference to FIG. 3(B) will be described with reference to FIGS. 1 to 4.

Figure 1B:
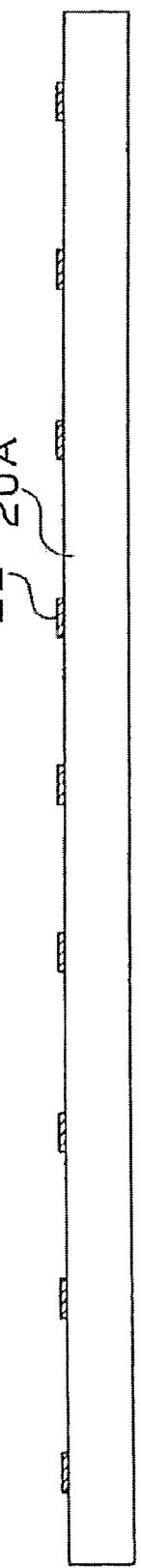
Figure 4A:
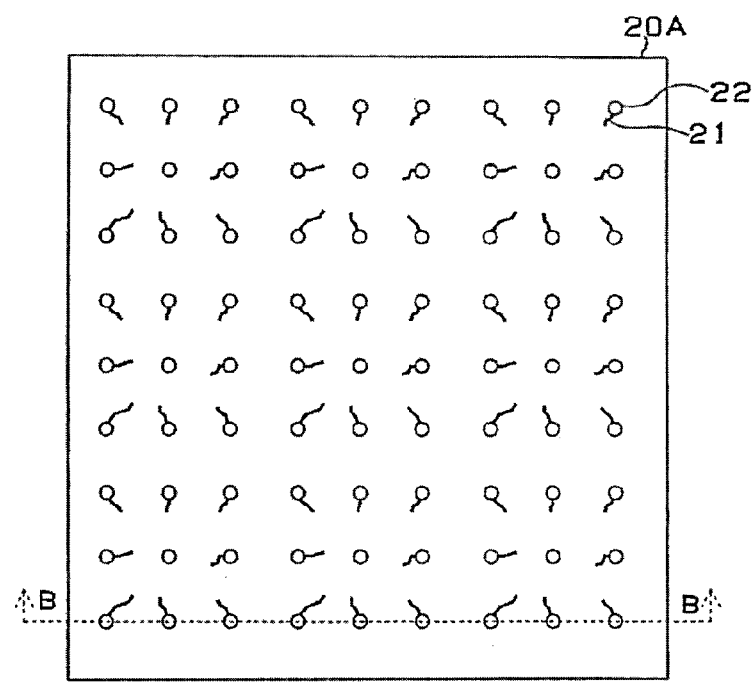
FIG. 4(A) is a plan view of a silicon wafer 20A according to the first embodiment.

(1) First, wirings 21 and die pads 22 are formed on a silicon wafer 20A shown in FIG. 1(A) in an established manner (see FIG. 1(B) and FIG. 4(A) which is a plan view of FIG. 1(B), it is noted that FIG. 1(B) is a cross-sectional view taken along B-B of FIG. 4(A)).

Figure 1C:
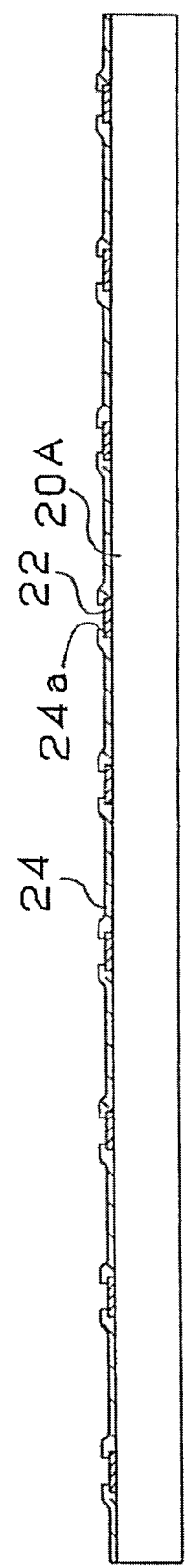

(2) Next, a protective film 24 is formed on the respective die pads 22 and wirings 21 and openings 24a are formed on the respective die pads 22 (see FIG. 1(C)).

Figure 2A:
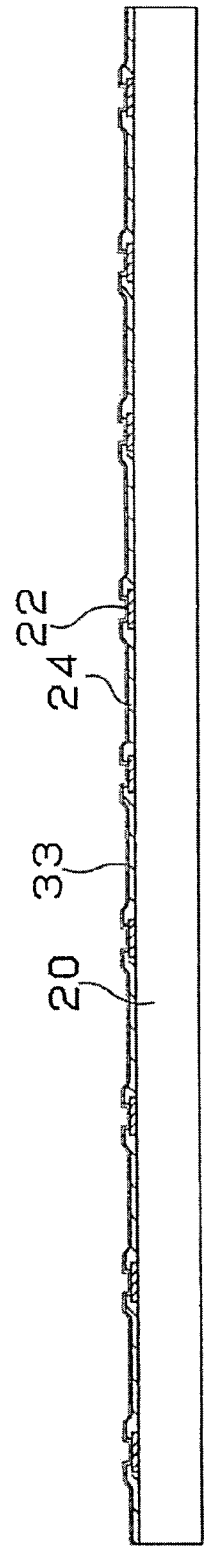
FIGS. 2(A), 2(B) and 2(C) are manufacturing step views of the semiconductor device according to the first embodiment of the present invention.

(3) Physical deposition such as deposition or sputtering is conducted to the silicon wafer 20A, thereby forming a conductive metallic film (or a thin film layer) 33 on the entire surface of the silicon wafer 20A (see FIG. 2(A)). It is preferable that the thickness of the conductive metallic film is in the range of 0.001 to 2.0 μm. If the thickness is below that range, the thin film layer cannot be formed on the entire surface. If the thickness exceeds that range, the thickness of the formed film becomes irregular. The optimum range is between 0.01 and 1.0 μm. Metal for use in the formation of the metallic film is preferably selected from a group comprising tin, chromium, titanium, nickel, zinc, cobalt, gold and copper. The metal serves as the protective film of the die pads and the electrical characteristics of the metal does not deteriorate. In the first embodiment, the thin film layer 33 is formed out of chromium by sputtering. Chromium is good in adhesiveness to metal and is capable of suppressing the entry of moisture. It is also possible to provide copper on the chromium layer by sputtering. Alternatively, two layers of chromium and copper can be formed continuously in a vacuum chamber. At this moment, the thickness of the chromium layer is about 0.05 to 0.1 μm and that of the copper layer is about 0.5 μm.

(4) Then, a resist layer made of a liquid resist, a photosensitive resist or a dry film is formed on the thin film 33. A mask (not shown) on which portions on which transition films 38 are formed are drawn is put on the resist layer, exposure and development are conducted and portions 35a on which the resist 35 is not formed are thereby formed. Electroless plating is conducted to thereby provide thickening layers (or electroplated films) 37 on the respective resist layer unformed portions 35a (see FIG. 2(B)). Types of plating materials include copper, nickel, gold, silver, zinc, iron and the like. In view of electrical characteristics, inexpensiveness and the fact that a conductor layer to be built up in a later step mainly comprise copper, copper is preferable. In the first embodiment, copper is used. The thickness of each thickening layer 37 is preferably in the range of 1 to 20 μm.

Figure 2B:
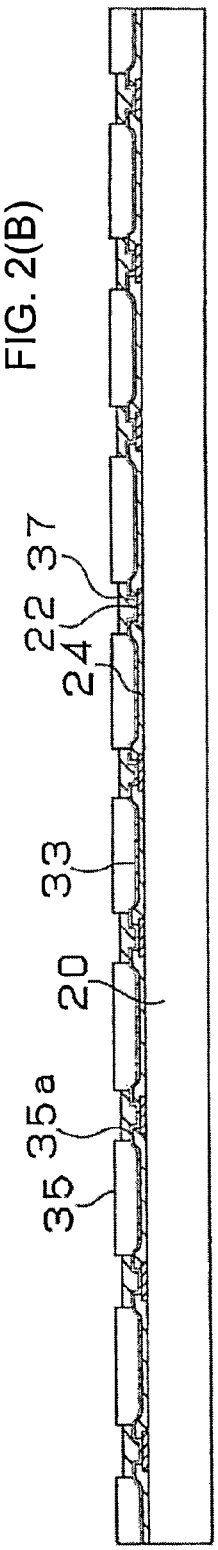
Figure 2C:
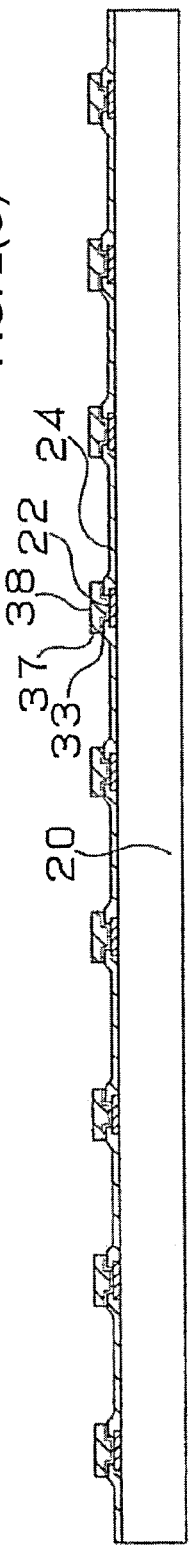

(5) After removing the plating resist 35 with an alkaline solution or the like, the metallic film 33 under the plating resist 35 is removed with an etching solution of sulfuric acid-oxygenated water, ferric chloride, cupric chloride, cupric complex-organic acid salt or the like, thereby forming transition layers 38 on the respective pads 22 of the IC chip (see FIG. 2(C)).

(6) Next, an etching solution is sprayed on the substrate and the surfaces of the transition layers 38 are etched, thereby forming rough surfaces 38α (see FIG. 3(A)). The rough surfaces 38α can be formed by conducting electroless plating or an oxidization-reduction process.

Figure 4B:
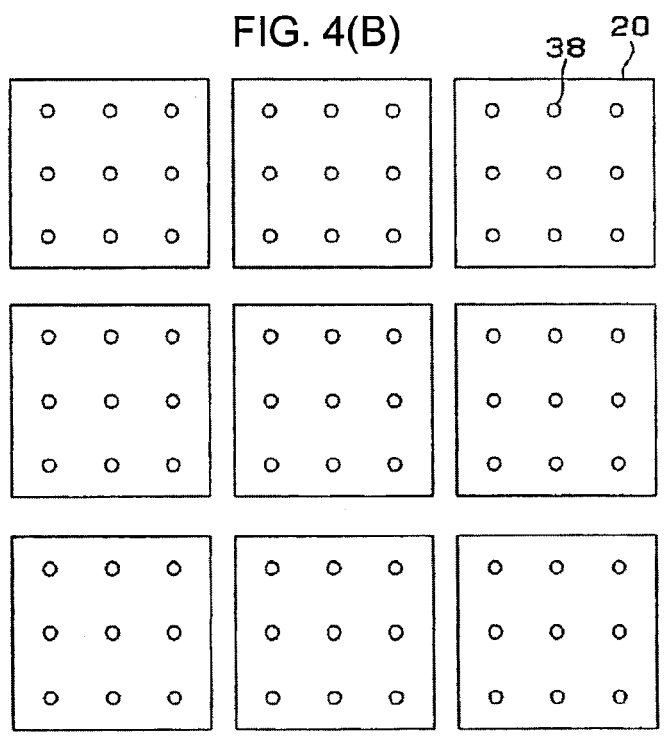
FIG. 4(B) is a plan view of the semiconductor device divided into pieces.

(7) Finally, the silicon wafer 20A on which the transition layers 38 are formed are divided into pieces by dicing or the like and semiconductor devices 20 are formed (see FIG. 3(B) and FIG. 4(B) which is a plan view of FIG. 3(B)). Thereafter, an operation verification test and/or an electrical test may be conducted to the divided semiconductor devices 20 at need. Since the transition layers 38 larger than the die pads 22 are formed on each semiconductor device 20, a probe pin can be easily contacted with the semiconductor device 20 and test accuracy is high.

[First Other Example of First Embodiment]

In the above-stated first embodiment, the thin film layer 33 is formed out of chromium. In the first other example, by contrast, the thin film layer 33 is formed out of titanium. Titanium is provided by deposition or sputtering. Since titanium has good adhesiveness to metal, it is possible to suppress the entry of moisture.

[Second Other Example of First Embodiment]

In the above-stated first embodiment, the thin film layer 33 is formed out of chromium. In the second other example, by contrast, a thin film layer 33 is formed out of tin. Since tin has good adhesiveness to metal, it is possible to suppress the entry of moisture.

[Third Other Example of First Embodiment]

In the above-stated first embodiment, a thin film layer 33 is formed out of chromium. In the third other example, by contrast, the thin film layer 33 is formed out of zinc.

[Fourth Other Example of First Embodiment]

In the above-stated first embodiment, a thin film layer 33 is formed out of chromium. In the fourth other example, by contrast, the thin film layer 33 is formed out of nickel. Nickel is provided by sputtering. Since nickel has good adhesiveness to metal, it is possible to suppress the entry of moisture.

[Fifth Other Example of First Embodiment]

In the above-stated first embodiment, a thin film layer 33 is formed out of chromium. In the fifth other example, by contrast, the thin film layer 33 is formed out of cobalt.

In each of the above other examples, copper may be further built up on the thin film layer.

[First Modification of First Embodiment]

A semiconductor device 20 according to the first modification of the first embodiment will be described with reference to FIG. 7(B). In case of the semiconductor device according to the first embodiment stated above with reference to FIG. 3(B), each of the transition layers 38 has a two-layer structure comprising the thin film layer 33 and the thickening layer 37. In the first modification, by contrast, each transition layer 38 is constituted to have a three-layer structure comprising the first thin film layer 33, the second thin film layer 36 and a thickening layer 37 as shown in FIG. 7(B).

Next, the method of manufacturing the semiconductor device according to the first modification described above with reference to FIG. 7(B) will be described with reference to FIGS. 5 to 7.

Figure 5A:
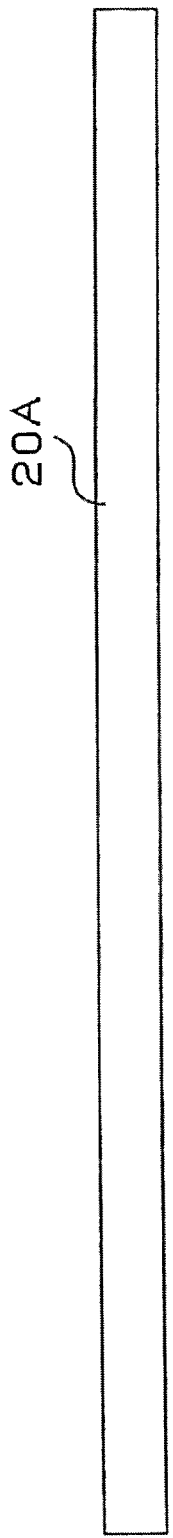
FIGS. 5(A), 5(B), 5(C) and 5(D) are manufacturing step views of a semiconductor device according to the first modification of the first embodiment.
Figure 5B:
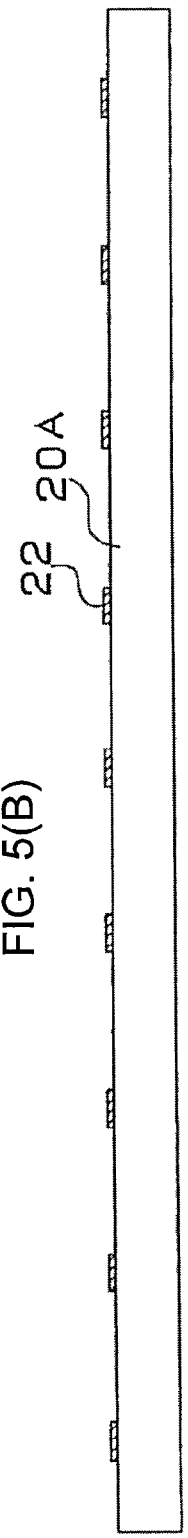

(1) First, wirings 21 and die pads 22 are formed on a silicon wafer 20A shown in FIG. 5(A) (see FIG. 5(B)).

Figure 5C:
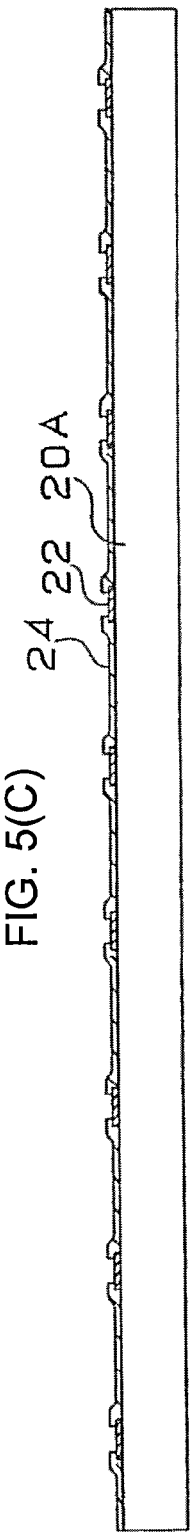

(2) Next, a protective film 24 is formed on the wirings 21 and the die pads 22 (see FIG. 5(C)).

Figure 5D:
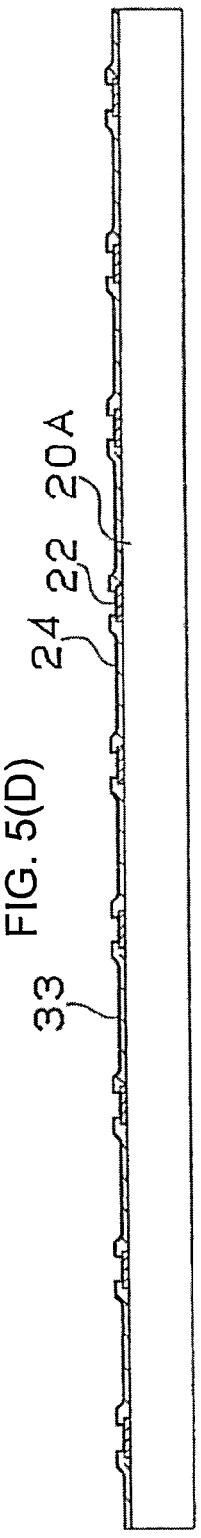

(3) Physical deposition such as deposition or sputtering is conducted to the silicon wafer 20A, thereby forming a conductive metallic film (or the first thin film layer) 33 on the entire surface of the silicon wafer 20A (see FIG. 5(D)). The thickness of the metallic film is preferably in the range of 0.001 to 2.0 μm. If the thickness is below that range, the thin film layer cannot be formed. If the thickness exceeds that range, the thickness of the formed film becomes irregular. The optimum range is between 0.01 to 1.0 μm. Metal for use in the formation of the metallic film is preferably selected from a group comprising tin, chromium, titanium, nickel, zinc, cobalt, gold and copper. The metal serves as the protective film of the die pads and the electrical characteristics of the metal does not deteriorate. Since chromium, nickel and titanium have good adhesiveness to metal, they can suppress the entry of moisture. In the first modification, the first thin film layer 33 is formed out of chromium.

Figure 6A:
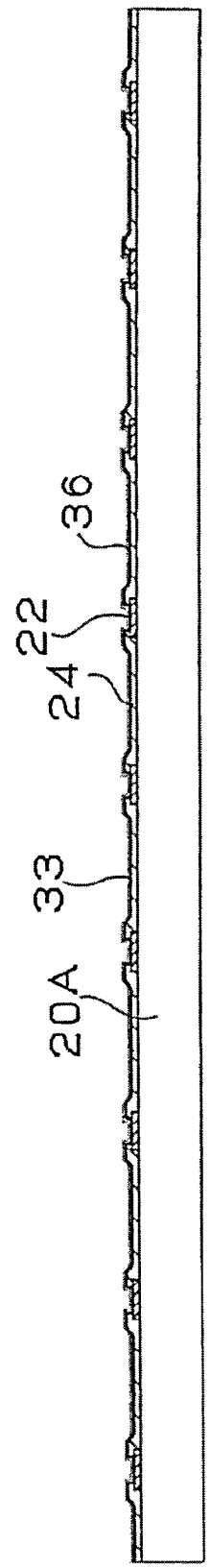
FIGS. 6(A), 6(B) and 6(C) are manufacturing step views of the semiconductor device according to the first modification of the first embodiment.
Figure 6B:
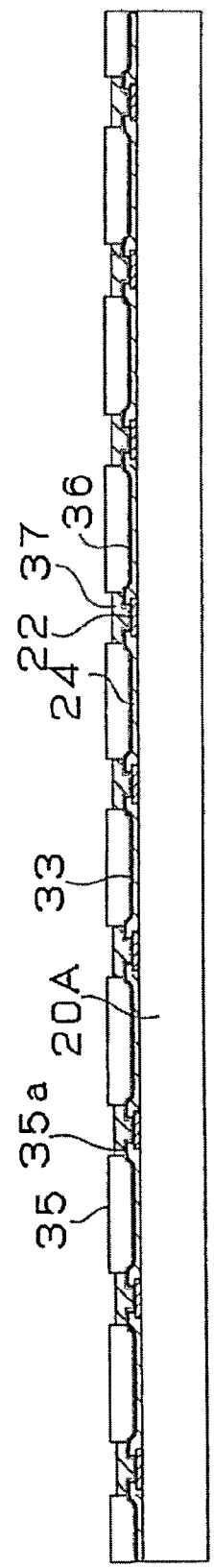

(4) The second thin film layer 36 is built up on the first thin film layer 33 by any one of sputtering, deposition and electroless plating methods (see FIG. 6(A)). Metal to be built up is preferably selected from a group comprising nickel, copper, gold and silver. It is more preferable to form the second thin film layer 36 out of copper or nickel. The reason is as follows. Copper is inexpensive and good in electrical conductivity. Nickel is good in adhesiveness to a thin film and hardly peeled or cracked. The thickness of the second thin film layer 36 is preferably 0.01 to 5.0 μm and more preferably 0.1 to 3.0 μm. In the first modification, the second thin film layer 36 is formed by electroless copper plating.

The preferable combinations of the first and second thin film layers are chromium-copper layers, chromium-nickel layers, titanium-copper layers, titanium-nickel layers and the like. These combinations are superior to the other combinations in coupling characteristics with respect to metal and electrical conductivity.

(5) Thereafter, a resist layer is formed on the second thin film layer 36. A mask (not shown) is put on the resist layer, exposure and development are conducted and portions 35a on which the resist 35 is not formed are formed. Thickening layers (or electroless plated layers) 37 are provided on the resist unformed sections 35a by electroplating (see FIG. 6(B)). Types of plating materials used in the formation of plated layers include copper, nickel, gold, silver, zinc, iron and the like. In view of electrical characteristics, inexpensiveness and the fact that a conductor layer to be built up in a later step mainly comprises copper, copper is preferable. In the first modification, therefore, copper is used. The thickness of each thickening layer 37 is preferably in the range of 1 to 20 μm.

Figure 6C:
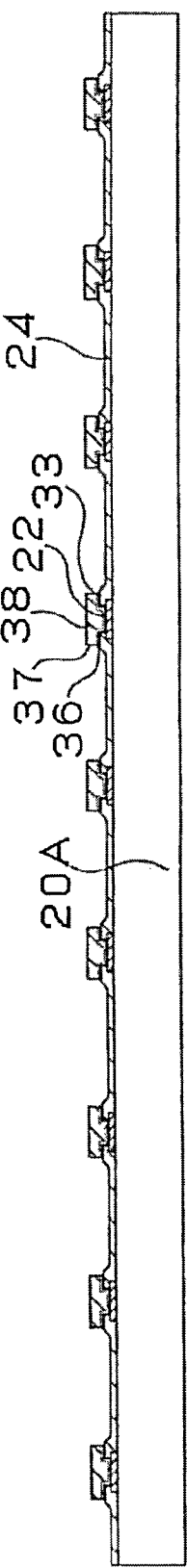

(6) After removing the plating resist 35 with an alkaline solution or the like, the second thin film layer 36 and the metallic film 33 under the plating resist 35 are removed with an etching solution of sulfuric acid-oxygenated water, ferric chloride, cupric chloride, cupric complex-organic acid salt or the like, thereby forming transition layers 38 on the respective pads 22 of the IC chip (see FIG. 6(C)).

Figure 7A:
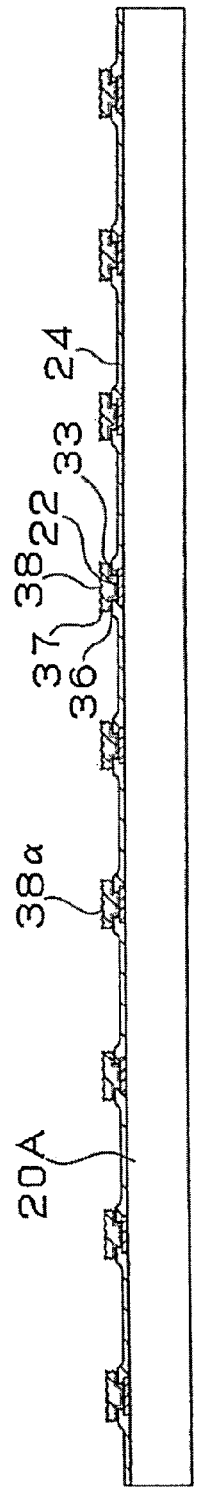
FIGS. 7(A) and 7(B) are manufacturing step views of the semiconductor device according to the first modification of the first embodiment.
Figure 7B:
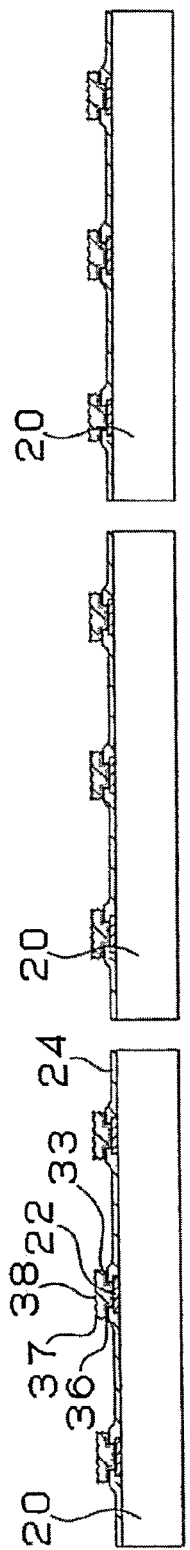

(7) Next, an etching solution is sprayed on the substrate and the surfaces of the transition layers 38 are etched, thereby forming rough surfaces 38a (see FIG. 7(A)). The rough surfaces 38a can be formed by conducting electroless plating or an oxidization-reduction process.

(8) Finally, the silicon wafer 20A on which the transition layers 38 are formed are divided into pieces by dicing or the like and semiconductor devices are formed (see FIG. 7(B)).

[First Other Example of First Modification of First Embodiment]

In the first modification stated above, the first thin layer 33 is formed out of chromium, the second thin film layer 36 is formed by electroless copper plating and the thickening layer 37 is formed by copper electroplating. In the first other example, by contrast, the first thin film layer 33 is formed out of chromium, the second thin film layer 36 is formed by sputtering copper and the thickening layer 37 is formed by copper electroplating. The thickness of the chromium layer is 0.07 μm, that of the copper layer is 0.5 μm and that of the electroplated copper layer is 15 μm.

[Second Other Example of First Modification of First Embodiment]

In the second other example, the first thin film layer 33 is formed out of titanium, the second thin film layer 36 is formed by electroless copper plating and the thickening layer 37 is formed by copper electroplating. The thickness of the titanium layer is 0.07 μm, that of the copper plated layer is 1.0 μm and that of the copper electroplated layer is 17 μm.

[Third Other Example of First Modification of First Embodiment]

In the third other example, the first thin film layer 33 is formed out of titanium, the second thin film layer 36 is formed by sputtering copper and the thickening layer 37 is formed by copper electroplating. The thickness of the titanium layer is 0.06 μm, that of the copper layer is 0.5 μm and that of the copper electroplated layer is 15 μm.

[Fourth Other Example of First Modification of First Embodiment]

In the fourth other example, the first thin film layer 33 is formed out of chromium, the second thin film layer 36 is formed by electroless nickel plating and the thickening layer 37 is formed by copper electroplating. The thickness of the chromium layer is 0.07 μm, that of the copper plated layer is 1.0 μm and the copper electroplated layer is 15 μm.

[Fifth Other Example of First Modification of First Embodiment]

In the fifth example, the thin film layer 33 is formed out of titanium, the second thin film layer 36 is formed by electroless nickel plating and the thickening layer 37 is formed by copper electroplating. The thickness of the titanium layer is 0.05 μm, that of the nickel plated layer is 1.2 μm and that of the copper electroplated layer is 15 μm.

[Second Modification of First Embodiment]

The method of manufacturing a semiconductor device 20 according to the second modification will be described with reference to FIG. 8. The constitution of the semiconductor device in the second modification is almost the same as that in the first embodiment stated above with reference to FIG. 3(B). In the first embodiment, a semi-additive step is employed and the thickening layers 37 are formed on the respective resist unformed portions, thereby forming the transition layers 38. In the second modification, by contrast, an additive step is employed and thickening layers 37 are uniformly formed. Thereafter, a resist is provided and resist unformed portions are etched away, thereby forming transition layers 38.

The manufacturing method in the second modification will be described with reference to FIG. 8.

(1) As described above in the first embodiment with reference to FIG. 2(B), physical deposition such as deposition or sputtering is conducted to a silicon wafer 20A, thereby forming a conductive metallic film 33 on the entire surface of the silicon wafer 20A (see FIG. 8(A)). The thickness of the conductive metallic film 33 is preferably in the range of 0.001 to 2.0 μm. If the thickness is below that range, a thin film layer cannot be formed on the entire surface. If the thickness exceeds that range, the thickness of the film to be formed becomes irregular. The optimum range is preferably 0.01 to 1.0 μm. Metal for use in the formation of the metallic film 33 is preferably selected from a group comprising tin, chromium, titanium, nickel, zinc, cobalt, gold and copper. The metal serves as the protective film of die pads and the electrical characteristics of the metal does not deteriorate. In the second modification, the thin film layer 33 is formed by sputtering chromium. The thickness of the chromium thin film layer 33 is 0.05 μm.

(2) Electroplating is conducted to provide a thickening layer (or an electroplated film) 37 on the thin film layer 33 (see FIG. 8(B)). Types of plating materials include copper, nickel, gold, silver, zinc, iron and the like. In view of electrical characteristics, inexpensiveness and the fact that a conductor layer to be built up in a later step mainly comprises copper, copper is preferable. In the second modification, therefore, copper is used. The thickness of the thickening layer 37 is preferably in the range of 1.0 to 20 μm. If the thickness exceeds that range, undercut may possibly occur during etching to be described later to thereby generate gaps in the interfaces between a transition layer and via holes to be formed.

(3) Thereafter, a resist layer 35 is formed on the thickening layer 37 (see FIG. 8(C)).

(4) The metallic film 33 and the thickening layer 37 on the portions on which the resist 35 is not formed are etched away with an etching solution of sulfuric acid-oxygenated water, ferric chloride, cupric chloride, cupric complex-organic acid salt or the like, thereby forming transition layers 38 on the respective pads 22 of the IC chip (see FIG. 8(D)). Since following steps are the same as those in the first embodiment, no description will be given thereto.

[First Other Example of Second Modification of First Embodiment]

In the second modification stated above, the thin film layer 33 is formed out of chromium. In the first other example, by contrast, a thin film layer 33 is formed out of titanium.

[Third Modification of First Embodiment]

The method of manufacturing a semiconductor device 20 according to the third modification will be described with reference to FIG. 9. In case of the semiconductor device according to the second modification stated above with reference to FIG. 8, each transition layer 38 has a two-layer structure comprising the thin film layer 33 and the thickening layer 37. In the third modification, as shown FIG. 9(D), by contrast, a transition layer 38 is constituted to have a three-layer structure comprising the first thin film layer 33, the second thin film layer 36 and a thickening layer 37.

The manufacturing method in the third modification will be described with reference to FIG. 9.

(1) As in the case of the first modification in the first embodiment stated above with reference to FIG. 6(A), the second thin film layer 36 is built up on the first thin film layer 33 by sputtering, deposition or electroless plating (see FIG. 9(A)). Metal to be built up in this case is preferably selected from a group comprising nickel, copper, gold and silver. Copper or nickel is more preferable. The reason is as follows. Copper is inexpensive and good in electrical conductivity. Nickel is good in adhesiveness to a thin film and is hardly peeled or cracked. In the third modification, the second thin film layer 36 is formed by electroless copper plating. The thickness of the second thin film layer 36 is preferably 0.01 to 5.0 μm and more preferably 0.1 to 3.0 μm.

The preferable combinations of the first thin film layer and the second thin film layer are chromium-copper layers, chromium-nickel layers, titanium-copper layers, titanium-nickel layers. These combinations are superior to the other combinations in coupling characteristics with respect to metal and electrical conductivity.

(2) Electroplating is conducted, thereby uniformly providing a thickening layer 37 made of nickel, copper, gold, silver, zinc or iron on the second thin film layer 36 (see FIG. 9(B)). The thickness of the thickening layer 37 is preferably 1 to 20 μm.

(3) Thereafter, a resist layer 35 is formed on the thickening layer 37 (see FIG. 9(C)).

(4) The first thin film layer 33, the second thin film layer 36 and the thickening layer 37 on portions on which the resist 35 is not formed are removed with an etching solution of sulfuric acid-oxygenated water, ferric chloride, cupric chloride, cupric complex-organic acid salt or the like and the resist 35 is peeled, thereby forming transition layers 38 on the respective pads 22 of the IC chip (see FIG. 9(D)). Since following steps are the same as those in the first embodiment, no description will be given thereto.

[First Other Example of Third Modification of First Embodiment]

In the third modification stated above, the first thin film layer 33 is formed out of chromium, the second thin film layer 36 is formed by electroless copper plating and the thickening layer 37 is formed by copper electroplating. In the first other example, by contrast, the first thin film layer 33 is formed out of chromium, the second thin film layer 36 is formed by sputtering copper and a thickening layer 37 is formed by copper electroplating. The thickness of the chromium layer is 0.07 μm, that of the copper layer is 0.5 μm and that of the copper electroplated layer is 15 μm.

[Second Other Example of Third Modification of First Embodiment]

In the second other example, the first thin film layer 33 is formed out of titanium, the second thin film layer 36 is formed by electroless copper plating and a thickening layer 37 is formed by copper electroplating. The thickness of the titanium layer is 0.07 μm, that of the copper layer is 1.0 μm and that of the copper electroplated layer is 15 μm.

[Third Other Example of Third Modification of First Embodiment]

In the third other example, the first thin film layer 33 is formed out of titanium, the second thin film layer 36 is formed by sputtering copper and the thickening layer 37 is formed by copper electroplating. The thickness of the titanium layer is 0.07 μm, that of the copper layer is 0.5 μm and that of the copper electroplated layer is 18 μm.

[Fourth Other Example of Third Modification of First Embodiment]

In the fourth other example, the first thin film layer 33 is formed out of chromium, the second thin film layer 36 is formed by electroless nickel plating and a thickening layer 37 is formed by copper electroplating. The thickness of the chromium layer is 0.06 μm, that of the nickel layer is 1.2 μm and that of the copper electroplated layer is 16 μm.

[Fifth Other Example of Third Modification of First Embodiment]

In the fifth other example, the first thin film layer 33 is formed out of titanium, the second thin film layer 36 is formed by electroless nickel plating and a thickening layer 37 is formed by copper electroplating. The thickness of the titanium layer is 0.07 μm, that of the nickel layer is 1.1 μm and that of the copper electroplated layer is 15 μm.

B. Multilayer Printed Circuit Board into which Semiconductor Device is Integrated.

Next, description will be given to the constitution of a multilayer printed circuit board provided by embedding and containing a semiconductor device (or an IC chip) 20 in the above-stated first to third modifications into the recess, gap or opening of a core substrate.

[First Embodiment]

Figure 14:
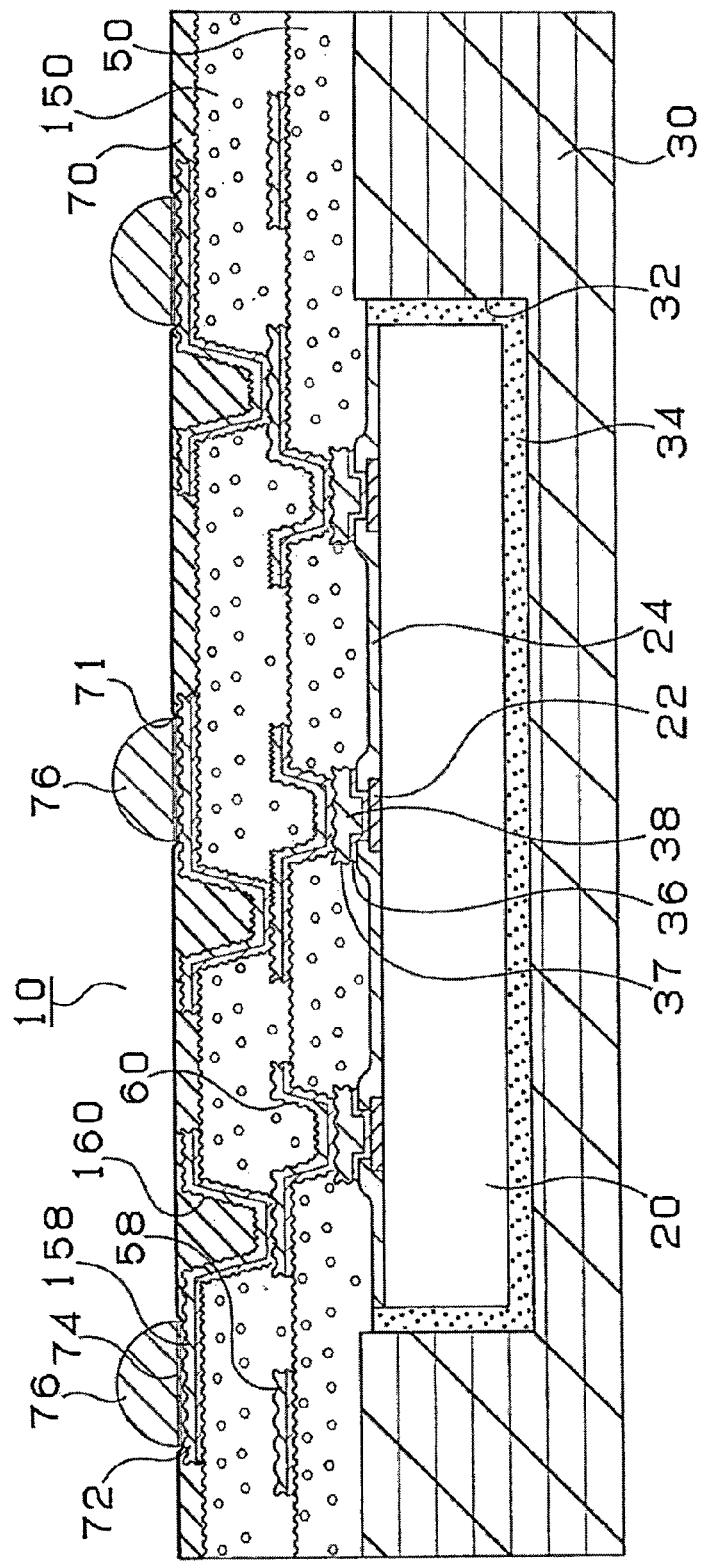
FIG. 14 is a cross-sectional view of the multilayer printed circuit board according to the first embodiment.

As shown in FIG. 14, the multilayer printed circuit board 10 comprises a core substrate 30 containing therein an IC chip 20, an interlayer resin insulating layer 50 and an interlayer resin insulating layer 150. Via holes 60 and conductor circuits 58 are formed on the interlayer resin insulating layer 50. Via holes 160 and conductor circuits 158 are formed on the interlayer resin insulating layer 150.

A solder resist layer 70 is provided on the interlayer resin insulating layer 150. Solder bumps 76 for connecting to an external substrate such as a daughter board or a mother board, which is not shown in FIG. 14, are provided on the conductor circuits 158 under the openings 71 of the solder resist layer 70, respectively.

In the multilayer printed circuit board 10 in this embodiment, the IC chip 20 is integrated into the core substrate 30 and transition layers 38 are provided on the respective pads 22 of the IC chip 20. Due to this, it is possible to electrically connect the IC chip to the multilayer printed circuit board (or package substrate) without using lead members and a sealing resin. Further, since the transition layers 38 are formed on the IC chip portion, the IC chip portion is flattened and the upper interlayer insulating layer 50 is, therefore, flattened to thereby provide uniform film thickness. Further, because of the transition layers, it is possible to maintain the stability of shape even if the via holes 60 provided in the upper layer are formed.

Furthermore, by providing the transition layers 38 made of copper on the respective die pads 22, it is possible to prevent resin residues on the die pads 22 and to prevent the die pads 22 from being discolored or dissolved even after impregnating the multilayer printed circuit board in an acid, an oxidizer or an etching solution in a later step or conducting various annealing steps. Thus, connection characteristic between the die pads of the IC chip and the via holes and reliability can be improved. Besides, by interposing the transition layers 38 each having a diameter of 60 μm or more on the respective pads 22 each having a diameter of 40 μm, it is possible to ensure connecting the via holes each having a diameter of 60 μm.

Next, the method of manufacturing the multilayer printed circuit board described above with reference to FIG. 14 will be described with reference to FIGS. 10 to 13.

Figure 10A:
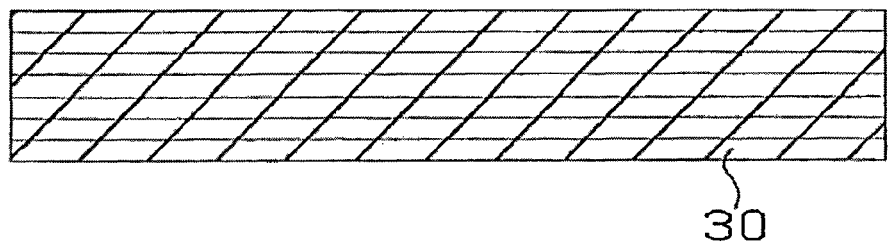
FIGS. 10(A), 10(B), 10(C) and 10(D) are manufacturing step views of a multilayer printed circuit board according to the first embodiment.
Figure 10B:
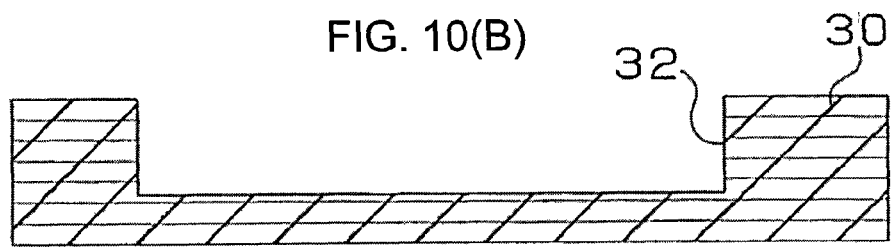
Figure 10C:
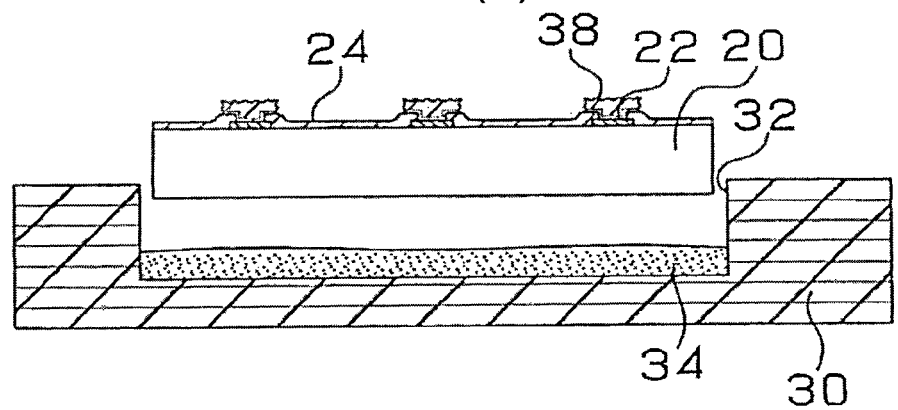

(1) First, an insulating resin substrate (or a core substrate) 30 in which prepregs each having a core material made of glass cloths or the like and impregnated with a resin such as epoxy are built up, is used as a starting material (see FIG. 10(A)). Next, a recess 32 for containing an IC chip is formed on one side of the core substrate 30 by counter boring (see FIG. 10(B)). While the recess is provided by counter boring herein, it is also possible to forma core substrate having a containing section by building up an insulating resin substrate having an opening to an insulating resin substrate without an opening.

(2) Then, an adhesive material 34 is applied to the recess 32 using a printing machine. At this time, potting instead of application may be conducted. Next, an IC chip 20 is mounted on the adhesive material 34 (see FIG. 10(C)).

Figure 10D:
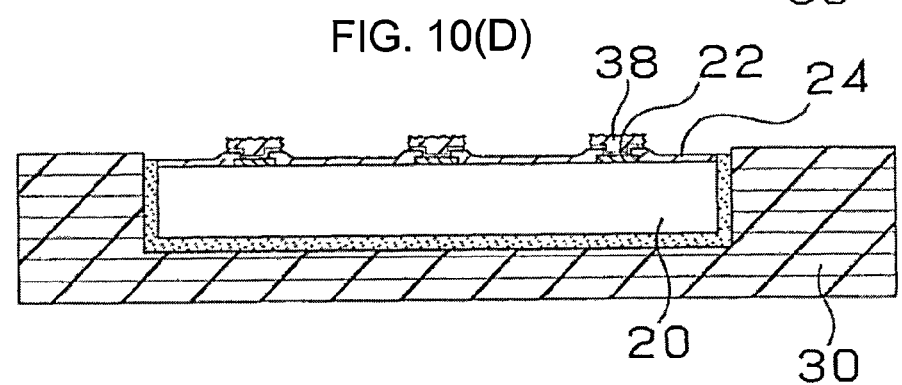

(3) Then, the upper surface of the IC chip 20 is depressed or struck to thereby completely contain the IC chip 20 in the recess 32 (see FIG. 10(D)). By doing so, the core substrate 30 can be smoothed. At this moment, the adhesive material 34 is sometimes applied on the upper surface of the IC chip 20. However, as described later, since a resin layer is provided on the upper surface of the IC chip 20 and then openings for via holes are provided by laser, the adhesive material 34 does not influence the connection between transition layers 38 and via holes.

Figure 11A:
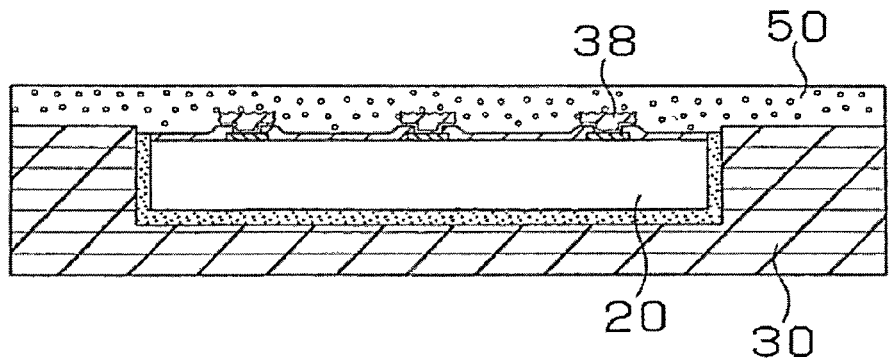
FIGS. 11(A), 11(B) and 11(C) are manufacturing step views of the multilayer printed circuit board according to the first embodiment.

(4) A thermosetting resin sheet having a thickness of 50 μm is vacuum-compression laminated onto the substrate which has gone through the above-stated steps at a pressure of 5 kg/cm² while raising temperature to 50 to 150° C., thereby providing an interlayer resin insulating layer 50 (see FIG. 11(A)). The degree of vacuum at the time of vacuum compression is 10 mmHg.

Figure 11B:
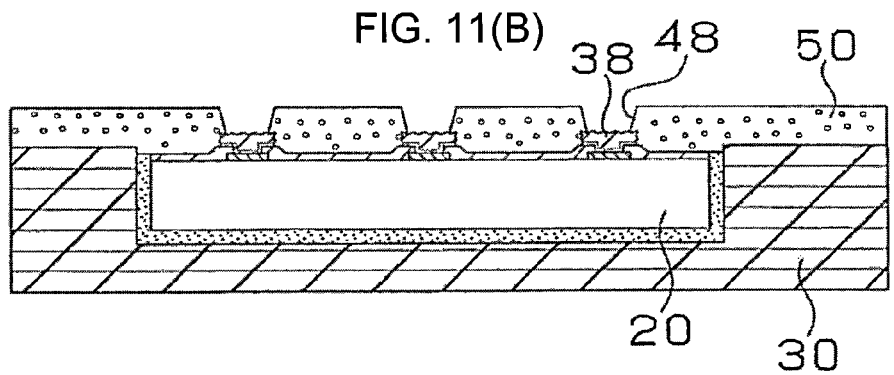

(5) Next, using CO₂ gas laser having a wavelength of 10.4 μm, via hole openings 48 each having a diameter of 60 μm are provided in the interlayer resin insulating layer 50 under the conditions of a beam diameter of 5 mm, a top hat mode, a pulse width of 5.0 microseconds, a mask hole diameter of 0.5 mm and one shot (see FIG. 11(B)). Using a permanganic acid at a temperature of 60° C., resin residues in the openings 48 are removed. By providing a transition layer 38 made of copper on each die pad 22, it is possible to prevent resin residues on the pad 22, thereby improving connection characteristic between the pad 22 and a via hole 60 to be described later and improving reliability. Furthermore, by interposing the transition layer 38 having a diameter of 60 μm or more on the die pad 22 having a diameter of 40 μm, it is possible to ensure connecting the via hole opening 48 having a diameter of 60 μm. While the resin residues are removed by using an oxidizer such as a permanganic acid, a de-smear process can be also conducted using oxygen plasma or corona process.

Figure 11C:
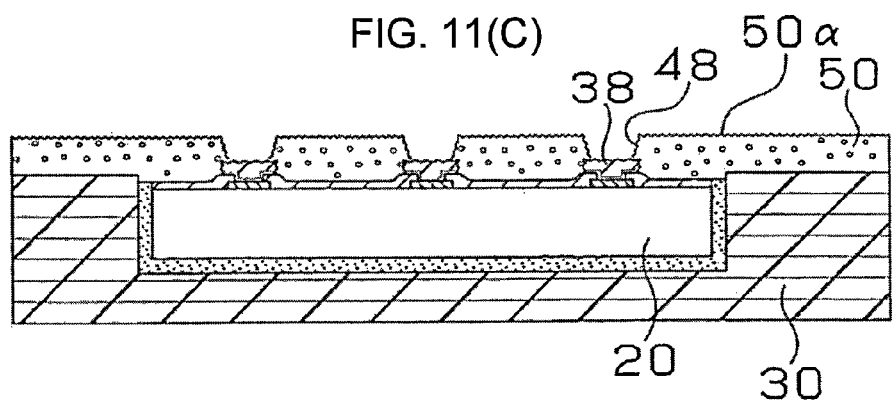

(6) Next, the resultant substrate is immersed in an oxidizer such as a chromic acid or a permanganic acid or the like, thereby providing a rough surface 50α on the interlayer resin insulating layer 50 (see FIG. 11(c)). The rough surface 50α is preferably formed to have a thickness in the range of 0.1 to 5 μm. For example, the substrate is immersed in 50 g/l of a sodium permanganate solution at a temperature of 60° C. for 5 to 25 minutes, thereby providing a rough surface 50α of 2 to 3 μm. Alternatively, by performing a plasma process using SV-4540 manufactured by ULVAC JAPAN LTD., the rough surface 50α can be formed on the surface of interlayer resin insulating layer 50. In that case, argon gas is used as inactive gas to perform a plasma process for two minutes under conditions of electric power of 200 W, a gas pressure of 0.6 Pa and a temperature of 70° C.

Figure 12A:
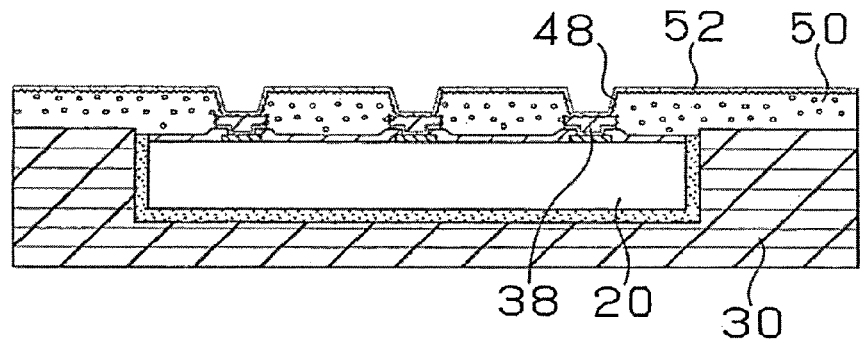
FIGS. 12(A), 12(B) and 12(C) are manufacturing step views of the multilayer printed circuit board according to the first embodiment.
Figure 12B:
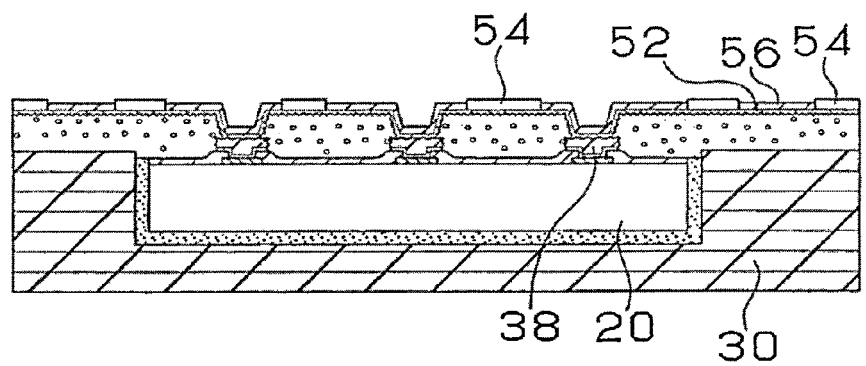

(7) A metallic layer 52 is provided on the interlayer resin insulating layer 50 on which the rough surface 50α has been formed (see FIG. 12(A)). The metallic layer 52 is formed by electroless plating. By supplying a catalyst such as a palladium catalyst to the surface layer of the interlayer resin insulating layer 50 in advance and immersing the substrate into an electroless plating solution for 5 to 60 minutes, the metallic layer 52 which is a plated film is provided in the range of 0.1 to 5 μm. For example, the substrate is immersed in the following solution at a solution temperature of 34° C. for 40 minutes:
[Electroless Plating Solution]

| NiSO₄ | 0.003 mol/l |
| tartaric acid | 0.200 mol/l |
| copper sulfate | 0.030 mol/l |
| HCHO | 0.050 mol/l |
| NaOH | 0.100 mol/l |
| α,α'-bipyridyl | 100 mg/l |
| polyethylene glycol (PEG) | 0.10 g/l |

Alternatively, an Ni/Cu alloy 52 can be formed on the surface of the interlayer epoxy resin insulating layer 50 by conducting sputtering with an Ni—Cu alloy 52 as a target under conditions of an air pressure of 0.6 Pa, a temperature of 80° C., power of 200 W and a duration of five minutes using SV-4540 manufactured by ULVAC JAPAN LTD. At this moment, the thickness of the Ni—Cu alloy layer 52 thus formed is 0.2 μm.

(8) A commercially available photosensitive dry film is bonded to the substrate 30 which has been subjected to the above process, a photomask film is mounted, exposure is conducted at 100 mj/cm² and then a development process is conducted with 0.8% sodium carbonate, thereby providing a plating resist 54 having a thickness of 15 μm. Next, electroplating is conducted under the following conditions, thereby forming an electroplated firm (see FIG. 12(B)). An additive in the electroplating solution is Kapalacid HL manufactured by Atotech Japan.
[Electroplating Solution]

| sulfuric acid | 2.24 mol/l |
| copper sulfate | 0.26 mol/l |
| additive | 19.5 mol/l |

(Kapalacid HL manufactured by Atotech Japan)
[Electroplating Conditions]

| current density | 1 A/dm² |
| duration | 65 minutes |
| temperature | 22 ± 2° C. |

Figure 12C:
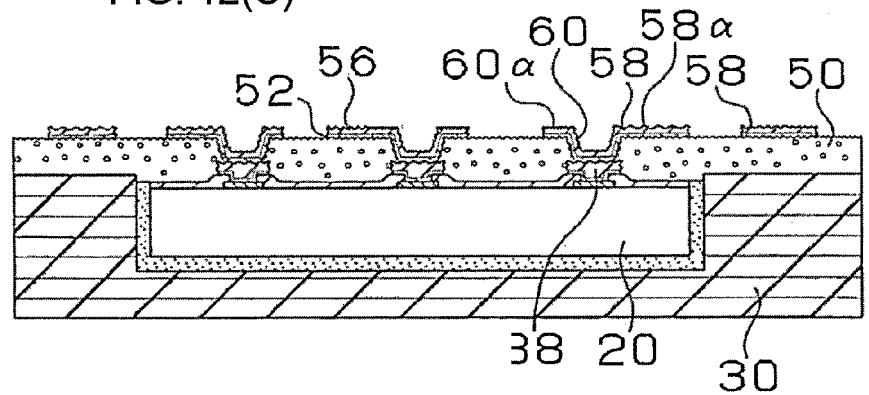

(9) After separating and removing the plating resist with 5% NaOH, the metallic layer 52 under the plating resist is dissolved and removed by etching using a mixture solution of a nitric acid, a sulfuric acid and oxygenated water, conductor circuits 58 each comprising the metallic layer 52 and the electroplated film 56 and having a thickness of 16 μm and via holes 60 are formed and etched by an etching solution containing a cupric salt complex and an organic acid, thereby forming rough surfaces 58α and 60α (see FIG. 12(C)).

Figure 13A:
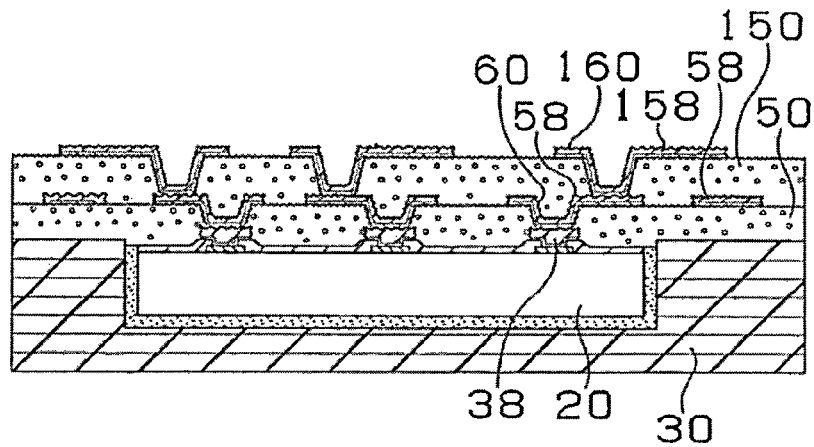
FIGS. 13(A), 13(B) and 13(C) are manufacturing step views of the multilayer printed circuit board according to the first embodiment.
Figure 13B:
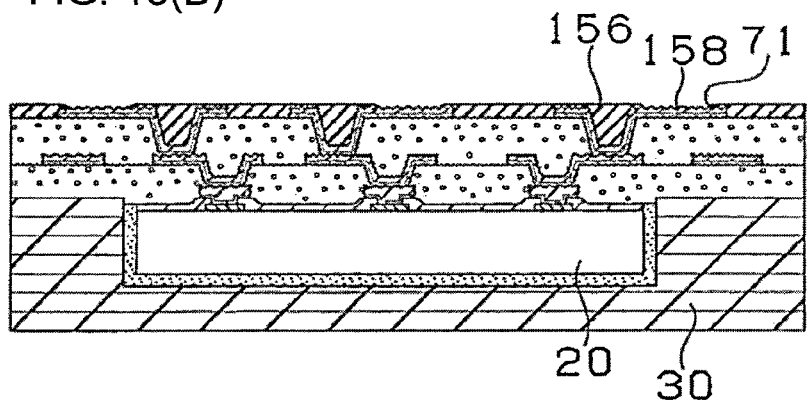
Figure 13C:
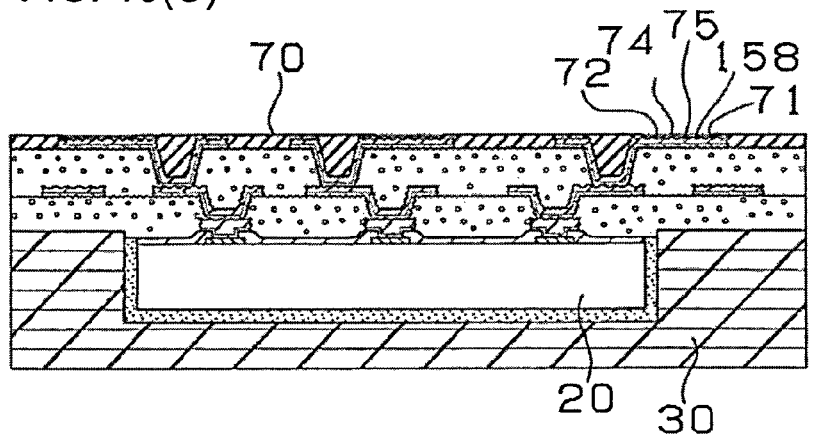

(10) Next, the steps of (4) to (9) stated above are repeated, thereby forming an upper interlayer resin insulating layer 150 and conductor circuits 158 (including via holes 160) (see FIG. 13(A)).

(11) Then, 46.67 parts by weight of oligomer (having a molecular weight of 4000) which is obtained by forming 50% of epoxy groups of 60 parts by weight of a cresol novolac epoxy resin (manufactured by Nippon Kayaku Co., Ltd.) dissolved in diethylene glycol dimethyl ether (DMDG) into an acrylic structure and which imparts photosensitive characteristic, 15 parts by weight of 80 wt % of a bisphenol A epoxy resin (product name: Epicoat 1001 manufactured by Yuka Shell) dissolved in methylethyl keton, 1.6 parts by weight of an imidazole hardening agent (product name: 2E4MZ-CN manufactured by Shikoku Chemicals Corp.), 3 parts by weight of polyhydric acryl monomer which is a photosensitive monomer (product name: R604 manufactured by Kyoei Chemical), 1.5 parts by weight of polyhydric acryl monomer (product name: DPE6A manufactured by Kyoei Chemical), and 0.71 parts by weight of a dispersing defoaming agent (product name: S-65 manufactured by Sannopuko) are contained in a container, agitated and mixed to adjust mixture compositions. Then, 2.0 parts by weight of benzophenone (manufactured by Kanto Chemical) serving as a photoinitiator and 0.2 parts by weight of Michler's ketone (manufactured by Kanto Chemical) serving as a photosensitizer are added to the mixture compositions, thereby obtaining a solder resist composition (or organic resin insulating material) adjusted to have a viscosity of 2.0 Pa·s.

It is noted that the viscosity is measured by using No. 4 rotor of a B-type viscometer (DVL-B manufactured by Tokyo Keiki) when the velocity is 60 rpm and using No. 3 rotor of the same when the velocity is 6 rpm.

(12) Next, the solder resist composition is applied to the substrate 30 to have a thickness of 20 μm and a drying process is conducted at 70° C. for 20 minutes and 70° C. for 30 minutes. Then, a photomask film having a pattern of the solder resist opening portions drawn thereon and a thickness of 5 mm is made hermetic contact with the solder resist layer 70, exposure is performed with ultraviolet rays with 1000 mj/cm$^2$ and then a development process is performed with a DMTG solution, thereby forming openings 71 each having a diameter of 200 μm (see FIG. 13(B)). Alternatively, a commercially available solder resist may be used.

(13) Next, the substrate on which the solder resist layer (or organic resin insulating layer) 70 is formed, is immersed in an electroless nickel plating solution containing nickel chloride ($2.3 \times 10^{-1}$ mol/l), sodium hypophosphite ($2.8 \times 10^{-1}$ mol/l), sodium citrate ($1.6 \times 10^{-1}$ mol/l) and having pH=4.5 for 20 minutes, and a nickel plated layer 72 having a thickness of 5 μm is formed on each opening portion 71. Then, the substrate is further immersed in an electroless plating solution containing gold potassium cyanide ($7.6 \times 10^{-3}$ mol/l), ammonia chloride ($1.9 \times 10^{-1}$ mol/l), sodium citrate ($1.2 \times 10^{-1}$ mol/l) and sodium hypophosphite ($1.7 \times 10^{-1}$ mol/l) under the condition of 80° C. for 7.5 minutes and a gold plated layer 74 having a thickness of 0.03 μm is formed on the nickel plated layer 72, thereby forming a solder pad 75 on each conductor layer 158 (see FIG. 13(C)).

(14) Thereafter, a solder paste is printed on the opening portions 71 of the solder resist layer 71 and reflow is conducted at 200° C., thereby forming solder bumps 76. As a result, it is possible to obtain a multilayer printed circuit board 10 into which the IC chip 20 is integrated and which has the solder bumps 76 (see FIG. 14).

As the solder paste, Sn/Pb, Sn/Sb, Sn/Ag, Sn/Ag/Cu or the like may be used. Needless to say, a solder paste of low a radiation ray type may be used.

In the above-stated embodiment, the thermosetting resin sheet is used for the interlayer resin insulating layers 50 and 150. The thermosetting resin insulating sheet contains a refractory resin, soluble particles, a hardening agent and other components. The materials will now be described one by one.

The resin used in the manufacturing method of the present invention has a structure in that particles soluble in acid or an oxidizer (hereinafter, referred to as "soluble particles") are dispersed in resin which is refractory with respect to acid or an oxidizer (hereinafter, referred to as "refractory resin").

The expressions "refractory" and "soluble" will now be described. When materials are immersed in solution composed of the same acid or the same oxidizers for the same time, a material of a type which is dissolved at a relatively high dissolving rate is called a "soluble" material for convenience. A material of a type which is dissolved at a relatively slow dissolving rate is called a "refractory material" for convenience.

The soluble particles are exemplified by resin particles which are soluble in acid or an oxidizer (hereinafter called "soluble resin particles"), inorganic particles which are soluble in acid or an oxidizer (hereinafter called "inorganic soluble particles") and metal particles which are soluble in acid or an oxidizer (hereinafter called "soluble metal particles"). The foregoing soluble particles may be employed solely or two or more particles may be employed.

The shape of each of the soluble particles is not limited. The shape may be a spherical shape or a pulverized shape. It is preferable that the particles have a uniform shape. The reason for this lies in that a rough surface having uniformly rough pits and projections can be formed.

It is preferable that the mean particle size of the soluble particles is 0.14 μm to 10 μm. When the particles have the diameters satisfying the foregoing range, particles having two or more particle sizes may be employed. That is, soluble particles having a mean particle size of 0.1 μm to 0.5 μm and soluble particles having a mean particle size of 1 μm to 3 μmm may be mixed. Thus, a more complicated rough surface can be formed. Moreover, the adhesiveness with the conductor circuit can be improved. In the present invention, the particle size of the soluble particles is the length of a longest portion of each of the soluble particles.

The soluble resin particles may be particles constituted by thermosetting resin or thermoplastic resin. When the particles are immersed in solution composed of acid or an oxidizer, the particles must exhibit dissolving rate higher than that of the foregoing refractory resin.

Specifically, the soluble resin particles are exemplified by particles constituted by epoxy resin, phenol resin, polyimide resin, polyphenylene resin, polyolefin resin polietelslufon or fluorine resin. The foregoing material may be employed solely or two or more materials may be mixed.

The soluble resin particles may be resin particles constituted by rubber. Rubber above is exemplified by polybutadiene rubber, a variety of denatured polybutadiene rubber, such as denatured epoxy rubber, denatured urethane rubber or denatured (metha) acrylonitrile rubber, and (metha) acrylonitrile butadiene rubber containing a carboxylic group. When the foregoing rubber material is employed, the soluble resin particles can easily be dissolved in acid or an oxidizer. That is, when the soluble resin particles are dissolved with acid, dissolution is permitted with acid except for strong acid. When the soluble resin particles are dissolved, dissolution is permitted with permanganate which has a relatively weak oxidizing power. When chromic acid is employed, dissolution is permitted even at a low concentration. Therefore, retention of the acid or the oxidizer on the surface of the resin can be prevented. When a catalyst, such as palladium chloride, is supplied after the rough surface has been formed as described later, inhibition of supply of the catalyst and oxidation of the catalyst can be prevented.

The inorganic soluble particles are exemplified by particles made of at least a material selected from a group comprising an aluminum compound, a calcium compound, a potassium compound, a magnesium compound and a silicon compound.

The aluminum compound is exemplified by alumina and aluminum hydroxide. The calcium compound is exemplified by calcium carbonate and calcium hydroxide. The potassium compound is exemplified by potassium carbonate. The magnesium compound is exemplified by magnesia, dolomite and basic magnesium carbonate. The silicon compound is exemplified by silica and zeolite. The foregoing material may be employed solely or two or more materials may be mixed.

The soluble metal particles are exemplified by particles constituted by at least one material selected from a group comprising copper, nickel, iron, zinc, lead, gold, silver, aluminum, magnesium, potassium and silicon. The soluble metal particles may have surfaces coated with resin or the like in order to maintain an insulating characteristic.

When two or more types of the soluble particles are mixed, it is preferable that the combination of the two types of soluble particles is combination of resin particles and inorganic particles. Since each of the particles has low conductivity, an insulating characteristic with the resin film can be maintained. Moreover, the thermal expansion can easily be adjusted with the refractory resin. Thus, occurrence of a crack of the interlayer resin insulating layer constituted by the resin film can be prevented. Thus, separation between the interlayer resin insulating layer and the conductor circuit can be prevented.

The refractory resin is not limited when the resin is able to maintain the shape of the rough surface when the rough surface is formed on the interlayer resin insulating layer by using acid or oxidizer. The refractory resin is exemplified by thermosetting resin, thermoplastic resin and their composite material. As an alternative to this, the foregoing photosensitive resin of a type having photosensitive characteristic imparted thereto may be employed. When the photosensitive resin is employed, exposure and development processes of the interlayer resin insulating layers can be performed to form the openings for the via holes.

In particular, it is preferable that the resin containing thermosetting resin is employed. In the foregoing case, the shape of the rough surface can be maintained against plating solution and when a variety of heating processes are performed.

The refractory resin is exemplified by epoxy resin, phenol resin, phenoxy resin, polyimide resin, polyphenylene resin, polyolefin resin, polyetelslufon and fluorine resin. The foregoing material may be employed solely or two or more types of the materials may be mixed.

It is preferable that epoxy resin having two or more epoxy groups in one molecule thereof is employed. The reason for this lies in that the foregoing rough surface can be formed. Moreover, excellent heat resistance and the like can be obtained. Thus, concentration of stress onto the metal layer can be prevented even under a heat cycle condition. Thus, occurrence of separation of the metal layer can be prevented.

The epoxy resin is exemplified by cresol novolac epoxy resin, bisphenol-A epoxy resin, bisphenol-F epoxy resin, phenol novolac epoxy resin, alkylphenol novolac epoxy resin, biphenol-F epoxy resin, naphthalene epoxy resin, dicyclopentadiene epoxy resin, an epoxy material constituted by a condensation material of phenol and an aromatic aldehyde having a phenol hydroxyl group, triglycidyl isocyanurate and alicyclic epoxy resin. The foregoing material may be employed solely or two or more material may be mixed. Thus, excellent heat resistance can be realized.

It is preferable that the soluble particles in the resin film according to the present invention are substantially uniformly dispersed in the refractory resin. The reason for this lies in that a rough surface having uniform pits and projections can be formed. When via holes and through holes are formed in the resin film, adhesiveness with the metal layer of the conductor circuit can be maintained. As an alternative to this, a resin film containing soluble particles in only the surface on which the rough surface is formed may be employed. Thus, the portions of the resin film except for the surface is not exposed to acid or the oxidizer. Therefore, the insulating characteristic between conductor circuits through the interlayer resin insulating layer can reliably be maintained.

It is preferable that the amount of the soluble particles which are dispersed in the refractory resin is 3 wt % to 40 wt % with respect to the resin film. When the amount of mixture of the soluble particles is lower than 3 wt %, the rough surface having required pits and projections cannot be formed. When the amount is higher than 40 wt %, deep portions of the resin film are undesirably dissolved when the soluble particles are dissolved by using acid or the oxidizer. Thus, the insulating characteristic between the conductor circuits through the interlayer resin insulating layer constituted by the resin film cannot be maintained. Thus, short circuit is sometimes is caused to occur.

It is preferable that the resin film contains a hardening agent and other components as well as the refractory resin.

The hardening agent is exemplified by an imidazole hardening agent, an amine hardening agent, a guanidine hardening agent, an epoxy adduct of each of the foregoing hardening agents, a microcapsule of each of the foregoing hardening agents and an organic phosphine compound, such as triphenylphosphine or tetraphenyl phosphonium tetraphenyl borate.

It is preferable that the content of the hardening agent is 0.05 wt % to 10 wt % with respect to the resin film. When the content is lower than 0.05 wt %, the resin film cannot sufficiently be hardened. Thus, introduction of acid and the oxidizer into the resin film occurs greatly. In the foregoing case, the insulating characteristic of the resin film sometimes deteriorates. When the content is higher than 10 wt %, an excessively large quantity of the hardening agent component sometimes denatures the composition of the resin. In the foregoing case, the reliability sometimes deteriorates.

The other components are exemplified by an inorganic compound which does not exert an influence on the formation of the rough surface and a filler constituted by resin. The inorganic compound is exemplified by silica, alumina and dolomite. The resin is exemplified by polyimide resin, polyacrylic resin, polyamideimide resin, polyphenylene resin, melanine resin and olefin resin. When any one of the foregoing fillers is contained, conformity of the thermal expansion coefficients can be established. Moreover, heat resistance and chemical resistance can be improved. As a result, the performance of the multilayer printed circuit board can be improved.

The resin film may contain solvent. The solvent is exemplified by ketone, such as acetone, methylethylketone or cyclohexane; aromatic hydrocarbon, such as ethyl acetate, butyl acetate, cellosolve acetate, toluene or xylene. The foregoing material may be employed solely or two or more materials may be mixed. It is noted, however, interlayer resin insulating layer is resolved and carbonated if heated at a temperature of 350° C. or higher.

[First Modification of First Embodiment]

Next, description will be given to a multilayer printed circuit board according to the first modification of the first embodiment with reference to FIG. 16.

In the first embodiment stated above, description has been given to a case where the BGA's are arranged. In the first modification, which is almost the same as the first embodiment, the multilayer printed circuit board is constituted in a PGA type for establishing connection through conductive connection pins 96 as shown in FIG. 16. Also, via holes are formed by laser in the above-stated first embodiment, whereas via holes are formed by phptoetching in the first modification.

The method of manufacturing the multilayer printed circuit board according to the first modification will be described with reference to FIG. 15.

Figure 15A:
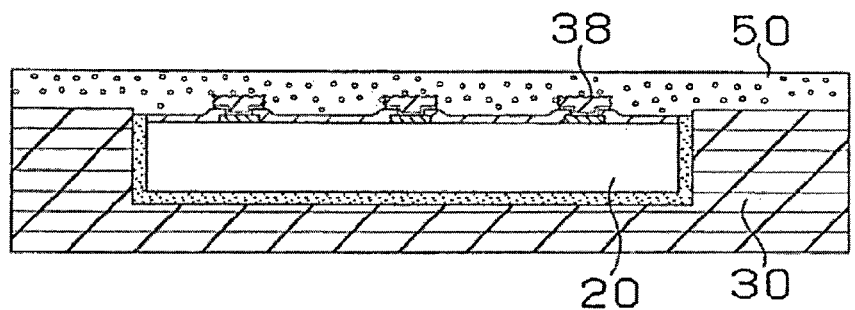
FIGS. 15(A), 15(B), 15(C) and 15(D) are manufacturing step views of a multilayer printed circuit board according to the first modification of the first embodiment.

(4) As in the case of the first embodiment, a thermosetting epoxy resin 50 having a thickness of 50 µm is applied to the substrate which has gone through the steps (1) to (3) (see FIG. 15(A)).

Figure 15B:
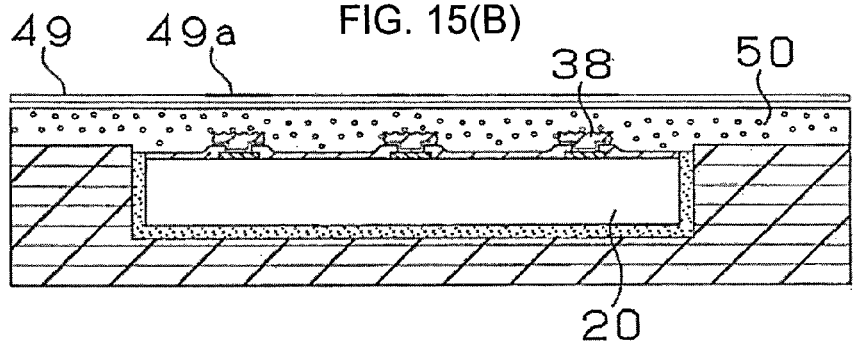

(5) Next, a photomask film 49 having black circles 49a corresponding to via hole formed positions drawn thereon is put on the interlayer resin insulating layer 50 and exposure is conducted (see FIG. 15(B)).

Figure 15C:
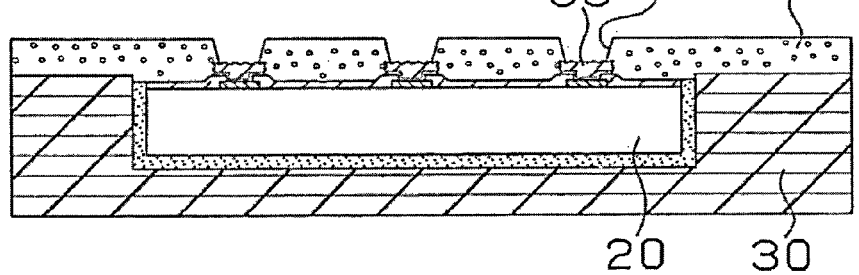

(6) Development is conducted by spraying a DMTG solution and a heat process is conducted, thereby providing an interlayer resin insulating layer 50 having openings 48 each having a diameter of 85 µm for via holes (see FIG. 15(C)).

Figure 15D:
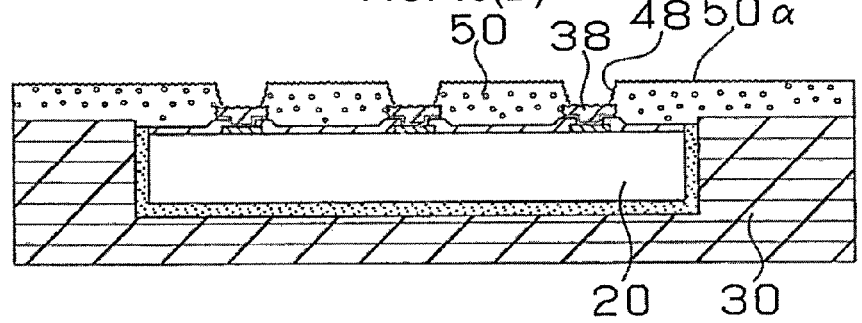

(7) The surface of the interlayer resin insulating layer 50 is roughened with a permanganic acid or a chromic acid, thereby forming a rough surface 50α (see FIG. 15(D)). Since following steps are the same as those in the first embodiment stated above, no description will be given thereto. The thickness of the rough surface 50α is preferably in the range of 0.05 to 5 µm.

The results of estimating the semiconductor devices in the above-stated embodiment and semiconductor devices in comparison examples while containing the devices in the multilayer printed circuit boards in the first embodiment and the first modification are shown in tables of FIGS. 17 and 18.

COMPARISON EXAMPLE 1

In comparison example 1, a semiconductor device is the same as that in the first embodiment. However, in the comparison example 1, no transition layers are formed and die pads are directly embedded into a multilayer printed circuit board.

COMPARISON EXAMPLE 2

In comparison example 2, stud bumps described in Japanese Patent Laid-Open No. 9-321408 are formed and embedded into a multilayer printed circuit board.

Estimation items are as follows:

(①) It is determined whether or not the die pads are discolored or dissolved by visual observation.

(②) It is examined whether or not via hole openings can be formed by examining whether openings each having a diameter of 60 µm can be formed by laser using the multilayer printed circuit board manufacturing method in the first embodiment or by examining whether openings each having a diameter of 85 µm can be formed by photoetching using the multilayer printed circuit board manufacturing method in the first modification.

(③) Connection resistances between die pads and via holes are measured.

In case of the semiconductor devices in the first to third modifications, appropriate results were obtained. In case of the comparison examples 1 and 2, however, there occurred problems such as via hole formation defects, connection defects or resistance value increase.

With the structure of the first embodiment, the IC chip and the printed circuit board can be connected to each other without using lead members. Due to this, resin sealing becomes unnecessary. Furthermore, since no defects resulting from the lead members and sealing resin occur, connection characteristic and reliability are improved. Besides, since the pads of the IC chip are directly connected to the conductive layers of the printed circuit board, it is possible to improve electrical characteristic.

Moreover, compared with the conventional IC chip mounting method, the wiring length from the IC chip to the substrate to the external substrate can be advantageously shortened and loop inductance can be advantageously reduced. Also, the degree of freedom for wiring formation increases to the extent that BGA's and PGA's can be provided.

[Second Embodiment]

The second embodiment of the present invention will be described hereinafter with reference to the drawings.

The constitution of a multilayer printed circuit board containing therein a semiconductor device (or an IC chip) 20 in the second embodiment will be described.

Figure 24:
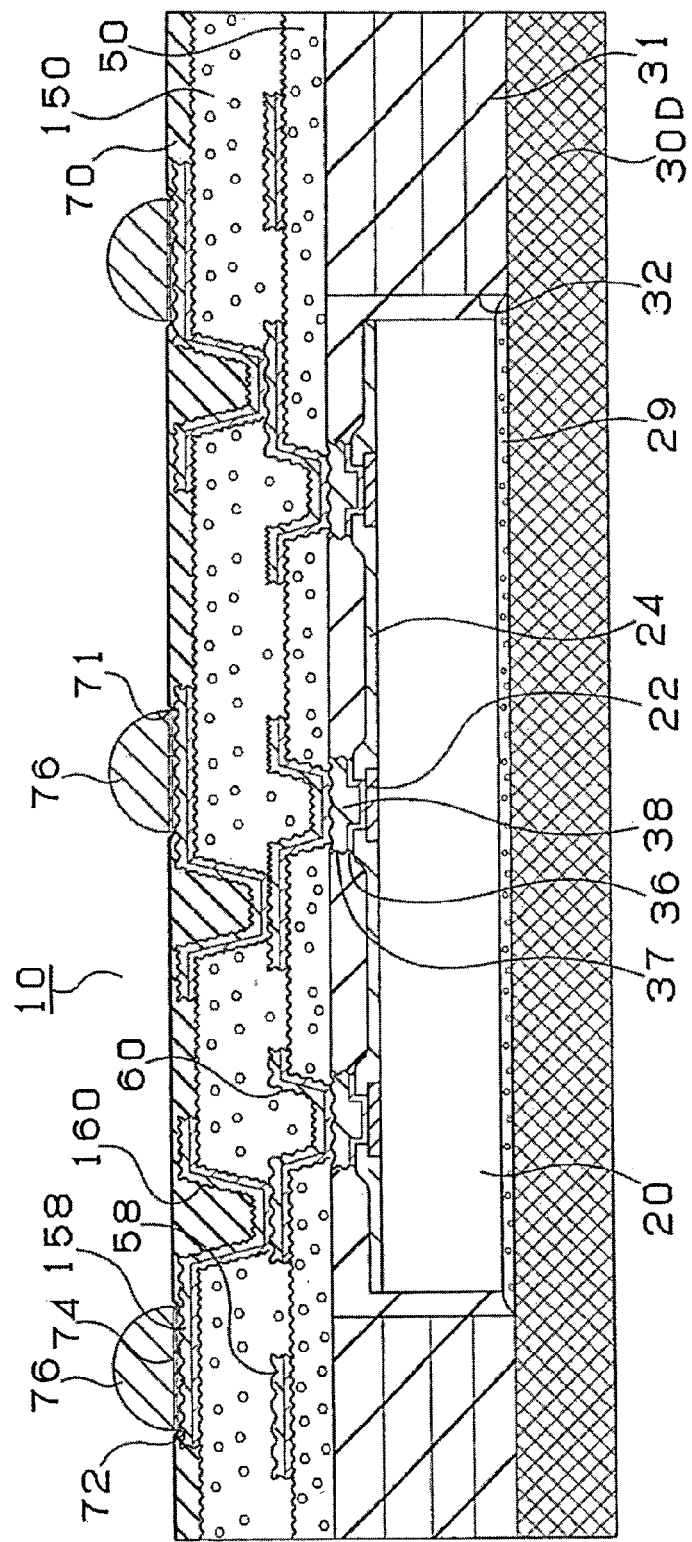
FIG. 24 is a cross-sectional view of the multilayer printed circuit board according to the second embodiment.

As shown in FIG. 24, the multilayer printed circuit board 10 comprises a heat sink 30D on which the IC chip 20 in the first embodiment stated above with reference to FIG. 3(B) is mounted, a core substrate 31 containing therein the IC chip 20, an interlayer resin insulating layer 50 and an interlayer resin insulating layer 150. Via holes 60 and conductor circuits 58 are formed on the interlayer resin insulating layer 50. Via holes 160 and conductor circuits 158 are formed on the interlayer resin insulating layer 150.

A solder resist layer 70 is provided on the interlayer resin insulating layer 150. Solder bumps 76 for connecting to an external substrate such as a daughter board or a mother board, which is not shown in FIG. 24, are provided on the conductor circuits 158 under the openings 71 of the solder resist layer 70, respectively.

The heat sink 30D is made of ceramic such as aluminum nitride, alumina or mullite, or metal such as aluminum alloy, copper or phosphor bronze. Here, the aluminum alloy having heat conductivity or a copper foil both sides of which have been subjected to a roughening process is appropriate. In this embodiment, the heat sink 30D is attached to the rear surface of the IC chip 20 embedded into the core substrate 31, thereby emitting heat generated in the IC chip 20, preventing the core substrate 31 and the interlayer resin insulating layers 50 and 150 formed on the core substrate 31 from warping and preventing the breakage of the via holes 60, 160 and the conductor circuits 58 and 158 on the interlayer resin insulating layers. Thus, the reliability of wirings enhances.

It is noted that the IC chip 20 is attached to the heat sink 30D by conductive adhesive 29. The conductive adhesive 29 has resin containing metallic powder such as copper, silver, gold or aluminum and has high heat conductivity, so that the heat generated in the IC chip 20 can be efficiently emitted toward the heat sink 30D. Here, the conductive adhesive is used to attach the IC chip 20 to the heat sink 30D; however, various adhesives are available as long as they have high heat conductivity.

In the multilayer printed circuit board 10 in this embodiment, the IC chip 20 is integrated into the core substrate 31 and transition layers 38 are provided on the respective pads 22 of the IC chip 20. Due to this, it is possible to electrically connect the IC chip to the multilayer printed circuit board (or package substrate) without using lead members and a sealing resin. Further, since the transition layers 38 are formed on the IC chip portion, the IC chip portion is flattened and the upper interlayer insulating layer 50 is, therefore, flattened to thereby provide uniform film thickness. Further, because of the transition layers, it is possible to maintain the stability of shape even if the via holes 60 provided in the upper layer are formed.

Furthermore, by providing the transition layers 38 made of copper on the respective die pads 22, it is possible to prevent resin residues on the die pads 22 and to prevent the die pads 22 from being discolored or dissolved even after impregnating the multilayer printed circuit board in an acid, an oxidizer or an etching solution in a later step or conducting various annealing steps. Thus, connection characteristic between the die pads of the IC chip and the via holes and reliability can be improved. Furthermore, by interposing the transition layers 38 each having a diameter of 60 μm or more on the respective pads 22 each having a diameter of 40 μm, it is possible to ensure connecting the via holes each having a diameter of 60 μm.

Next, the method of manufacturing the multilayer printed circuit board described above with reference to FIG. 24 will be described with reference to FIGS. 19 to 23.

Figure 19A:
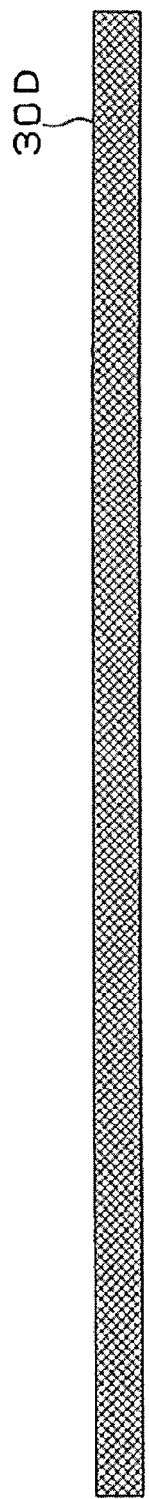
FIGS. 19(A), 19(B) and 19(C) are manufacturing step views of a multilayer printed circuit board according to the second embodiment of the present invention.
Figure 19B:
Figure 19C:
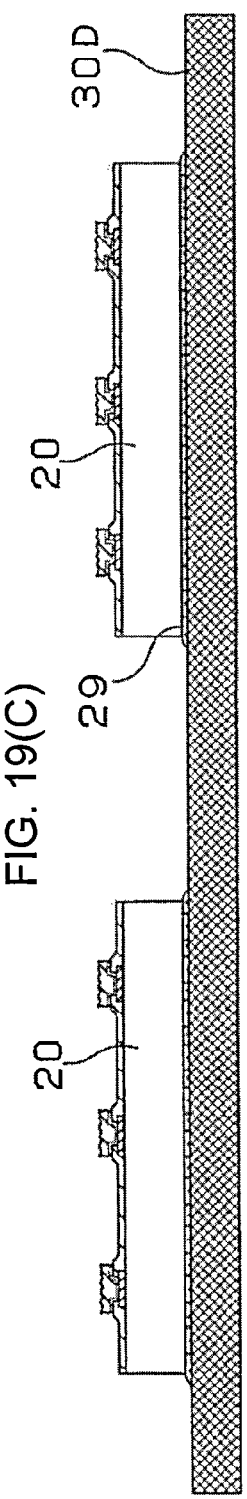

(1) A conductive adhesive 29 is applied onto a plate-shaped heat sink 30D (see FIG. 19(A)) made of ceramic such as aluminum nitride, alumina or mullite, or aluminum alloy, phosphor bronze or the like (see FIG. 19(B)). The conductive adhesive is formed to have a thickness of 10 to 20 μm using paste containing copper particles having a mean particle diameter of 2 to 5 μm.

(2) IC chips 20 in the first embodiment, the first, second or third modification of the first embodiment described above are mounted on the heat sink 30D (see FIG. 19(C)).

(3) Next, the heat sink 30D to which the IC chips 20 have been attached is mounted on a stainless (SUS) press plate 100A. A prepreg buildup body 31α having a thickness of 0.5 mm and constituted by building up uncured prepregs each having a core material such as glass cloths or the like and impregnated with a resin such as a BT (Bismaleimide-Triazine) resin or epoxy, is mounted on the heat sink 30D (see FIG. 20(A)). Through holes 32 are provided in the prepreg buildup body 31α at the positions of the IC chips 20 in advance. While prepregs each having a core material impregnated with a resin are employed herein, it is also possible to employ a resin substrate without a core material. Alternatively, a sheet having a core material impregnated with various thermosetting resins or a thermosetting resin and a thermoplastic resin can be used instead of the prepregs.

(4) The above-stated buildup body is pressurized from vertical direction by the stainless (SUS) press plates 100A and 100B. At this moment, an epoxy resin 31β is exuded from the prepregs 31α, filled into the spaces between the through holes 32 and the IC chips 20 and covers the upper surfaces of IC chips 20. As a result, the upper surfaces of the IC chips 20 and the prepreg buildup body 31α are completely flattened (see FIG. 20(B)). Due to this, when forming buildup layers in a step to be described later, via holes and wirings can be appropriately formed and the wiring reliability of the multilayer printed circuit board can be thereby improved.

(5) Thereafter, heat is applied to cure the epoxy resin of the prepregs, thereby forming a core substrate 31 containing therein the IC chips 20 (see FIG. 20(C)).

(6) A thermosetting resin sheet having a thickness of 50 μm is vacuum-compression laminated onto the substrate which has gone through the above-stated steps at a pressure of 5 kg/cm² while raising temperature to 50 to 150° C., thereby providing an interlayer resin insulating layer 50 made of an epoxy resin (see FIG. 21(A)). The degree of vacuum at the time of vacuum compression is 10 mmHg.

(7) Next, using $CO_2$ gas laser having a wavelength of 10.4 μm, via hole openings 48 each having a diameter of 60 μm are provided in the interlayer resin insulating layer 50 under the conditions of a beam diameter of 5 mm, a top hat mode, a pulse width of 5.0 microseconds, a mask hole diameter of 0.5 mm and one shot (see FIG. 21(B)). Using a chromic acid or a permanganic acid, resin residues in the openings 48 are removed. By providing a transition layer 38 made of copper on each die pad 22, it is possible to prevent resin residues on the pad 22, thereby improving connection characteristic between the pad 22 and a via hole 60 to be described later and improving reliability. Furthermore, by interposing the transition layer 38 having a diameter of 60 μm or more on the die pad 22 having a diameter of 40 μm, it is possible to ensure connecting the via hole opening 48 having a diameter of 60 μm. While the resin residues are removed by using an oxidizer such as a chromic acid, a de-smear process can be also conducted using oxygen plasma.

(8) Next, the surface of the interlayer resin insulating layer 50 is roughened with a permanganic acid, thereby forming a rough surface 50α (see FIG. 21(C)).

(9) Next, an electroless plated film 52 is provided on the interlayer resin insulating layer 50 on which the rough surface 50α has been formed (see FIG. 22(A)). Copper or nickel can be used for electroless plating. The thickness of the electroless plated film is preferably in the range of 0.3 μm to 1.2 μm. If the thickness is less than 0.3 μm, a metallic film cannot be formed on the interlayer resin insulating layer. If the thickness exceeds 1.2 μm, a metallic film is left as a result of etching, easily causing short-circuit among conductors. The plated film is formed with the same plating solution as that in the first embodiment under the same plating conditions as those in the first embodiment.

Alternatively, an Ni/Cu metallic alloy 52 is formed on the surface of the interlayer resin insulating layer 50 by conducting sputtering with the Ni—Cu alloy as a target under the conditions of an air pressure of 0.6 Pa, a temperature of 80° C., power of 200 W and a duration of 5 minutes with the same device as that used for the above-stated plasma process. At this time, the thickness of the formed Ni/Cu alloy layer 52 is 0.2 μm.

(10) A commercially available photosensitive dry film is bonded to the substrate 30 which has gone through the above processes, a photomask film is mounted, exposure is performed at 100 mj/cm² and then a development process is conducted with 0.8% sodium carbonate, thereby providing a plating resist 54 having a thickness of 20 μm. Next, electroplating is conducted under the same conditions as in the first embodiment to thereby form an electroplated film 56 having a thickness of 15 μm (see FIG. 22(B)). An additive in the electroplating solution is Kapalacid HL manufactured by Atotech Japan.

(11) After separating and removing the plating resist 54 with 5% NaOH, the plated film layer 52 under the plating resist is dissolved and removed by etching using a mixture solution of a nitric acid, a sulfuric acid and a hydrogen peroxide, conductor circuits 58 each comprising the plated film layer 52 and the electroplated film 56 and having a thickness of 16 μm and via holes 60 are formed and etched by an etching solution containing a cupric salt complex and an organic acid, thereby forming rough surfaces 58α and 60α (see FIG. 22(C)). In this embodiment, as stated above with reference to FIG. 20(C), the surface of the core substrate 31 is formed completely smoothly, so that the IC chips 20 can be appropriately connected to the transition layers 38 through the via holes 60. Due to this, the reliability of the multilayer printed circuit board can be improved.

(12) Next, the steps of (6) to (11) stated above are repeated, thereby forming an upper interlayer resin insulating layer 150 and conductor circuits 158 (including via holes 160) (see FIG. 23(A)).

(13) Then, the same solder resist composition (or organic resin insulating material) as that in the first embodiment is obtained.

(14) Next, the above-stated solder resist composition is applied to the substrate 30 to have a thickness of 20 μm and a drying process is conducted at 70° C. for 20 minutes and 70° C. for 30 minutes. Then, a photomask having a pattern of solder resist opening portions drawn thereon and a thickness of 5 mm is made hermetic contact with the solder resist layer 70, exposure is performed with ultraviolet rays with 1000 mj/cm$^2$ and then a development process is performed with a DMTG solution, thereby forming openings 71 each having a diameter of 200 μm (see FIG. 23(B)).

(15) Next, a nickel plated layer 72 having a thickness of 5 μm is formed on each opening portion 71 of the substrate on which the solder resist layer (or organic resin insulating layer) 70 has been formed. Further, a gold plated layer 74 having a thickness of 0.03 μm is formed on the nickel plated layer 72, thereby forming solder pads 75 on the respective conductor circuits 158 (see FIG. 23(C)).

(16) Thereafter, a solder paste is printed the solder paste on the opening portions 71 of the solder resist layer 70 and reflow is conducted at 200° C., thereby forming solder bumps 76. Finally, the heat sink 30D is divided into pieces by dicing or the like, thereby obtaining multilayer printed circuit boards 10 (see FIG. 24).

[First Modification of Second Embodiment]

Next, description will be given to a multilayer printed circuit board according to the first modification of the second embodiment with reference to FIG. 26.

In the second embodiment stated above, description has been given to a case where the BGA's are arranged. In the first modification, which is almost the same as the second embodiment, the multilayer printed circuit board is constituted in a PGA type for establishing connection through conductive connection pins 96 as shown in FIG. 26. Also, via holes are formed by laser in the above-stated second embodiment, whereas via holes are formed by phptoetching in the first modification.

The method of manufacturing the multilayer printed circuit board according to the first modification will be described with reference to FIG. 25.

(4) As in the case of the second embodiment, a thermosetting epoxy resin 50 having a thickness of 50 μm is applied to the substrate which has gone through the steps (1) to (3) stated above (see FIG. 25(A)).

(5) Next, a photomask film 49 having black circles 49a corresponding to via hole formed positions drawn thereon is put on the interlayer resin insulating layer 50 and exposure is conducted (see FIG. 25(B)).

(6) Development is conducted by spraying a DMTG solution and a heat process is conducted, thereby providing an interlayer resin insulating layer 50 having openings 48 each having a diameter of 85 μm for via holes (see FIG. 25(C)).

(7) The surface of the interlayer resin insulating layer 50 is roughened with a permanganic acid or a chromic acid, thereby forming a rough surface 50α (see FIG. 25(D)). Since following steps are the same as those in the second embodiment stated above, no description will be given thereto.

[Second Modification of Second Embodiment]

Next, the method of a multilayer printed circuit board according to the second modification of the second embodiment will be described.

In the first modification stated above, the core substrate is formed out of prepregs. In the second modification, by contrast, a resin substrate obtained by curing prepregs is fixed to a heat sink 30D by prepregs.

The method of a multilayer printed circuit board according to the second modification will be described with reference to FIG. 27.

(1) IC chips 20 are attached to a heat sink 30D made of a copper foil which both sides are roughened through conductive adhesive 29 and the heat sink 30D is mounted on a stainless (SUS) press plate 100A. Then, uncured prepregs (0.2 mm) 31α each having a core material such as glass cloths or the like and impregnated with a resin such as a BT (Bismaleimide-Triazine) resin or epoxy, are mounted on the heat sink 30D. Further, resin substrates (0.4 mm) 31γ each having the above-stated prepregs built up and cured are mounted on the prepregs 31α (see FIG. 27(A)). Through holes 32 are provided in the prepregs 31α and the resin substrates 31γ in advance at the positions of the IC chips 20.

(2) The above-stated buildup body is pressurized from vertical direction by the stainless (SUS) press plates 100A and 100B. At this moment, an epoxy resin 31β is exuded from the prepregs 31α, filled into the spaces between the through holes 32 and the IC chips 20 and covers the upper surfaces of IC chips 20. As a result, the upper surfaces of the IC chips 20 and the resin substrates 31γ are completely flattened (see FIG. 27(B)). Due to this, when forming buildup layers in a step to be described later, via holes and wirings can be appropriately formed and the wiring reliability of the multilayer printed circuit board can be thereby improved.

(3) Thereafter, heat is applied to cure the epoxy resin of the prepregs, thereby forming a core substrate 31 containing therein the IC chips 20 (see FIG. 27(C)). Since following steps are the same as those in the second embodiment, no description will be given thereto.

In the second embodiment, the heat sink is attached to the rear surfaces of the IC chips embedded in the core substrate, thereby allow heat generated in the IC chip to be discharged. By doing so, it is possible to prevent the core substrate and interlayer resin insulating layers formed on the core substrate from warping, and prevent the breakage of the via holes and the conductor circuits on the interlayer resin insulating layers.

Furthermore, with the structure of the present invention, the IC chip can be connected to the printed circuit board without using lead members. Due to this, resin sealing becomes unnecessary. Also, since no defects resulting from the lead members and sealing resin occur, connection characteristic and reliability are improved. Besides, since the pads of the IC chip are directly connected to the conductive layers of the printed circuit board, it is possible to improve electrical characteristic.

Moreover, compared with the conventional IC chip mounting method, the wiring length from the IC chip to the substrate to the external substrate can be advantageously shortened and loop inductance can be advantageously reduced.

[Third Embodiment]

The third embodiment of the present invention will be described hereinafter with reference to the drawings.

Figure 33:
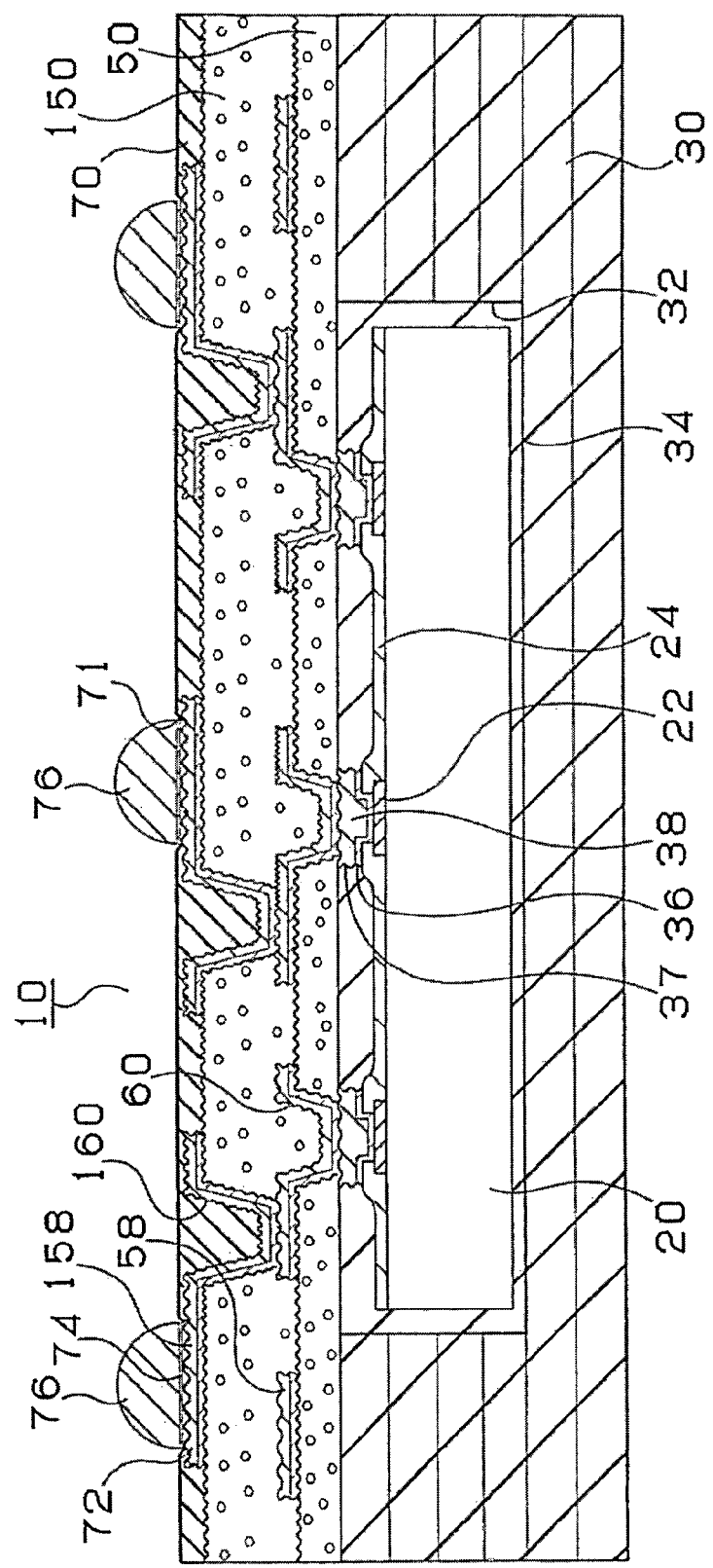
FIG. 33 is a cross-sectional view of the multilayer printed circuit board according to the third embodiment.

As shown in FIG. 33, a multilayer printed circuit board 10 in the third embodiment comprises a core substrate 30 containing therein an IC chip 20, an interlayer resin insulating layer 50 and an interlayer resin insulating layer 150. Via holes 60 and conductor circuits 58 are formed on the interlayer resin insulating layer 50. Via holes 160 and conductor circuits 158 are formed on the interlayer resin insulating layer 150.

A solder resist layer 70 is provided on the interlayer resin insulating layer 150. Solder bumps 76 for connecting to an external substrate, which is not shown, such as a daughter board or a mother board are provided on the conductor circuit 158 under the opening portions 71 of the solder resist layer 70.

In case of the multilayer printed circuit board 10 in the third embodiment, the IC chip 20 is integrated into a core substrate 30 and transition layers 38 are provided on the respective pads 22 of the IC chip 20. Due to this, it is possible to connect the IC chip to the multilayer printed circuit board (or package substrate) without using lead members and a sealing resin. Also, since the transition layers 38 are formed on the IC chip portion, the IC chip portion is flattened and the upper interlayer resin insulating layer 50 is flattened accordingly, thereby providing uniform film thickness. Further, the transition layers allow maintaining shape even if the upper via holes 60 are formed.

Moreover, by providing the transition layers 38 made of copper on the respective die pads 22, it is possible to prevent resin residues on the die pads 22 and to prevent the die pads 22 from being discolored or dissolved even after impregnating the multilayer printed circuit board in an acid, an oxidizer or an etching solution in a later step or conducting various annealing steps. Thus, connection characteristic between the die pads of the IC chip and the via holes and reliability can be improved. Furthermore, by interposing the transition layers 38 each having a diameter of 60 μm or more on the respective pads 22 each having a diameter of 40 μm, it is possible to ensure connecting the via holes each having a diameter of 60 μm.

Next, the method of manufacturing the multilayer printed circuit board according to the third embodiment described above with reference to FIG. 33 will be described with reference to FIGS. 28 to 32.

(1) An insulating resin substrate 30A, in which prepregs each having a core material made of glass cloths or the like and impregnated with a resin such as BT (Bismaleimide-Triazine) resin or epoxy are built up and cured, is used as a starting material. First, through holes 32 for containing therein IC chips are formed in the insulating resin substrate 30A (see FIG. 28(A)). While the resin substrate 30A having the core material impregnated with the resin is used herein, it is also possible to use a resin substrate without a core material.

(2) Thereafter, IC chips 20 according to the manufacturing method in the first embodiment stated above are contained in the through holes 32 of the insulating resin substrate 30A (see FIG. 28(B)).

(3) Then, the insulating resin substrate 30A containing therein the IC chips 20 and an insulating resin substrate (or core substrate) 30B, in which prepregs each having a core material made of glass cloths or the like and impregnated with a resin such as epoxy are built up and cured and which has a thickness of 0.2 mm, are built up while interposing uncured prepregs 30C (each having a thickness of 0.1 mm) each having a core material such as glass cloths or the like and impregnated with a resin such as an epoxy resin between the substrates 30A and 30C (see FIG. 28(C)). While the resin substrate 30B having the core material impregnated with the resin is used herein, it is also possible to use a resin substrate without a core material. Alternatively, instead of the prepregs, a sheet having a core material impregnated with various types of thermosetting resins or a combination of a thermosetting resin and a thermoplastic resin can be used.

(4) The above-stated buildup body is pressurized from vertical direction by stainless (SUS) press plates 100A and 100B. At this moment, an epoxy resin 31α is exuded from the prepregs 31C, filled into the spaces between the through holes 32 and the IC chips 20 and covers the upper surfaces of IC chips 20. As a result, the upper surfaces of the IC chips 20 and the insulating resin substrate are completely flattened (see FIG. 29(A)). Due to this, when forming buildup layers in a step to be described later, via holes and wirings can be appropriately formed and the wiring reliability of the multilayer printed circuit board can be thereby improved.

Figure 29A:
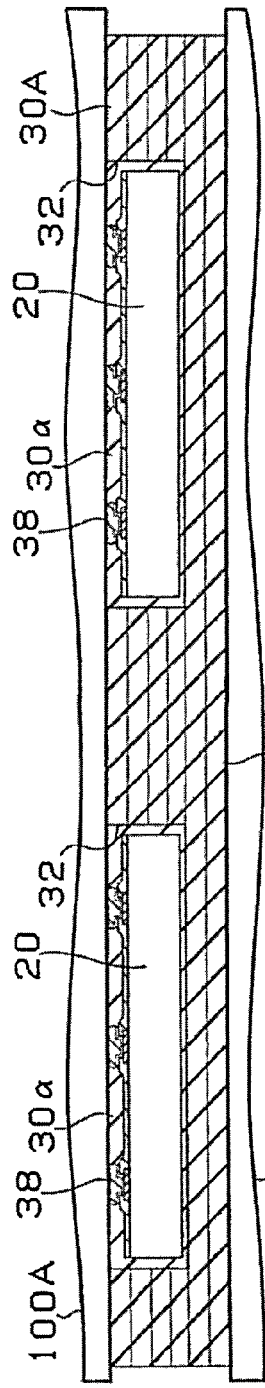
FIGS. 29(A), 29(B) and 29(C) are manufacturing step views of the multilayer printed circuit board according to the third embodiment.
Figure 29B:
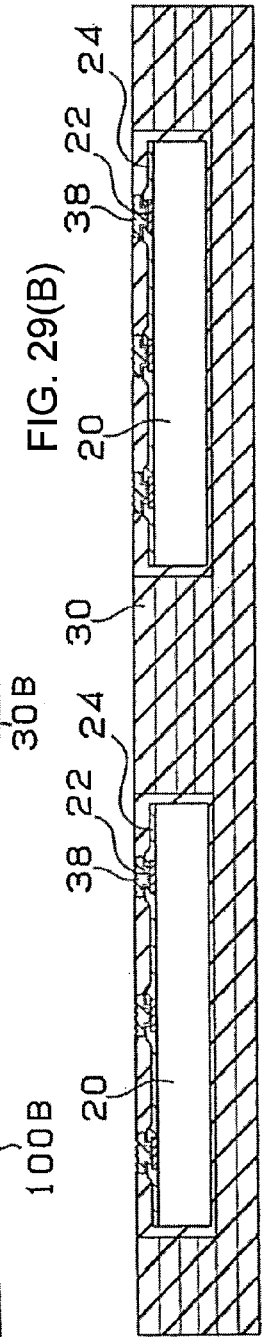

(5) Thereafter, heat is applied to cure the uncured epoxy resin 30a, thereby forming a core substrate 30 containing therein the IC chips 20 (see FIG. 29(B)).

Figure 29C:
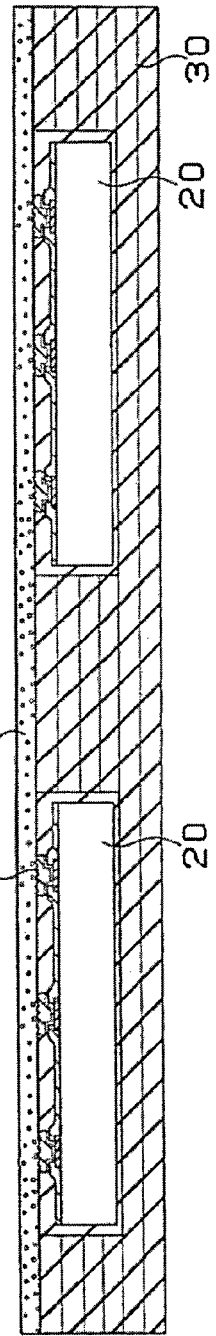
Figures 32A, 32B, 32C:
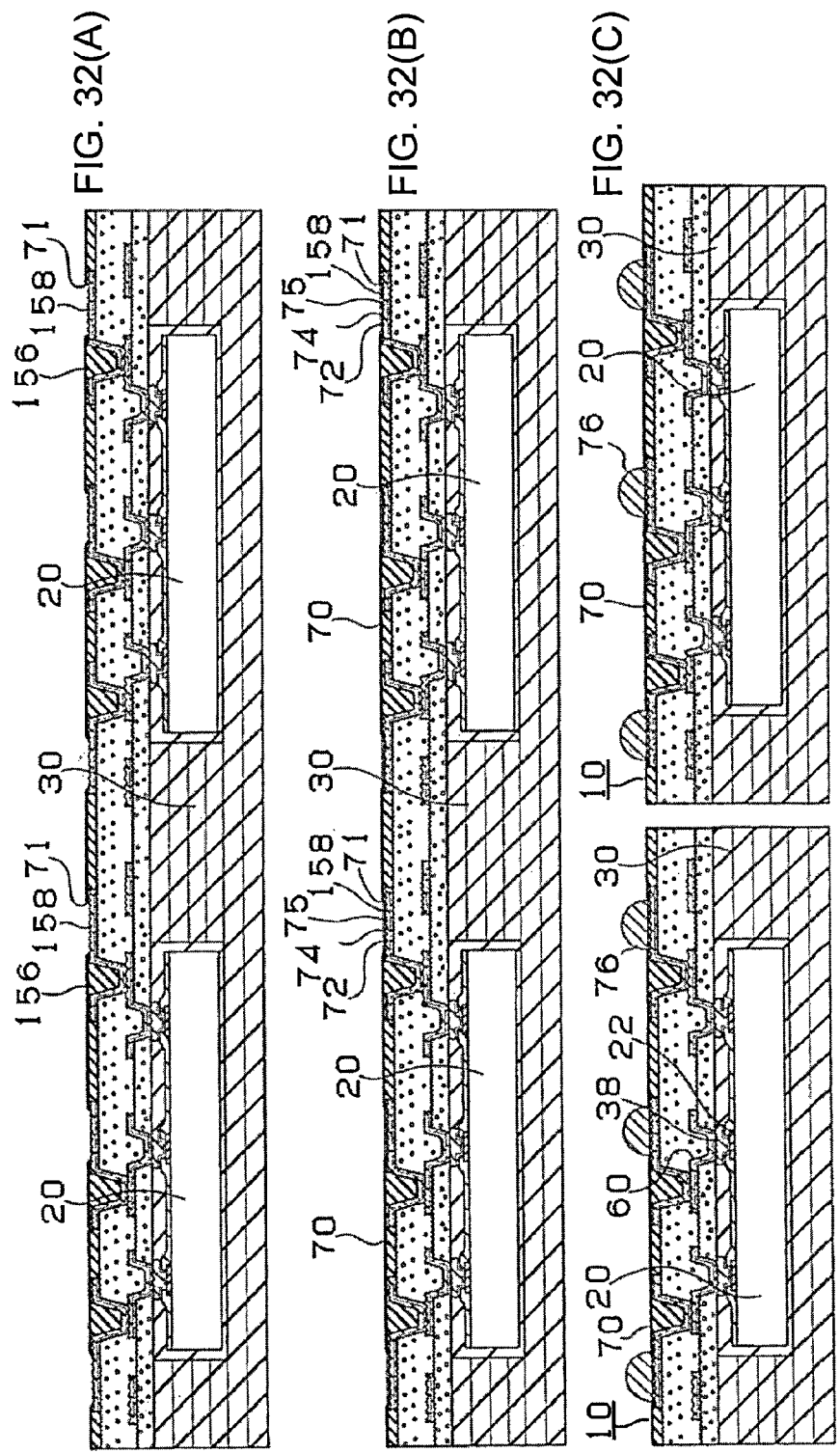
FIGS. 32(A), 32(B) and 32(C) are manufacturing step views of the multilayer printed circuit board according to the third embodiment.

(6) A thermosetting resin sheet having a thickness of 50 μm is vacuum-compression laminated onto the substrate which has gone through the above-stated steps at a pressure of 5 kg/cm$^2$ while raising temperature to 50 to 150° C., thereby providing an interlayer resin insulating layer 50 (see FIG. 29(C)). The degree of vacuum at the time of vacuum compression is 10 mmHg.

(7) Next, using $CO_2$ gas laser having a wavelength of 10.4 μm, via hole openings 48 each having a diameter of 60 μm are provided in the interlayer resin insulating layer 50 under the conditions of a beam diameter of 5 mm, a top hat mode, a pulse width of 5.0 microseconds, a mask hole diameter of 0.5 mm and one shot (see FIG. 30(A)). Using an oxidizer such as a chromic acid or a permanganic acid, resin residues in the openings 48 are removed. By providing a transition layer 38 made of copper on each die pad 22, it is possible to prevent resin residues on the pad 22, thereby improving connection characteristic between the pad 22 and a via hole 60 to be described later and improving reliability. Furthermore, by interposing the transition layer 38 having a diameter of 60 μm or more on the die pad 22 having a diameter of 40 μm, it is possible to ensure connecting the via hole opening 48 having a diameter of 60 μm. While the resin residues are removed by using the oxidizer herein, a de-smear process can be also conducted using oxygen plasma.

(8) Next, the surface of the interlayer resin insulating layer 50 is roughened with a permanganic acid, thereby forming a rough surface 50a (see FIG. 30(B)).

(9) Next, an electroless plated film 52 is provided on the interlayer resin insulating layer 50 on which the rough surface 50a has been formed (see FIG. 30(C)). Copper or nickel can be used for electroless plating. The thickness of the electroless plated film is preferably in the range of 0.3 μm to 1.2 μm. If the thickness is less than 0.3 μm, a metallic film cannot be formed on the interlayer resin insulating layer. If the thickness exceeds 1.2 μm, a metallic film is left as a result of etching, easily causing short-circuit among conductors. The plated film is formed with the same plating solution as that in the first embodiment under the same plating conditions as those in the first embodiment.

Alternatively, an Ni/Cu metallic alloy 52 is formed on the surface of the interlayer resin insulating layer 50 by conducting sputtering with the Ni—Cu alloy as a target under the conditions of an air pressure of 0.6 Pa, a temperature of 80° C., power of 200 W and a duration of 5 minutes with the same device as that used for the above-stated plasma process. At this time, the thickness of the formed Ni/Cu alloy layer 52 is 0.2 μm.

(10) A commercially available photosensitive dry film is bonded to the substrate 30 which has gone through the above processing steps, a photomask film is mounted, exposure is performed at 100 mj/cm² and then a development process is conducted with 0.8% sodium carbonate, thereby providing a plating resist 54 having a thickness of 20 μm. Next, electroplating is conducted under the same conditions as those in the first embodiment to thereby form an electroplated film 56 having a thickness of 15 μm. (see FIG. 31(A)).

(11) After separating and removing the plating resist 54 with 5% NaOH, the plated film layer 52 under the plating resist is dissolved and removed by etching using a mixture solution of a nitric acid, a sulfuric acid and a hydrogen peroxide, conductor circuits 58 each comprising the plated film layer 52 and the electroplated film 56 and having a thickness of 16 μm and via holes 60 are formed and etched by an etching solution containing a cupric salt complex and an organic acid, thereby forming rough surfaces 58α and 60α (see FIG. 31(B)). In this embodiment, as stated above with reference to FIG. 29(A), the surface of the core substrate 30 is formed completely smoothly, so that the IC chips 20 can be appropriately connected to the transition layers 38 through the via holes 60. Due to this, the reliability of the multilayer printed circuit board can be improved.

(12) Next, the steps of (6) to (11) stated above are repeated, thereby forming an upper interlayer resin insulating layer 150 and conductor circuits 158 (including via holes 160) (see FIG. 31(C)).

(13) Then, a solder resist composition (or organic resin insulating material) prepared in the same manner as that in the first embodiment is obtained.

(14) Next, the above-stated solder resist composition is applied to the substrate 30 to have a thickness of 20 μm and a drying process is conducted at 70° C. for 20 minutes and 70° C. for 30 minutes. Then, a photomask having a pattern of solder resist opening portions drawn thereon and a thickness of 5 mm is made hermetic contact with the solder resist layer 70, exposure is performed with ultraviolet rays with 1000 mj/cm² and then a development process is performed with a DMTG solution, thereby forming openings 71 each having a diameter of 200 μm (see FIG. 32(A)).

(15) Next, a nickel plated layer 72 having a thickness of 5 μm is formed on each opening portion 71 of the substrate on which the solder resist layer (or organic resin insulating layer) 70 has been formed. Further, a gold plated layer 74 having a thickness of 0.03 μm is formed on the nickel plated layer 72, thereby forming solder pads 75 on the respective conductor circuits 158 (see FIG. 32(B)).

(16) Thereafter, a solder paste is printed on the opening portions 71 of the solder resist layer 70 and reflow is conducted at 200° C., thereby forming solder bumps 76. The resultant substrate is divided into pieces by dicing or the like, thereby obtaining a plurality of pieces of multilayer printed circuit boards 10 (see FIG. 32(C)). While the multilayer printed circuit board is halved for the convenience of description in FIG. 32(C), many IC chip-integrated multilayer printed circuit boards are simultaneously manufactured by dividing the substrate into 16, 32, 64 pieces or the like.

In the third embodiment, the steps of FIG. 28(A) to FIG. 32(B) stated above, a multilayer printed circuit board into which semiconductor devices are integrated is manufactured for obtaining multiple multilayer printed circuit boards. Then, as shown in FIG. 3(C), the multilayer printed circuit board is cut into pieces, thereby obtaining a plurality of multilayer printed circuit boards. Due to this, it is possible to efficiently manufacture highly reliable multilayer printed circuit boards 10 (see FIG. 33).

[First Other Example of Third Embodiment]

A multilayer printed circuit board according to the other example of the third embodiment will be described with reference to FIG. 35.

In the third embodiment stated above, description has been given to a case where the BGA's are arranged. In the first other example, which is almost the same as the third embodiment, the multilayer printed circuit board is constituted in a PGA type for establishing connection through conductive connection pins 96 as shown in FIG. 35. Also, via holes are formed by laser in the above-stated third embodiment, whereas via holes are formed by phptoetching in the first another example.

The method of manufacturing the multilayer printed circuit board according to the first other example will be described with reference to FIG. 34.

(4) As in the case of the third embodiment, a thermosetting epoxy resin 50 having a thickness of 50 μm is applied to the substrate which has gone through the steps (1) to (3) stated above (see FIG. 34(A)).

(5) Next, a photomask film 49 having black circles 49a corresponding to via hole formed positions drawn thereon is put on the interlayer resin insulating layer 50 and exposure is conducted (see FIG. 34(B)).

(6) Development is conducted by spraying a DMTG solution and a heat process is conducted, thereby providing an interlayer resin insulating layer 50 having openings 48 each having a diameter of 85 μm for via holes (see FIG. 34(C)).

(7) The surface of the interlayer resin insulating layer 50 is roughened with a permanganic acid or a chromic acid, thereby forming a rough surface 50α (see FIG. 34(D)). Since following steps are the same as those in the third embodiment stated above, no description will be given thereto.

[First Modification of Third Embodiment]

Next, the constitution of a multilayer printed circuit board containing therein a semiconductor device (or an IC chip) 20 in the first modification of the third embodiment will be described.

Figure 41:
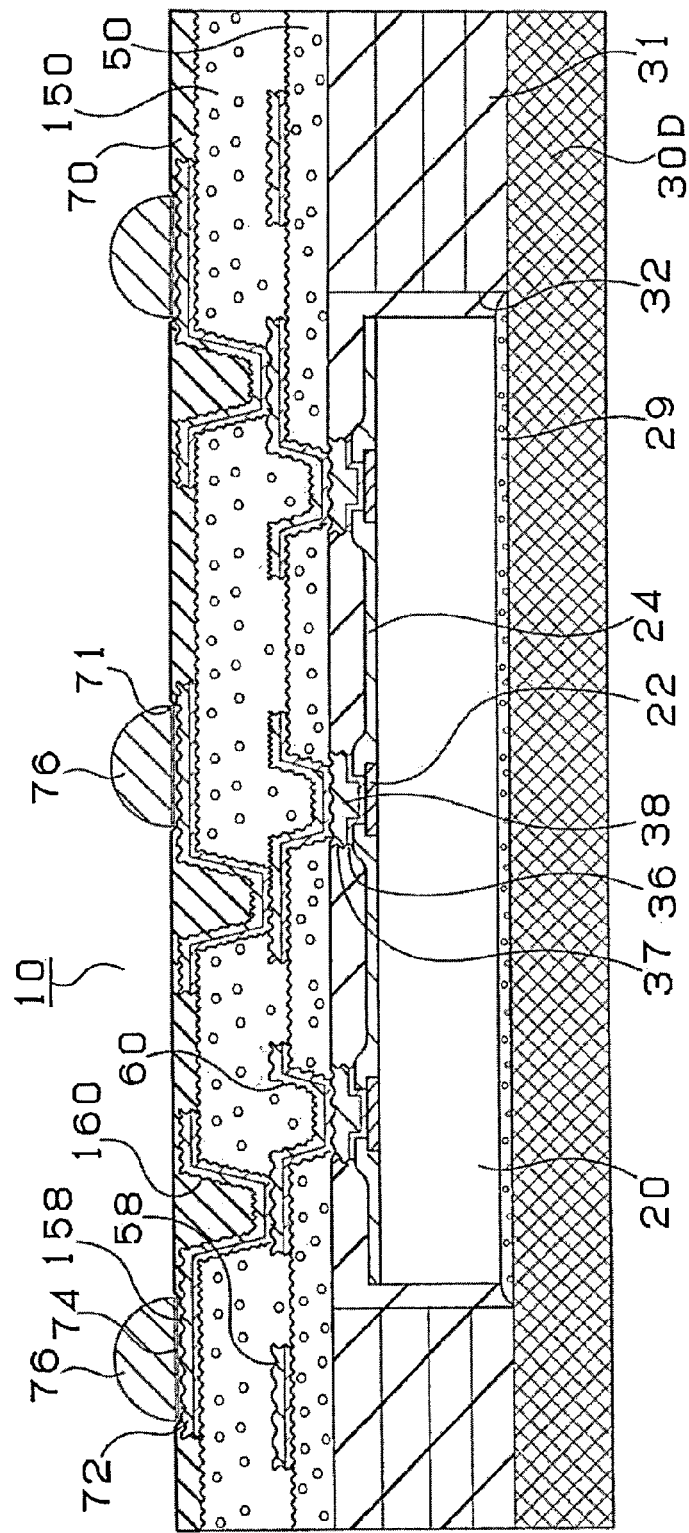
FIG. 41 is a cross-sectional view of the multilayer printed circuit board according to the first modification of the third embodiment.

In case of the multilayer printed circuit board 10 in the third embodiment described above with reference to FIG. 33, the IC chip is embedded into the core substrate. In the first modification, by contrast, as shown in FIG. 41, a heat sink 30D is attached to the rear surface of an IC chip 20. The multilayer printed circuit board 10 comprises the heat sink 30D, a core substrate 31 containing therein the IC chip 20, an interlayer resin insulating layer 50 and an interlayer resin insulating layer 150 above the IC chip 20. Via holes 60 and conductor circuits 58 are formed on the interlayer resin insulating layer 50. Via holes 160 and conductor circuits 158 are formed on the interlayer resin insulating layer 150.

A solder resist layer 70 is provided on the interlayer resin insulating layer 150. Solder bumps 76 for connecting to an external substrate such as a daughter board or a mother board, which is not shown, are provided on the conductor circuits 158 under the openings 71 of the solder resist layer 70, respectively.

The heat sink 30D is made of ceramic such as aluminum nitride, alumina or mullite, or metal such as aluminum alloy, copper or phosphor bronze. Here, the aluminum alloy having heat conductivity or a copper foil both sides of which have been subjected to a roughening process is appropriate. In this embodiment, the heat sink 30D is attached to the rear surface of the IC chip 20 embedded into the core substrate 31, thereby emitting heat generated in the IC chip 20, preventing the core substrate 31 and the interlayer resin insulating layers 50 and 150 formed on the core substrate 31 from warping and preventing the breakage of the via holes 60, 160 and the conductor circuits 58 and 158 on the interlayer resin insulating layers. Thus, the reliability of wirings enhances.

It is noted that the IC chip 20 is attached to the heat sink 30D by conductive adhesive 29. The conductive adhesive 29 has resin containing metallic powder such as copper, silver, gold or aluminum and has high heat conductivity, so that the heat generated in the IC chip 20 can be efficiently emitted toward the heat sink 30D. Here, the conductive adhesive is used to attach the IC chip 20 to the heat sink 30D; however, various adhesives are available as long as they have high heat conductivity.

In the multilayer printed circuit board 10 in the first modification of the third embodiment, the IC chip 20 is integrated into the core substrate 30 and transition layers 38 are provided on the respective pads 22 of the IC chip 20. Due to this, it is possible to electrically connect the IC chip to the multilayer printed circuit board (or package substrate) without using lead members and a sealing resin. Further, since the transition layers 38 are formed on the IC chip portion, the IC chip portion is flattened and the upper interlayer insulating layer 50 is, therefore, flattened to thereby provide uniform film thickness. Further, because of the transition layers, it is possible to maintain the stability of shape even if the via holes 60 provided in the upper layer are formed.

Furthermore, by providing the transition layers 38 made of copper on the respective die pads 22, it is possible to prevent resin residues on the die pads 22 and to prevent the die pads 22 from being discolored or dissolved even after impregnating the multilayer printed circuit board in an acid, an oxidizer or an etching solution in a later step or conducting various annealing steps. Thus, connection characteristic between the die pads of the IC chip and the via holes and reliability can be improved. Furthermore, by interposing the transition layers 38 each having a diameter of 60 μm or more on the respective pads 22 each having a diameter of 40 μm, it is possible to ensure connecting the via holes each having a diameter of 60 μm.

Next, the method of manufacturing the multilayer printed circuit board described above with reference to FIG. 41 will be described with reference to FIGS. 36 to 40.

Figure 36A:
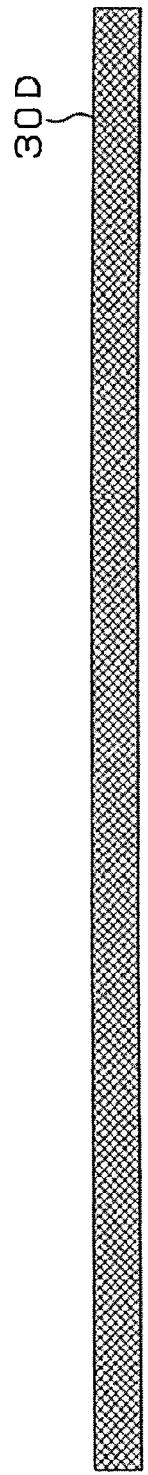
FIGS. 36(A), 36(B) and 36(C) are manufacturing step views of the multilayer printed circuit board according to the first modification of the third embodiment.
Figure 36B:
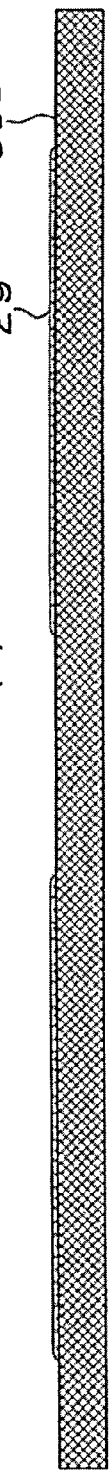

(1) A conductive adhesive 29 is applied onto a plate-shaped heat sink 30D (see FIG. 36(A)) made of ceramic such as aluminum nitride, alumina or mullite, or aluminum alloy, phosphor bronze or the like (see FIG. 36(B)). The conductive adhesive is formed to have a thickness of 10 to 20 μm using paste containing copper particles having a mean particle diameter of 2 to 5 μm.

Figure 36C:
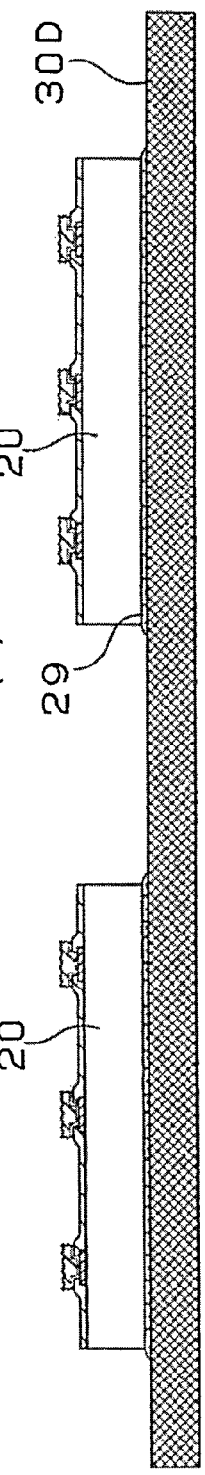

(2) IC chips 20 in the first to fourth manufacturing methods stated above with reference to FIG. 3(B) are mounted on the heat sink 30D (see FIG. 36(C)).

(3) Next, the heat sink 30D to which the IC chips 20 have been attached is mounted on a stainless (SUS) press plate 100A. A prepreg buildup body 31α having a thickness of 0.5 mm and constituted by building up uncured prepregs each having a core material such as glass cloths or the like and impregnated with a resin such as a BT (Bismaleimide-Triazine) resin or epoxy, is mounted on the heat sink 30D (see FIG. 37(A)). Through holes 32 are provided in the prepreg buildup body 31α at the positions of the IC chips 20 in advance. While prepregs each having a core material impregnated with a resin are employed herein, it is also possible to employ a resin substrate without a core material. Alternatively, a sheet having a core material impregnated with various thermosetting resins or a combination of a thermosetting resin and a thermoplastic resin can be used instead of the prepregs.

(4) The above-stated buildup body is pressurized from vertical direction by the stainless (SUS) press plates 100A and 100B. At this moment, an epoxy resin 31β is exuded from the prepregs 31α, filled into the spaces between the through holes 32 and the IC chips 20 and covers the upper surfaces of IC chips 20. As a result, the upper surfaces of the IC chips 20 and the prepreg buildup body 31α are completely flattened (see FIG. 37(B)). Due to this, when forming buildup layers in a step to be described later, via holes and wirings can be appropriately formed and the wiring reliability of the multilayer printed circuit board can be thereby improved.

(5) Thereafter, heat is applied to cure the epoxy resin of the prepregs, thereby forming a core substrate 31 containing therein the IC chips 20 (see FIG. 37(C)).

Figure 38A:
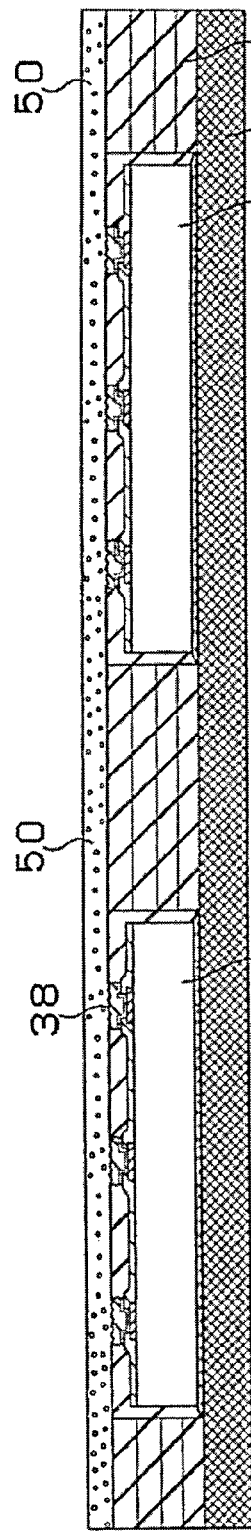

(6) A thermosetting resin sheet having a thickness of 50 μm is vacuum-compression laminated onto the substrate which has gone through the above-stated steps at a pressure of 5 kg/cm$^2$ while raising temperature to 50 to 150° C., thereby providing an interlayer resin insulating layer 50 (see FIG. 38(A)). The degree of vacuum at the time of vacuum compression is 10 mmHg.

Figure 38B:
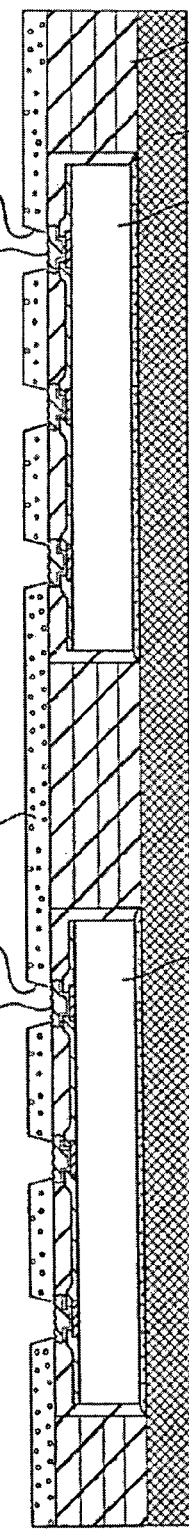

(7) Next, using $CO_2$ gas laser having a wavelength of 10.4 μm, via hole openings 48 each having a diameter of 60 μm are provided in the interlayer resin insulating layer 50 under the conditions of a beam diameter of 5 mm, a top hat mode, a pulse width of 5.0 microseconds, a mask hole diameter of 0.5 mm and one shot (see FIG. 38(B)). Using a chromic acid, resin residues in the openings 48 are removed. By providing a transition layer 38 made of copper on each die pad 22, it is possible to prevent resin residues on the pad 22, thereby improving connection characteristic between the pad 22 and a via hole 60 to be described later and improving reliability. Furthermore, by interposing the transition layer 38 having a diameter of 60 μm or more on the die pad 22 having a diameter of 40 μm, it is possible to ensure connecting the via hole opening 48 having a diameter of 60 μm. While the resin residues are removed by using a chromic acid, a de-smear process can be also conducted using oxygen plasma.

Figure 38C:
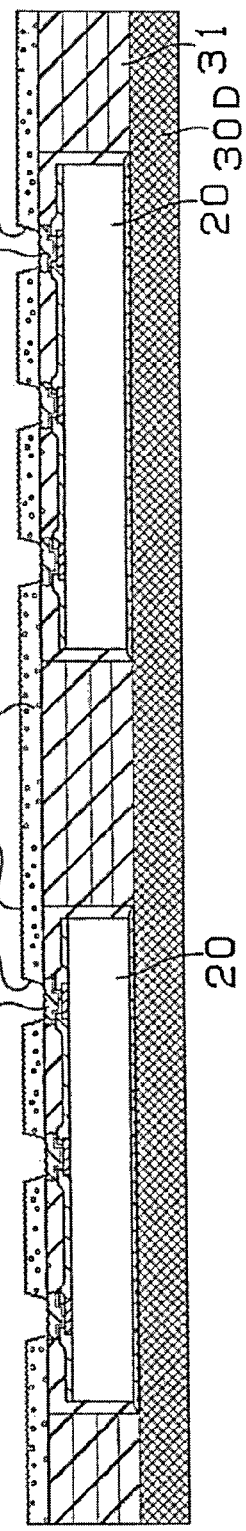

(8) Next, the surface of the interlayer resin insulating layer 50 is roughened with a permanganic acid, thereby forming a rough surface 50a (see FIG. 38(C)).

(9) Next, an electroless plated film 52 is provided on the interlayer resin insulating layer 50 on which the rough surface 50a has been formed (see FIG. 39(A)). Copper or nickel can be used for electroless plating. The thickness of the electroless plated film is preferably in the range of 0.3 μm to 1.2 μm. If the thickness is less than 0.3 μm, a metallic film cannot be formed on the interlayer resin insulating layer. If the thickness exceeds 1.2 μm, a metallic film is left as a result of etching, easily causing short-circuit among conductors. The plated film is formed with the same plating solution as that in the first embodiment under the same plating conditions as those in the first embodiment.

Alternatively, an Ni/Cu metallic alloy 52 is formed on the surface of the interlayer resin insulating layer 50 by conducting sputtering with the Ni—Cu alloy as a target using the same device as that used for the above-stated plasma process. At this time, the thickness of the formed Ni/Cu alloy layer 52 is 0.2 μm.

(10) A commercially available photosensitive dry film is bonded to the substrate 30 which has gone through the above processes, a photomask film is mounted, exposure is performed at 100 mj/cm² and then a development process is conducted with 0.8% sodium carbonate, thereby providing a plating resist 54 having a thickness of 20 μm. Next, electroplating is conducted to thereby form an electroplated film 56 having a thickness of 15 μm (see FIG. 39(B)).

(11) After separating and removing the plating resist 54 with 5% NaOH, the plated film layer 52 under the plating resist is dissolved and removed by etching using a mixture solution of a nitric acid, a sulfuric acid and a hydrogen peroxide, conductor circuits 58 each comprising the plated film layer 52 and the electroplated film 56 and having a thickness of 16 μm and via holes 60 are formed and etched by an etching solution containing a cupric salt complex and an organic acid, thereby forming rough surfaces 58α and 60α (see FIG. 39(C)). In the first modification of the third embodiment, as stated above with reference to FIG. 37(C), the surface of the core substrate 31 is formed completely smoothly, so that the IC chips 20 can be appropriately connected to the transition layers 38 through the via holes 60. Due to this, the reliability of the multilayer printed circuit board can be improved.

Figure 40A:
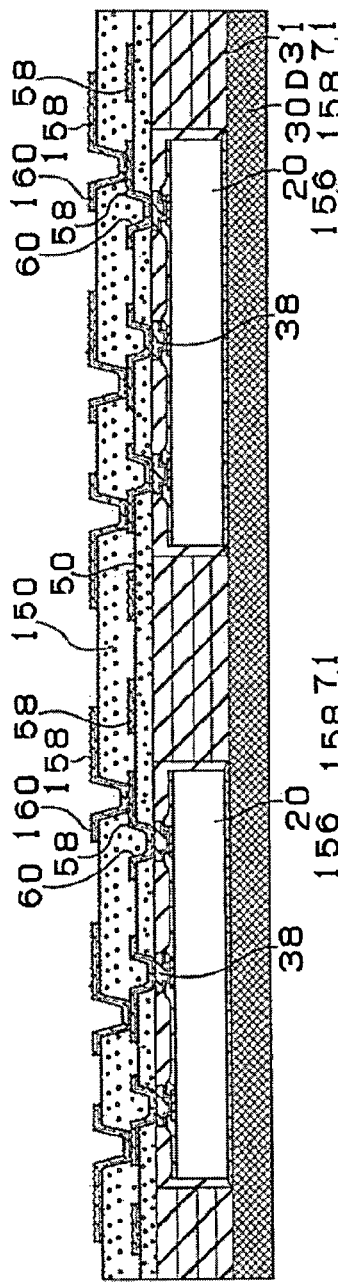
FIGS. 40(A), 40(B) and 40(C) are manufacturing step views of the multilayer printed circuit board according to the first modification of the third embodiment.
Figure 40B:
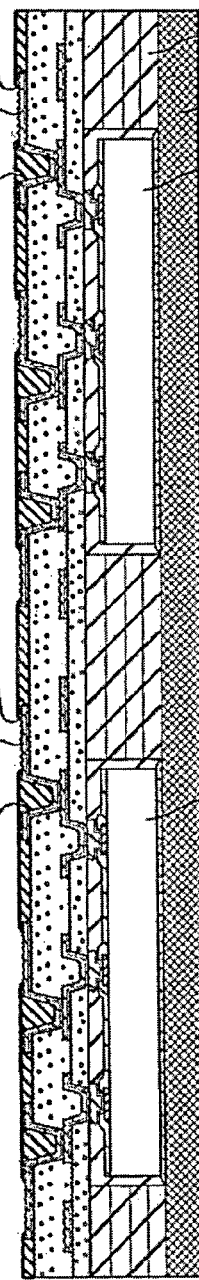
Figure 40C:
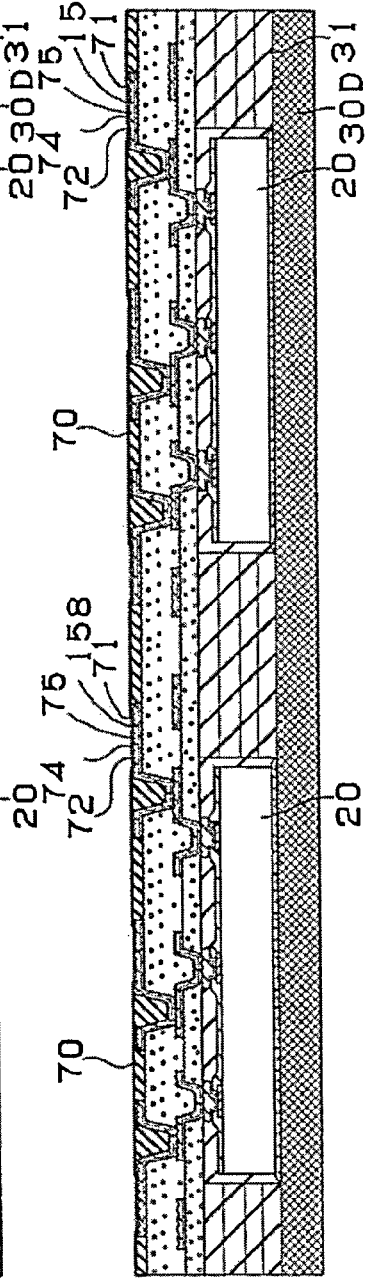

(12) Next, the steps of (6) to (11) stated above are repeated, thereby forming an upper interlayer resin insulating layer 150 and conductor circuits 158 (including via holes 160) (see FIG. 40(A)).

(13) Next, the same solder resist composition as that in the third embodiment is applied to the substrate 30 to have a thickness of 20 μm and a drying process is conducted at 70° C. for 20 minutes and 70° C. for 30 minutes. Then, a photomask having a pattern of solder resist opening portions drawn thereon and a thickness of 5 mm is made hermetic contact with the solder resist layer 70, exposure is performed with ultraviolet rays with 1000 mj/cm² and then a development process is performed with a DMTG solution, thereby forming openings 71 each having a diameter of 200 (see FIG. 40(B)).

(14) Next, the substrate on which the solder resist layer (or organic resin insulating layer) 70 has been formed is immersed in the same electroless nickel plating solution as that in the third embodiment for 20 minutes, thereby forming a nickel plated layer 72 having a thickness of 5 μm on each opening portion 71. Further, the substrate is immersed in the same electroless gold plating solution as that in the third embodiment to form a gold plated layer 74 having a thickness of 0.03 μm is formed on the nickel plated layer 72, thereby forming solder pads 75 on the respective conductor circuits 158 (see FIG. 40(C)).

(15) Thereafter, a solder paste is printed on the opening portions 71 of the solder resist layer 70 and reflow is conducted at 200° C., thereby forming solder bumps 76. Finally, the heat sink 30D is divided into pieces by dicing or the like, thereby obtaining multilayer printed circuit boards 10 (see FIG. 41).

[First Other Example of First Modification of Third Embodiment]

Figure 43:
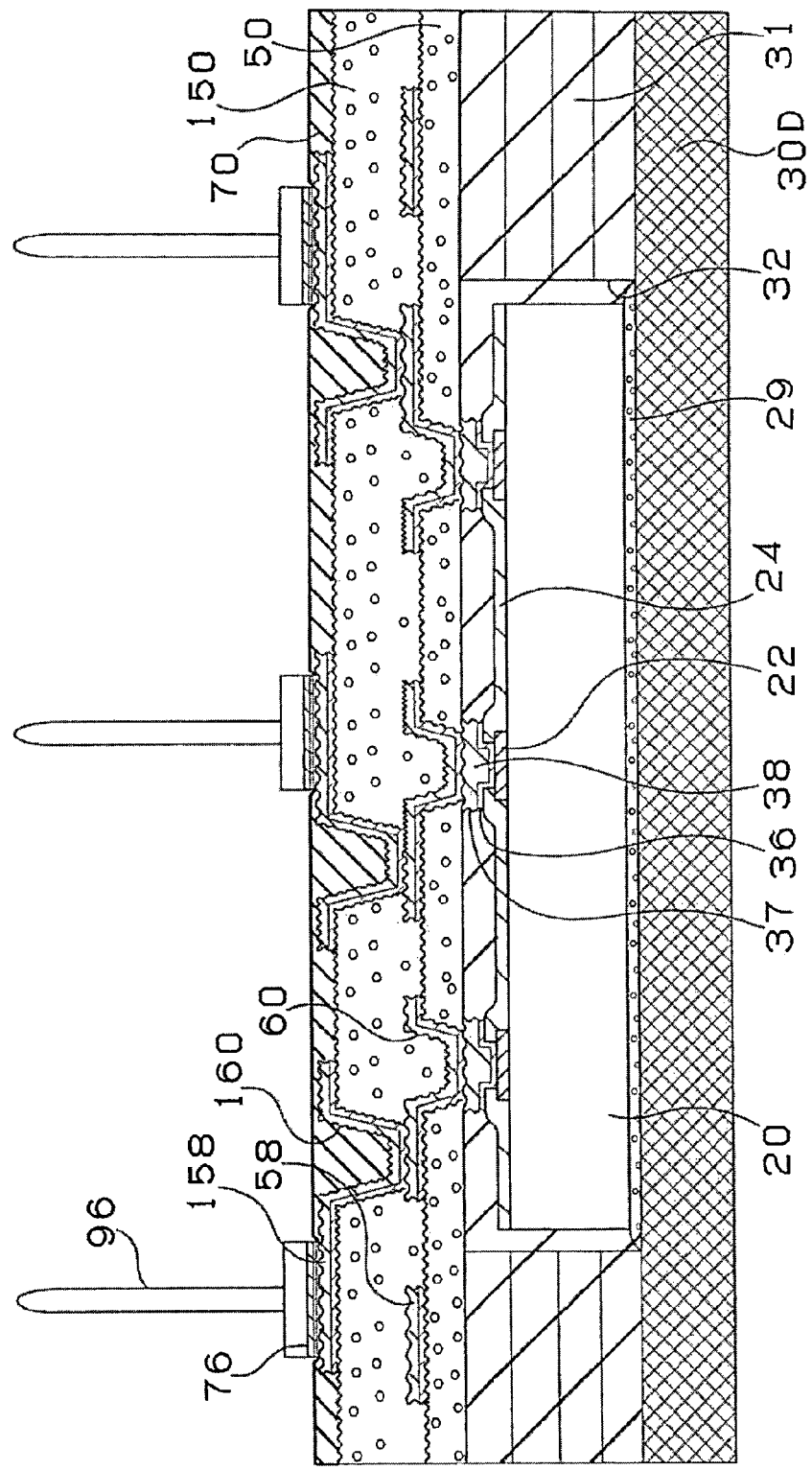
FIG. 43 is a cross-sectional view of a multilayer printed circuit board according to the first other example of the first modification.

Next, description will be given to a multilayer printed circuit board according to the first other example of the first modification of the third embodiment with reference to FIG. 43.

In the first modification stated above, description has been given to a case where the BGA's are arranged. In the first other example, which is almost the same as the first modification, the multilayer printed circuit board is constituted in a PGA type for establishing connection through conductive connection pins 96 as shown in FIG. 43. Also, via holes are formed by laser in the above-stated first embodiment, whereas via holes are formed by phptoetching in the first another example.

The method of manufacturing the multilayer printed circuit board according to the first other example will be described with reference to FIG. 42.

(4) As in the case of the first modification, a thermosetting epoxy resin 50 having a thickness of 50 μm is applied to the substrate which has gone through the steps (1) to (3) stated above (see FIG. 42(A)).

(5) Next, a photomask film 49 having black circles 49a corresponding to via hole formed positions drawn thereon is put on the interlayer resin insulating layer 50 and exposure is conducted (see FIG. 42(B)).

(6) Development is conducted by spraying a DMTG solution and a heat process is conducted, thereby providing an interlayer resin insulating layer 50 having openings 48 each having a diameter of 85 μm for via holes (see FIG. 42(C)).

(7) The surface of the interlayer resin insulating layer 50 is roughened with a permanganic acid or a chromic acid, thereby forming a rough surface 50α (see FIG. 42(D)). Since following steps are the same as those in the second embodiment stated above, no description will be given thereto.

[Second Other Example of First Modification of Third Embodiment]

Next, the method of a multilayer printed circuit board according to the second other example of the first modification of the third embodiment will be described.

In the first modification and the first other example stated above, the core substrate 30 is formed out of prepregs. In the second other example, by contrast, a resin substrate obtained by curing prepregs is fixed to a heat sink 30D by prepregs.

The method of a multilayer printed circuit board according to the second other will be described with reference to FIG. 44.

(1) IC chips 20 are attached to a heat sink 30D made of a copper foil which both sides are roughened through conductive adhesive 29 and the heat sink 30D is mounted on a stainless (SUS) press plate 100A. Then, uncured prepregs (0.2 mm) 31α each having a core material such as glass cloths or the like and impregnated with a resin such as a BT (Bismaleimide-Triazine) resin or epoxy, are mounted on the heat sink 30D. Further, resin substrates (0.4 mm) 31γ each having the above-stated prepregs built up and cured are mounted on the prepregs 31α (see FIG. 44(A)). Through holes 32 are provided in the prepregs 31α and the resin substrates 31γ in advance at the positions of the IC chips 20.

(2) The above-stated buildup body is pressurized from vertical direction by the stainless (SUS) press plates 100A and 100B. At this moment, an epoxy resin 31β is exuded from the prepregs 31α, filled into the spaces between the through holes 32 and the IC chips 20 and covers the upper surfaces of IC chips 20. As a result, the upper surfaces of the IC chips 20 and the resin substrates 31γ are completely flattened (see FIG. 44(B)). Due to this, when forming buildup layers in a step to be described later, via holes and wirings can be appropriately formed and the wiring reliability of the multilayer printed circuit board can be thereby improved.

(3) Thereafter, heat is applied to cure the epoxy resin of the prepregs, thereby forming a core substrate 31 containing therein the IC chips 20 (see FIG. 44(C)). Since following steps are the same as those in the second embodiment, no description will be given thereto.

[Second Modification of Third Embodiment]

Figure 50:
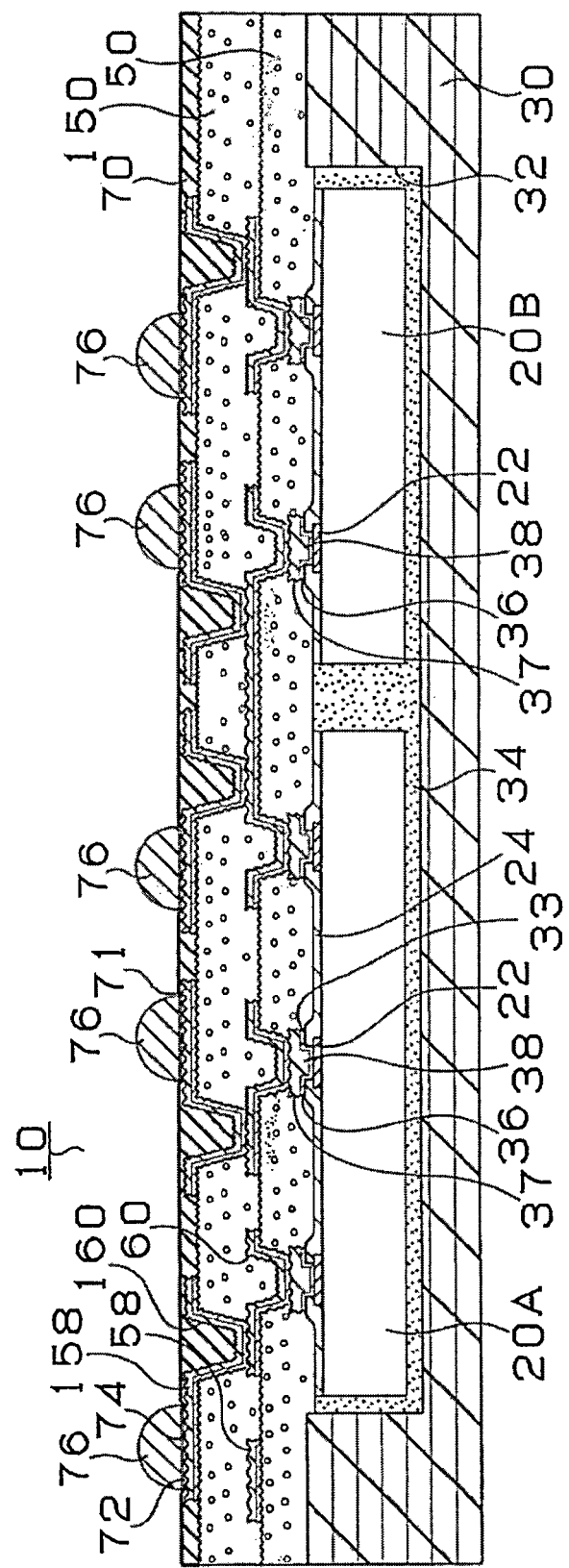
FIG. 50 is a cross-sectional view of the second modification of the third embodiment.

The constitution of a multilayer printed circuit board according to the second modification will be described with reference to FIG. 50 which shows the cross section of a multilayer printed circuit board 10.

In the first modification stated above, one IC chip is contained in the multilayer printed circuit board. The multilayer printed circuit board 10 according to the second modification as shown in FIG. 50, by contrast, contains an IC chip (or CPU) 20A and an IC chip (or a cache memory) 20B in a core substrate 30. Then, as in the case of the third embodiment, interlayer resin insulating layers 50 and 150 are formed on the core substrate 30. Via holes 60 and conductor circuits 58 are formed on the interlayer resin insulating layer 50. Via holes 160 and conductor circuits 158 are formed on the interlayer resin insulating layer 150.

The IC chips 20A and 20B are covered with a passivation film 24 and die pads 22 constituting input/output terminals are provided in the openings of the passivation film 24. Transition layers 38 are formed on the respective die pads 22 made of aluminum. Each transition layer 38 has a three-layer structure comprising the first thin film layer 33, the second thin film layer 36 and a thickening layer 37.

A solder resist layer 70 is provided on the interlayer resin insulating layer 150. Solder bumps 76 for connecting to an external substrate such as a daughter board or a mother board, which is not shown, are provided on the conductor circuits 158 under the openings 71 of the solder resist layer 70, respectively.

In the multilayer printed circuit board 10 in the second modification of the third embodiment, the IC chips 20A and 20B are integrated into a core substrate 30 in advance and the transition layers 38 are provided on the respective pads 22 of the IC chips 20A and 20B. Due to this, it is possible to electrically connect the IC chips to the multilayer printed circuit board (or package substrate) without using lead members and a sealing resin. Further, since the transition layers 38 are formed on the IC chip portions, the IC chip portions are flattened and an interlayer insulating layer 50 provided above the chips is, therefore, flattened to thereby provide uniform film thickness. Further, because of the transition layers, it is possible to maintain the stability of shape even if via holes 60 provided in the upper layer are formed.

Furthermore, by providing the transition layers 38 made of copper on the respective die pads 22, it is possible to prevent resin residues on the die pads 22 and to prevent the die pads 22 from being discolored or dissolved even after impregnating the multilayer printed circuit board in an acid, an oxidizer or an etching solution in a later step or conducting various annealing steps. Thus, connection characteristic between the die pads of the IC chips and the via holes and reliability can be improved. Besides, by interposing the transition layers 38 each having a diameter of 60 μm or more on the respective pads 22 each having a diameter of 40 μm, it is possible to ensure connecting the via holes each having a diameter of 60 μm.

In the second modification of the third embodiment, the IC chip 20A for a CPU and the IC chip 20B for a cache memory are separately embedded into the printed circuit board. Since the IC chips can be more economical if they are formed separately and the chips are located adjacent to each other, transmission delay or malfunction does not occur. Besides, even if the design of the printed circuit board is changed, there is no need to change the design of the IC chips themselves and the degree of freedom for formation can be increased.

An adhesive layer 34 is filled into the recess 32 of the printed circuit board in the second modification of the third embodiment. Thus, it is possible to couple the IC chips 20A and 20B in the recess 32 and the adhesive 34 can suppress the behaviors of the IC chips 20A and 20B and maintain smoothness even after a heat history during a heat cycle and via hole formation. Due to this, the connection portions between the IC chips and the via holes are not peeled or broken or the interlayer insulating layers 50 and 150 do not crack. It is also possible to improve reliability.

Next, the method of manufacturing the multilayer printed circuit board according to the second modification of the third embodiment stated above with reference to FIG. 50 will be described with reference to FIGS. 45 to 49. Here, in the first modification stated above, the transition layers 38 are formed on the IC chip and then the IC chip is contained in the core substrate. In the second modification, by contrast, the IC chips are contained in the core substrate and then the transition layers 38 are formed.

(1) First, an insulating resin substrate (or core substrate) 30 in which prepregs each having a core material made of glass cloths or the like and impregnated with a resin such as epoxy are built up, is used as a starting material (see FIG. 45(A)). Next, recesses 32 for containing IC chips are formed on one side of the core substrate 30 by counter boring (see FIG. 45(B)). While the recesses are provided by counter boring herein, it is also possible to or a core substrate having containing sections by laminating an insulating resin substrate having an opening portion and an insulating resin substrate without openings.

(2) Then, an adhesive material 34 is applied to the recesses 32 using a printing machine. At this time, potting instead of application may be conducted. Next, IC chips 20A and 20B are mounted on the adhesive material 34 (see FIG. 45(C)).

(3) Then, the upper surfaces of the IC chips 20A and 20B are depressed or struck to thereby completely contain the IC chips 20A and 20B in the respective recesses 32 (see FIG. 45(D)). By doing so, the core substrate 30 can be smoothed.

(4) Thereafter, the entire surface of the core substrate 30 which contains the IC chips 20A and 20B therein is subjected to deposition or sputtering to form the conductive, first thin film layer 33 on the entire surface (see FIG. 45(E)). A metal used may be nickel, zinc, chromium, cobalt, titanium, gold, tin or copper or the like. Nickel, chromium or titanium is more preferable because it is capable of suppressing the entry of moisture into an interface, appropriate for film formation and in electrical characteristic. The thickness of the first thin film layer 33 is preferably 0.001 to 2.0 μm, more preferably, 0.01 to 1.0 μm. In case of chromium, the thickness is preferably 0.1 μm.

Die pads 22 are covered with the first thin film layer 33, thereby making it possible to improve the adhesiveness of transition layers and the IC chips to the interfaces with the die pads 22. Also, by covering the die pad 22 with the metal, it is possible to prevent moisture from entering the interfaces, to prevent the dissolution and erosion of the die pads and to improve reliability. Further, the first thin film layer 33 allows the die pads to connect with the IC chips by a mounting method without using leads. Here, chromium or titanium is preferably used since it is possible to prevent the entry of moisture into the interfaces.

Figure 46A:
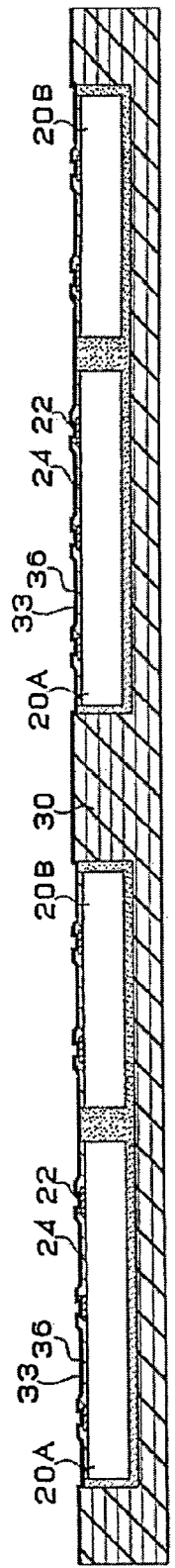
FIGS. 46(A), 46(B), 46(C) and 46(D) are manufacturing step views of the multilayer printed circuit board according to the second modification of the third embodiment.

(5) The second thin film layer 36 is formed on the first thin film layer 33 by sputtering, deposition or electroless plating (FIG. 46(A)). A metal used herein may be nickel, copper, gold or silver or the like. Copper is preferable in view of electrical characteristic, inexpensiveness and the fact that a buildup conductor layer to be formed in a later step mainly comprises copper.

The reason for providing the second thin film layer is that an electroplating lead for forming a thickening layer to be described later cannot be provided only with the first thin film layer. The second thin film layer 36 is used as a lead for thickening and preferably 0.01 to 5 µm in thickness. If the thickness is smaller than 0.01 µm, the second thin film layer cannot function as a lead. If the thickness exceeds 5 µm, the first thin film layer under the second thin film layer is cut more than the second thin film layer and gaps are generated between the first and second thin film layers during etching, thereby making the entry of moisture easier and deteriorating reliability. An optimum thickness is 0.1 to 3 µm.

Figure 46B:
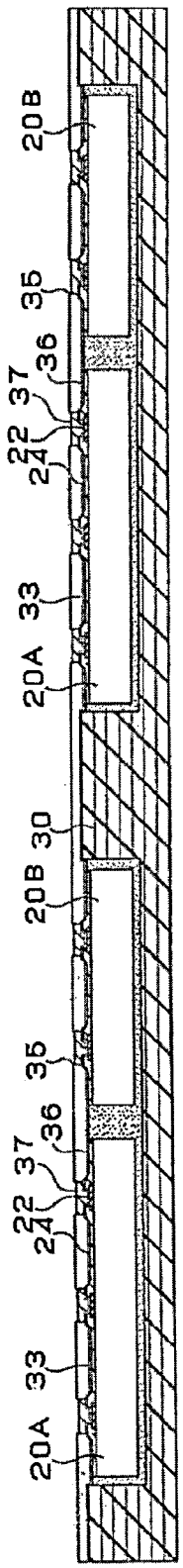

(6) Thereafter, a resist is applied, exposure and development are conducted to provide a plating resist 35 while providing openings on the upper portions of the respective die pads of the IC chips, and electroplating is conducted to thereby provide an electroplated film (or thickening film) 37 (see FIG. 46(B)). The thickening film can be formed out of nickel, copper, gold, silver, zinc or iron.

Figure 46C:
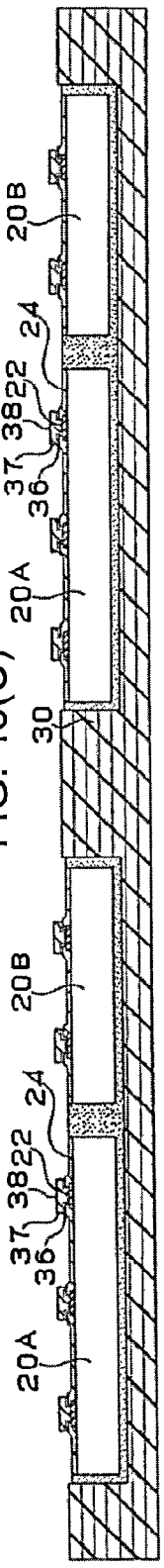

After removing the plating resist 35, the electroless plated, second thin film layer 36 and first thin film layer 33 under the plating resist 35 are etched away, thereby forming a transition layer 38 on each of the die pads 22 of the IC chips (FIG. 46(C)). While each transition layer is formed by the plating resist herein, the transition layer may be formed on each die pad by, after uniformly forming an electroplated film on the electroless plated, second thin film layer 36, forming an etching resist, conducting exposure and development to expose the metal other than that of the transition layer, and conducting etching. The thickness of the electroplated film is preferably in the range of 1 to 20 µm. If the thickness exceeds that range, undercut may possibly occur during the etching to generate gaps in the interface between the transition layer to be formed and the via hole.

Figure 46D:
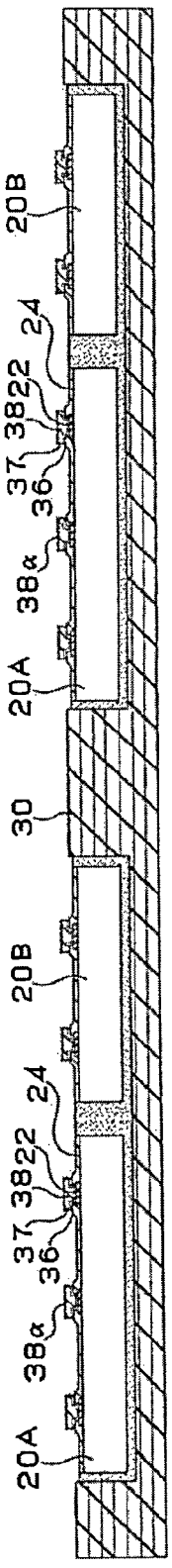

(7) Next, an etching solution is sprayed onto the substrate and the surfaces of the transition layers 38 are etched, thereby forming rough surfaces 38α (see FIG. 46(D)). The rough surfaces can be also formed by electroless plating or an oxidization-reduction process. Each transition layer 38 has a three-layer structure comprising the first thin film layer 33, the second thin film layer 36 and the thickening film 37.

Figure 47A:
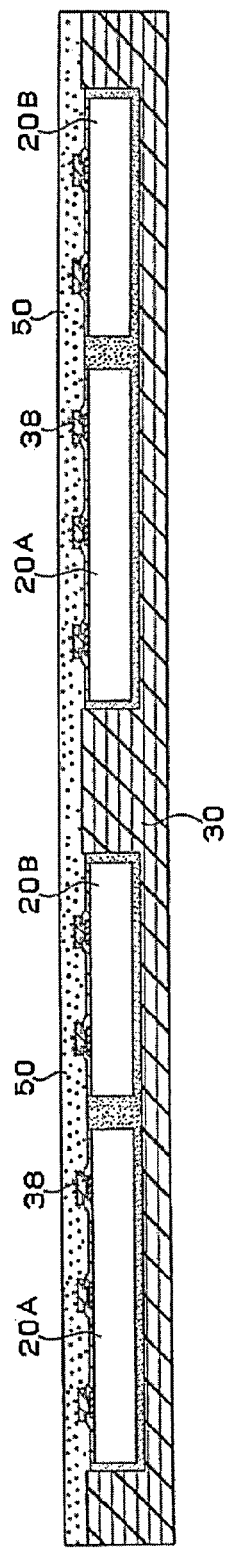
FIGS. 47(A), 47(B) and 47(C) are manufacturing step views of the multilayer printed circuit board according to the second modification of the third embodiment.

(8) A thermosetting epoxy type resin sheet having a thickness of 50 µm is vacuum-compression laminated onto the substrate which has gone through the above-stated steps at a pressure of 5 kg/cm$^2$ while raising temperature to 50 to 150° C., thereby providing an interlayer resin insulating layer 50 (see FIG. 47(A)). The degree of vacuum at the time of vacuum compression is 10 mmHg.

Figure 47B:
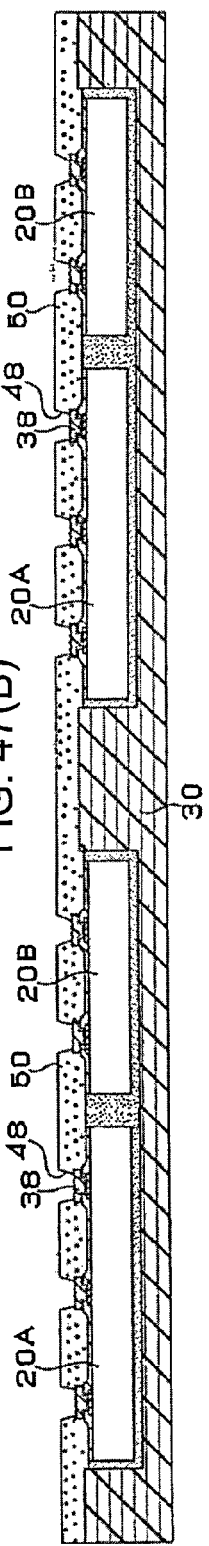

(9) Next, using CO$^2$ gas laser having a wavelength of 10.4 µm, via hole openings 48 each having a diameter of 80 µm are provided in the interlayer resin insulating layer 50 under the conditions of a beam diameter of 5 mm, a top hat mode, a pulse width of 5.0 µm, a mask hole diameter of 0.5 mm and one shot (see FIG. 47(B)). Using a chromium acid, resin residues in the openings 48 are removed. By providing the transition layer 38 made of copper on each die pad 22, it is possible to prevent resin residues on the die pad 22, thereby improving connection characteristic between the die pad 22 and a via hole 60 to be described later and improving reliability. Furthermore, by interposing the transition layer 38 having a diameter of 60 µm or more on each die pad 22 having a diameter of about 40 µm, it is possible to ensure connecting the via hole opening 48 having a diameter of 60 µm. While the resin residues are removed by using a permanganic acid, a de-smear process can be also conducted using oxygen plasma. While the openings 48 are formed by laser herein, the openings can be formed by conducting exposure and development processes.

Figure 47C:
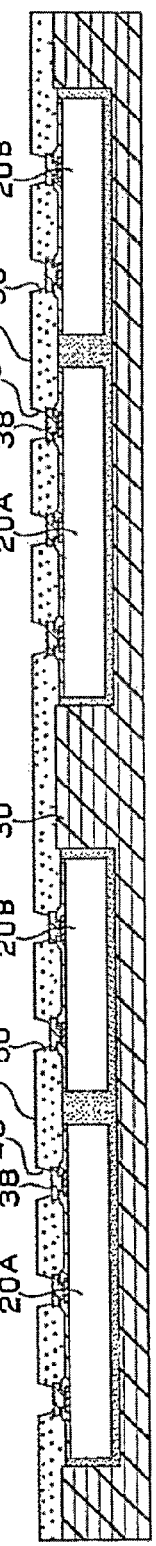

(10) Using an acid or an oxidizer, a rough surface 50α is formed on the interlayer resin insulating layer 50 (see FIG. 47(C)). The rough surface 50α is preferably formed in the range of 1 to 5 µm.

(11) An electroless plated film 52 is provided on the interlayer resin insulating layer 50 on which the rough surface 50α has been formed (see FIG. 48(A)). As a material for electroless plating, copper or nickel can be used. The thickness of the electroless plated film is preferably in the range of 0.3 µm to 1.2 µm. If the thickness is smaller than 0.3 µm, a metallic film cannot be often formed on the interlayer resin insulating layer. If the thickness exceeds 1.2 µm, the metallic film remains after etching and short-circuit often occurs between conductors. The plated film is formed with the same plating solution as that in the first embodiment under the same plating conditions as those in the first embodiment.

(12) A commercially available photosensitive dry film is bonded to the substrate 30 which has been subjected to the above processes, a chromium glass mask is mounted, exposure is performed at 40 mj/cm$^2$ and then a development process is conducted with 0.8% sodium carbonate, thereby providing a plating resist 54 having a thickness of 25 µm. Next, electroplating is conducted to form an electroplated film 56 having a thickness of 18 µm (see FIG. 48(B)).

(13) After peeling and removing the plating resist 54 with 5% NaOH, the plated film layer 52 under the plating resist is dissolved and removed by etching using a mixture solution of a nitric acid and hydrogen peroxide, conductor circuits 58 each comprising the plated film layer 52 and the electroplated film 56 and having a thickness of 16 µm and via holes 60 are formed and rough surfaces 58α and 60α are formed using an etching solution containing a cupric salt complex and an organic acid (see FIG. 48(C)). Alternatively, the rough surfaces can be formed by electroless plating or an oxidization-reduction process.

(14) Next, the steps of (9) to (13) stated above are repeated, thereby forming an upper interlayer resin insulating layer 150 and conductor circuits 158 (including via holes 160) (see FIG. 49(A)).

(15) Next, the same solder resist composition as that in the first embodiment is applied to the substrate 30 to have a thickness of 30 µm and a drying process is conducted at 70° C. for 20 minutes and 70° C. for 30 minutes. Then, a photomask film having a pattern of the solder resist opening portions drawn thereon and a thickness of 5 mm is made hermetic contact with the solder resist layer 70, exposure is performed with ultraviolet rays with 1000 mj/cm$^2$ and then a development process is performed with a DMTG solution, thereby forming openings 71 each having an opening diameter of 460 µm (see FIG. 49(B)).

(16) Next, the substrate on which the solder resist layer (or organic resin insulating layer) 70 has been formed, is immersed in the same electroless nickel plating solution as that in the first embodiment, and a nickel plate layer 72 having a thickness of 5 µm is formed on each opening portion 71. Then, the substrate is further immersed in the electroless plating solution as that in the first embodiment and a gold plated layer 74 having a thickness of 0.03 µm is formed on the nickel plated layer 72, thereby forming a solder pad 75 on each conductor circuit 158 (see FIG. 49(C)).

(17) Thereafter, a solder paste is printed on the opening portions 71 of the solder resist layer 70 and reflow is conducted at 200° C., thereby forming solder bumps 76. Then, the resultant substrate is divided into pieces by dicing or the like to obtain pieces of printed circuit boards 10 (see FIG. 50).

First Other Example of Second Modification of Third Embodiment

Next, a printed circuit board according to the first other example of the third embodiment will be described with reference to FIGS. 51 to 52.

Figure 52:
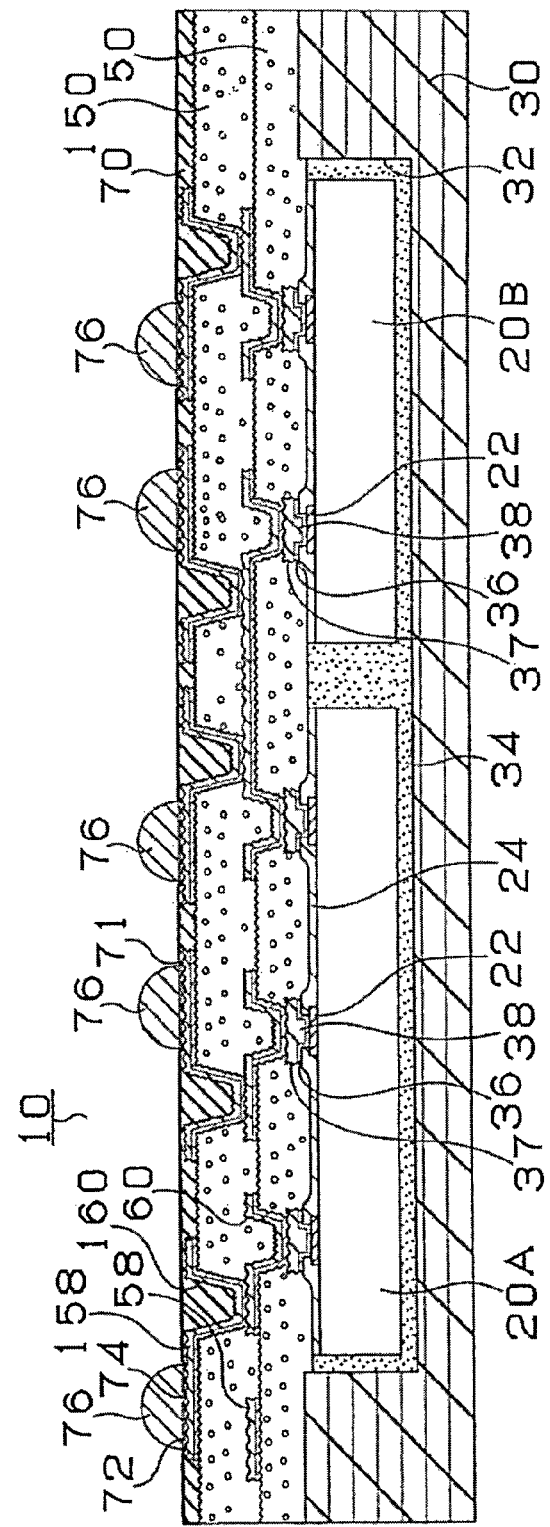
FIG. 52 is a cross-sectional view of the multilayer printed circuit board according to the first other example of the second modification.

FIG. 52 shows the printed circuit board according to the first other example. The printed circuit board according to the first other example is the same as the printed circuit board according to the second modification stated above with reference to FIG. 50. However, in the second modification stated above, the IC chips are contained in the core substrate 30 and then the transition layers 38 are formed. In the first other example, by contrast, transition layers 38 are formed on IC chips and then the IC chips are contained in a core substrate as in the case of the first embodiment.

Next, description will be given to the method of manufacturing the multilayer printed circuit board according to the first other example shown in FIG. 52 constituted by containing semiconductor devices (or IC chips) 20A and 20B in the through holes of a core substrate, with reference to FIG. 51. Here, transition layers 38 are provided on the IC chips 20A and 20B in the same manner as the manufacturing method of the first embodiment described above.

(1) First, an insulating resin substrate (or core substrate) 30 in which prepregs each having a core material made of glass cloths or the like and impregnated with a resin such as epoxy are built up, is used as a starting material (see FIG. 51(A)). Next, recesses 32 for containing IC chips are formed on one side of the core substrate 30 by counter boring (see FIG. 51(B)). While the recesses are provided by counter boring herein, it is also possible to form a core substrate having containing sections by laminating an insulating resin substrate having opening portions and an insulating resin substrate without openings.

(2) Then, an adhesive material 34 is applied to the recesses 32 using a printing machine. At this time, potting instead of application may be conducted. Next, IC chips 20A and 20B are mounted on the adhesive material 34 (see FIG. 51(C)).

(3) Then, the upper surfaces of the IC chips 20A and 20B are depressed or struck to thereby completely contain the IC chips 20A and 20B in the recesses 32 (see FIG. 51(D)). By doing so, the core substrate 30 can be smoothed. Since following steps are the same as those in the second modification described above with reference to FIGS. 47 to 49, no description will be given thereto.

In the third embodiment, by providing the transition layers on the die pads, it is possible to prevent resin residues on the pads and the connection characteristics between the die pads and the via holes and reliability can be improved. Further, multiple multilayer printed circuit boards provided with semiconductor devices are manufactured. Then, the substrate is cut into pieces and a plurality of multilayer printed circuit boards are obtained. Due to this, it is possible to efficiently manufacture highly reliable multilayer printed circuit boards.

Moreover, compared with the conventional IC chip mounting method, the wiring length from the IC chip to the substrate to the external substrate can be advantageously shortened and loop inductance can be advantageously reduced.

[Fourth Embodiment]

The fourth embodiment according to the present invention will be described hereinafter with reference to the drawings.

Figure 57:
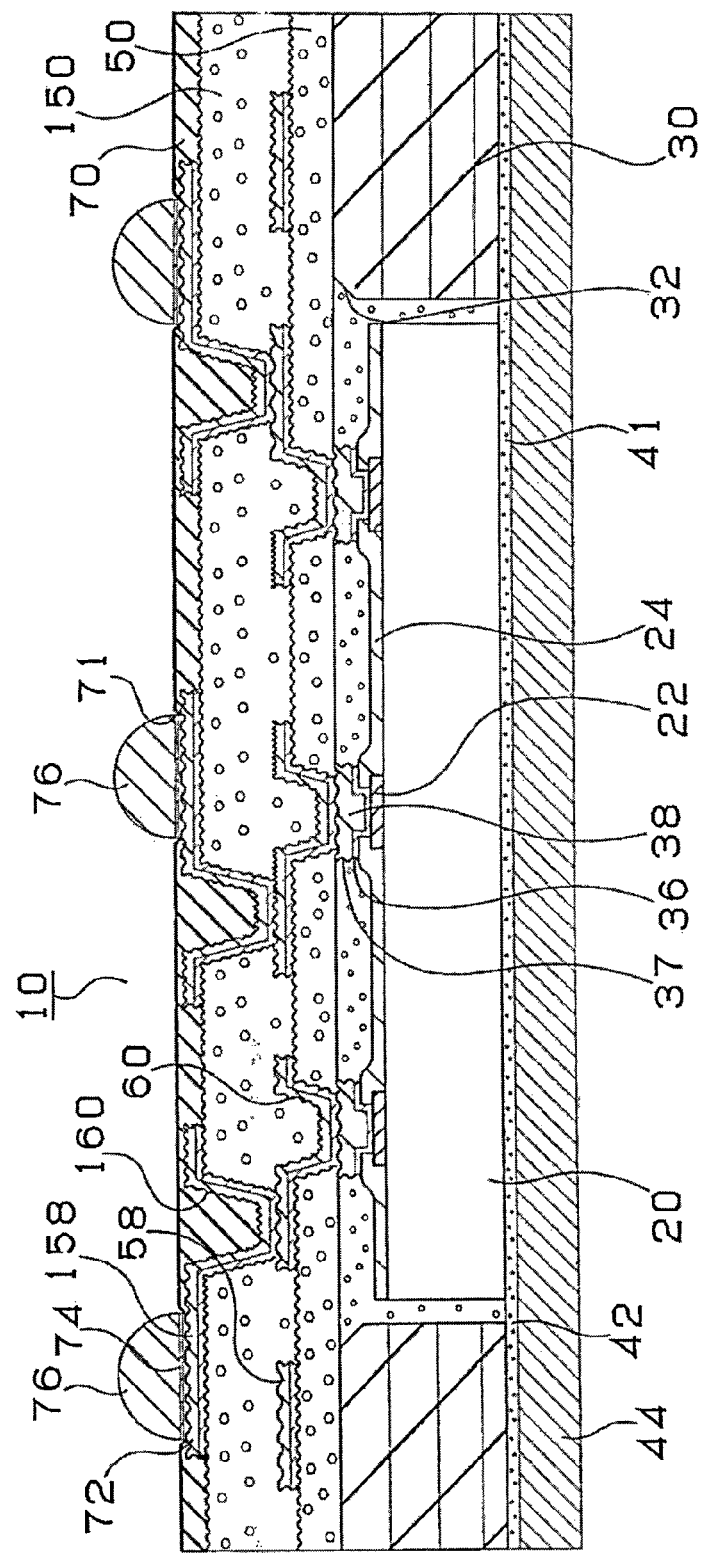
FIG. 57 is a cross-sectional view of the multilayer printed circuit board according to the fourth embodiment.
Figure 62A:
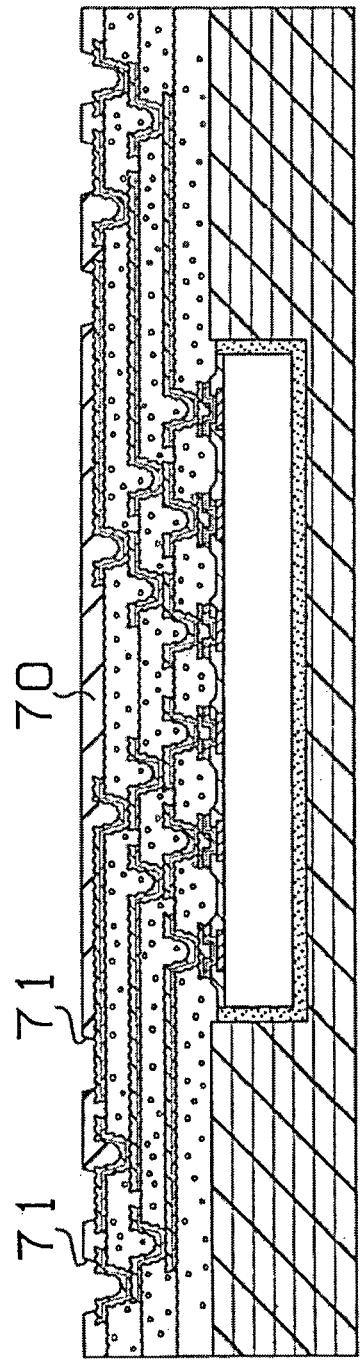
FIGS. 62(A) and 62(B) are manufacturing step views of the multilayer printed circuit board according to the fifth embodiment.
Figure 62B:
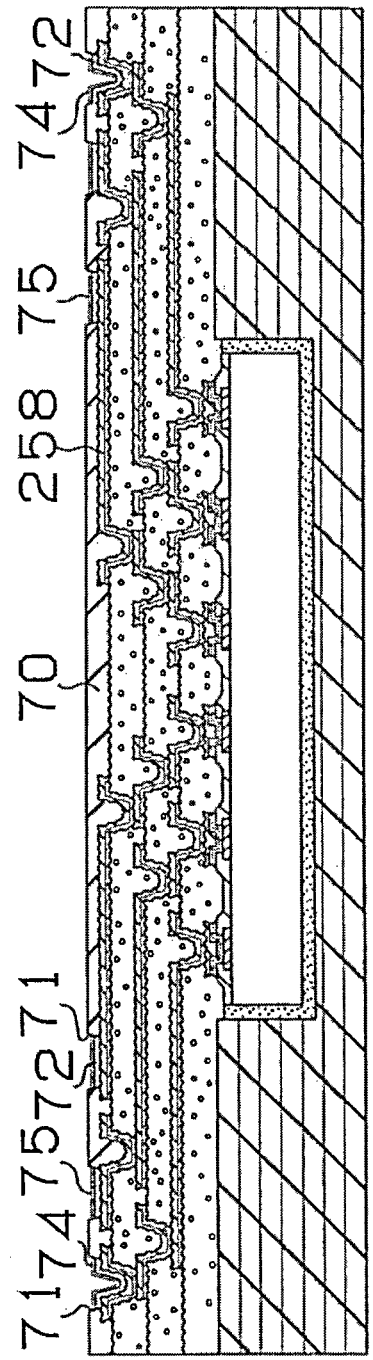

As shown in FIG. 57, a multilayer printed circuit board in the fourth embodiment comprises a core substrate 30 containing therein an IC chip 20, an interlayer resin insulating layer 50 and an interlayer resin insulating layer 150. Via holes 60 and conductor circuits 58 are formed on the interlayer resin insulating layer 50. Via holes 160 and conductor circuits 158 are formed on the interlayer resin insulating layer 150. A radiating plate 44 is attached to the rear surface of the IC chip 20.

A solder resist layer 70 is provided on the interlayer resin insulating layer 150. Solder bumps 76 for connecting to an external substrate, which is not shown, such as a daughter board or a mother board are provided on the conductor circuit 158 under the opening portions 71 of the solder resist layer 70.

As in the case of the first embodiment, die pads 22 and wirings (not shown) are provided on the upper surface of the IC chip 20, a passivation film 24 is covered on the die pads 22 and the wirings and the openings of the passivation film 24 are formed in the respective die pads 22. Transition layers 38 mainly comprising copper are formed on the respective die pads 22. Each transition layer 38 comprises a thin film layer 33 and an electroplated film 37.

In case of the multilayer printed circuit board 10 in the fourth embodiment, the IC chip 20 is integrated into a core substrate 30 and the transition layers 38 are provided on the respective pads 22 of the IC chip 20. Due to this, it is possible to connect the IC chip to the multilayer printed circuit board (or package substrate) electrically without using lead members and a sealing resin. Also, since the transition layers 38 are formed on the IC chip portion, the IC chip portion is flattened and the upper interlayer resin insulating layer 50 is flattened accordingly, thereby providing uniform film thickness. Further, the transition layers allow maintaining shape even if the upper via holes 60 are formed.

Moreover, by providing the transition layers 38 made of copper on the respective die pads 22, it is possible to prevent resin residues on the die pads 22 and to prevent the die pads 22 from being discolored or dissolved even after impregnating the multilayer printed circuit board in an acid, an oxidizer or an etching solution in a later step or conducting various annealing steps. Thus, connection characteristic between the die pads of the IC chip and the via holes and reliability can be improved. Furthermore, by interposing the transition layers 38 each having a diameter of 60 μm or more on the respective pads 22 each having a diameter of 40 μm, it is possible to ensure connecting the via holes each having a diameter of 60 μm.

Next, the method of manufacturing the multilayer printed circuit board according to the fourth embodiment will be described with reference to FIGS. 53 to 56.

(1) A core substrate 30 having the thickness of 0.5 mm, in which prepregs each having a core material made of glass cloths or the like and impregnated with a resin such as BT (Bismaleimide-Triazine) resin or epoxy are built up and cured, is used as a starting material. First, a through hole 32 for containing therein an IC chip is formed in a core substrate 30 (see FIG. 53(A)). While the resin substrate 30 having the core material impregnated with the resin is used herein, it is also possible to use a resin substrate without a core material. It is preferable to provide tapers 32a on the lower end opening portions of the through hole 32. By providing the tapers 32a, no bubbles remain among the IC chip 20, the filling resin 41 and the substrate 30 and the reliability of the multilayer printed circuit board can be improved.

Figures 53A, 53B, 53C, 53D, 53E:
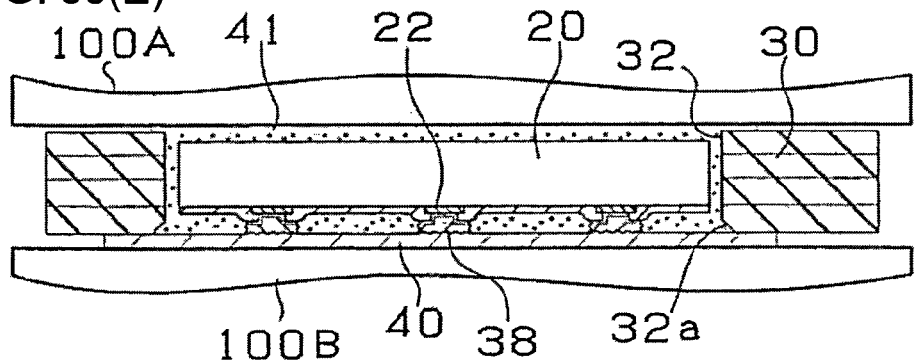
FIGS. 53(A), 53(B), 53(C), 53(D) and 53(E) are manufacturing step views of a multilayer printed circuit board according to the fourth embodiment of the present invention.

(2) Thereafter, a UV tape 40 is bonded to the bottom of the through hole 32 of the core substrate 30 (see FIG. 53(B)). As this UV tape 40, an adhesive tape such as Adwill D-201, D-203, D2303DF, D-204, D210 or D210 manufactured by LINTEC Corporation, which can be perfectly peeled because the bonding force of the adhesive surface of the tape is lost by being applied with UV, can be used. While the UV tape is used herein, various types of adhesive tapes, such as a polyimide tape, the stickiness of which does not lower at a high temperature of 80° C. or more are available.

(3) The IC chip 20 described above with reference to FIG. 3(B) is put on the UV tape 40 on the through hole 32 formed in the core substrate 30 so that die pads 38 contact with the surface to which the UV tape 40 adheres (see FIG. 53(C)).

(4) Filler 41 is filled into the through hole 32 formed in the core substrate 30 (see FIG. 53(D)). The filler 41 is filled by printing, mask printing, potting or the like. As this filler, a resin having a viscosity of 0.1 to 50 Pa·s and obtained by mixing an imidazole, aminic or acid anhydride hardening agent or the like and filler (organic particles, inorganic particles or metallic particles) as well as a solvent (such as a ketone solvent or a toluene solvent) at need in an epoxy resin, a polyimide resin or the like can be appropriately used. As the filler, a thermosetting resin, a thermoplastic resin or a mixture thereof can be used.

(5) After filling the filler 41, the pressure of resultant substrate is reduced in a pressure reducing chamber for about 10 minutes to remove bubbles in the filler 41. By doing so, no bubbles remain in the filler 41 and the reliability of the multilayer printed circuit board can be improved.

(6) The core substrate 30 described above is pressurized from vertical direction by stainless (SUS) press plates 100A and 100B for ten minutes (see FIG. 53(E)). Thereafter, while keeping pressure, the substrate is heated at 70° C. to 120° C. for about 30 minutes to thereby temporarily cure the filler 41. It is preferable that pressurization and pressurization and/or temporary curing are conducted under a reduced pressure atmosphere. By reducing pressure, no bubbles remain among the IC chip 20, the core substrate 30 and the filler 41 and in the filler 41 and the reliability of the multilayer printed circuit board can be improved. Since pressure is applied to the die pads 38 while the UV tape 40 functions as a buffer during pressurization, the die pads 38 are not damaged.

Figure 54A:
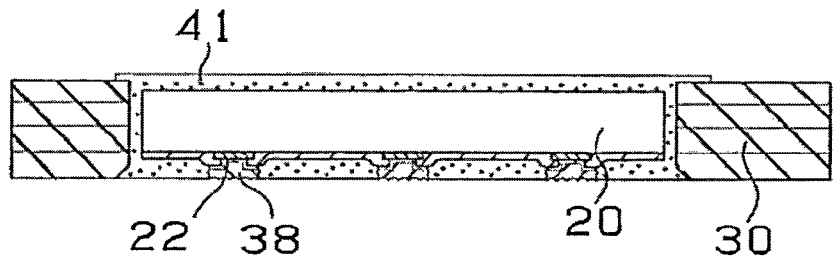
FIGS. 54(A), 54(B), 54(C), 54(D) and 54(E) are manufacturing step views of the multilayer printed circuit board according to the fourth embodiment.

(7) The UV tape 40 on the core substrate 30 having the filler 41 temporarily cured is applied with UV to remove the adhesion of the tape and then peeled (see FIG. 54(A)). Since the UV tape 40 is used in the fourth embodiment, no adhesive remains on the die pads 38 of the IC chip and the UV tape 40 can be perfectly peeled without damaging die pads 38. Due to this, it is possible to appropriately connect the via holes 60 to the respective die pads 38 in a later step.

Figure 54B:
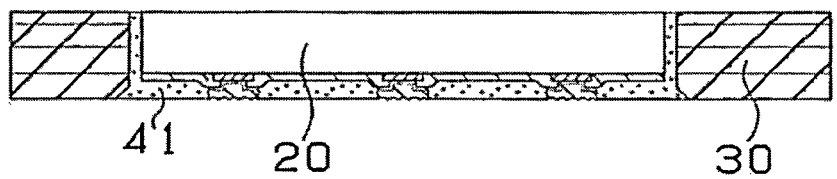

(8) Thereafter, the filler 41 and the core substrate 30 on the rear surface of the IC chip 20 are polished by belt sander polishing using belt abrasive paper (manufactured by Sankyo Chemical), thus exposing the rear surface side of the IC chip 20 (see FIG. 54(B)). Since the polishing is conducted in a state in which the filer 41 is temporarily cured in the fourth embodiment, the filler 41 and the core substrate 30 can be easily polished.

(9) Thereafter, heat is further applied to actually cure the filler 41, thereby forming a core substrate 30 containing therein the IC chip 20. This actual curing is preferably conducted under a reduced pressure atmosphere. By reducing pressure, no bubbles remain in the filler 41 and no grooves are formed. Besides, it is possible to improve the reliability and smoothness of the multilayer printed circuit board.

Figure 54C:
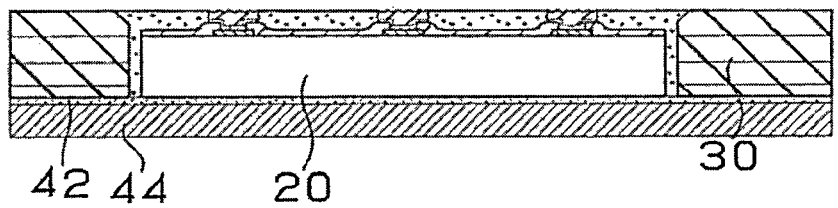

(10) A radiating plate 44 is attached to the rear surface of the IC chip 20 through a thermally conductive adhesive (e.g. a resin containing metallic particles) 42 (see FIG. 54(C)). As the radiating plate, a metallic plate such as an aluminum or copper plate or a ceramic plate can be used. Since the bottom side of the core substrate 30 is polished and the bottom of the IC chip 20 is exposed in the fourth embodiment, it is possible to attach the radiating plate 44 to the bottom of the IC chip and to improve the stability of the operation of the IC chip 20.

Figure 54D:
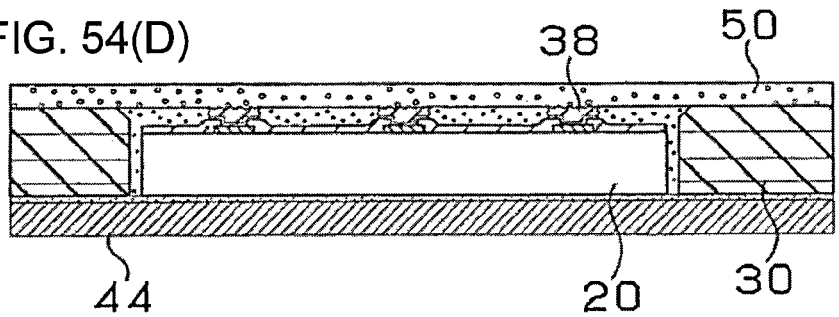
Figure 54E:
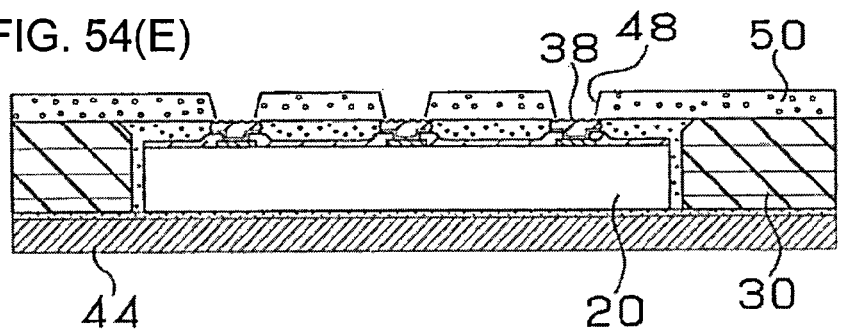

(11) A thermosetting resin sheet having a thickness of 50 μm is vacuum-compression laminated onto the surface of the IC chip which has gone through the above-stated steps at a pressure of 5 kg/cm² while raising temperature to 50 to 150° C., thereby providing an interlayer resin insulating layer 50 (see FIG. 54(D)). The degree of vacuum at the time of vacuum compression is 10 mmHg.

(12) Next, using $CO_2$ gas laser having a wavelength of 10.4 μm, via hole openings 48 each having a diameter of 60 μm are provided in the interlayer resin insulating layer 50 under the conditions of a beam diameter of 5 mm, a top hat mode, a pulse width of 5.0 sec., a mask hole diameter of 0.5 mm and one shot (see FIG. 54(B)). Using an oxidizer such as a chromium acid or a permanganic acid, resin residues in the openings 48 are removed. By providing the transition layer 38 made of copper on each die pad. 22, it is possible to prevent resin residues on the die pad 22, thereby improving connection characteristic between the die pad 22 and the via hole 60 to be described later and improving reliability. Furthermore, by interposing the transition layer 38 having a diameter of 60 μm or more on the die pad 22 having a diameter of 40 μm, it is possible to ensure connecting the via hole opening 48 having a diameter of 60 μm. While the resin residues are removed by using the oxidizer, a de-smear process can be also conducted using oxygen plasma.

Figure 55A:
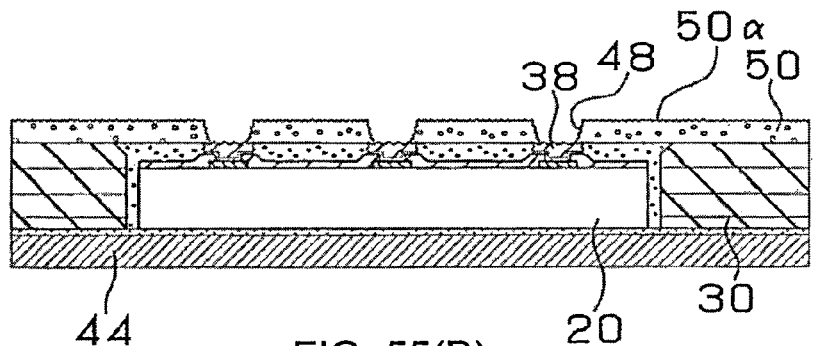
FIGS. 55(A), 55(B), 55(C) and 55(D) are manufacturing step views of the multilayer printed circuit board according to the fourth embodiment.

(13) Next, the resultant substrate is immersed in an oxidizer, such as a chromic acid or a permanganic acid, or the like, thereby providing the rough surface 50α of the interlayer resin insulating layer 50 (see FIG. 55(A)). The rough surface 50α is preferably formed in the range of 0.1 to 5 μm. For example, the substrate is immersed in 50 g/l of a sodium permanganate solution at a temperature of 60° C. for 5 to 25 minutes, thereby providing a rough surface 50α of 2 to 3 μm. Alternatively, by performing a plasma process, a rough surface 50α can be formed on the surface of interlayer resin insulating layer 50.

Figure 55B:
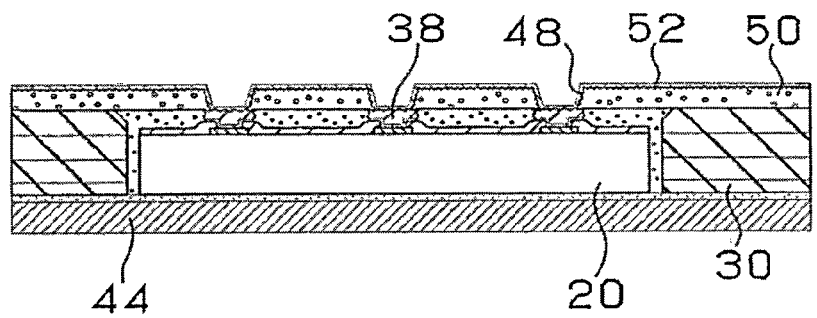
Figure 55C:
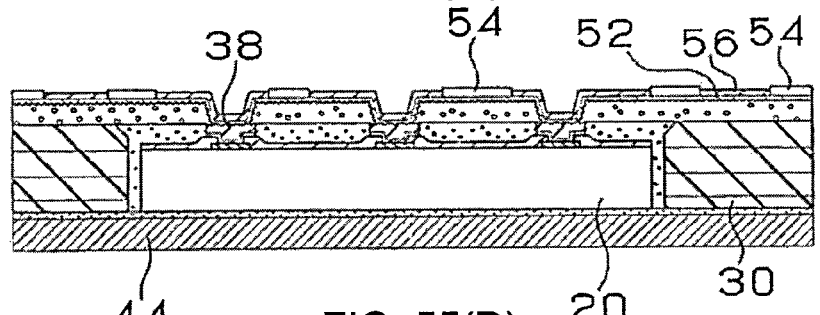

(14) A metallic layer 52 is provided on the interlayer resin insulating layer 50 on which the rough surface 50α has been formed (see FIG. 55(B)). The metallic layer 52 is formed by electroless plating. By supplying a catalyst such as a palladium catalyst to the surface layer of the interlayer resin insulating layer 50 in advance and immersing the substrate into an electroless plating solution for 5 to 60 minutes, the metallic layer 52 which is a plated film in the range of 0.1 to 5 μm is provided.

Alternatively, an Ni/Cu metallic alloy 52 can be formed on the surface of the interlayer resin insulating layer 50 using the same device as that used for the above-stated plasma process.

(15) A commercially available photosensitive dry film is bonded to the substrate 30 which has gone through the above processes, a photomask film is mounted, exposure is performed at 100 mj/cm² and then a development process is conducted with 0.8% sodium carbonate, thereby providing a plating resist 54 having a thickness of 15 μm. Next, electroplating is conducted under the same conditions as in the first embodiment to thereby form an electroplated film 56 having a thickness of 15 μm (see FIG. 55(C)).

Figure 55D:
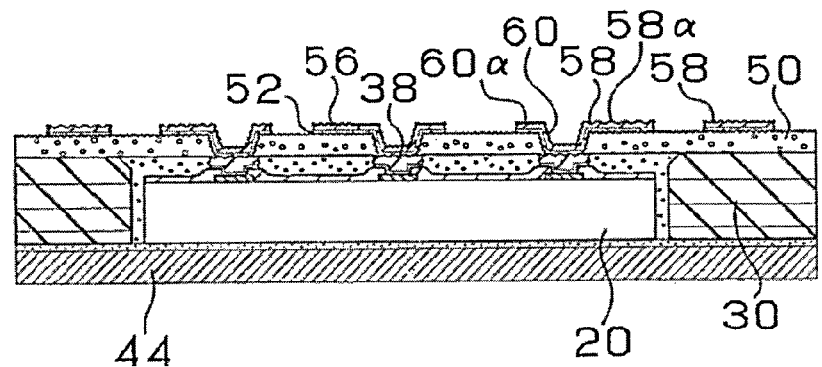

(16) After peeling and removing the plating resist 54 with 5% NaOH, the metallic layer 52 under the plating resist is dissolved and removed by etching using a mixture solution of a nitric acid, a sulfuric acid and a hydrogen peroxide, conductor circuits 58 each comprising the metallic layer 52 and the electroplated film 56 and having a thickness of 16 μm and via holes 60 are formed and rough surfaces 58α and 60α are formed using an etching solution containing a cupric salt complex and an organic acid (see FIG. 55(D)). In the fourth embodiment, as stated above with reference to FIG. 53(E), the surface of the core substrate 30 is formed completely smoothly, so that the IC chip 20 can be appropriately connected to the transition layers 38 through the via holes 60. Due to this, the reliability of the multilayer printed circuit board can be improved.

Figure 56A:
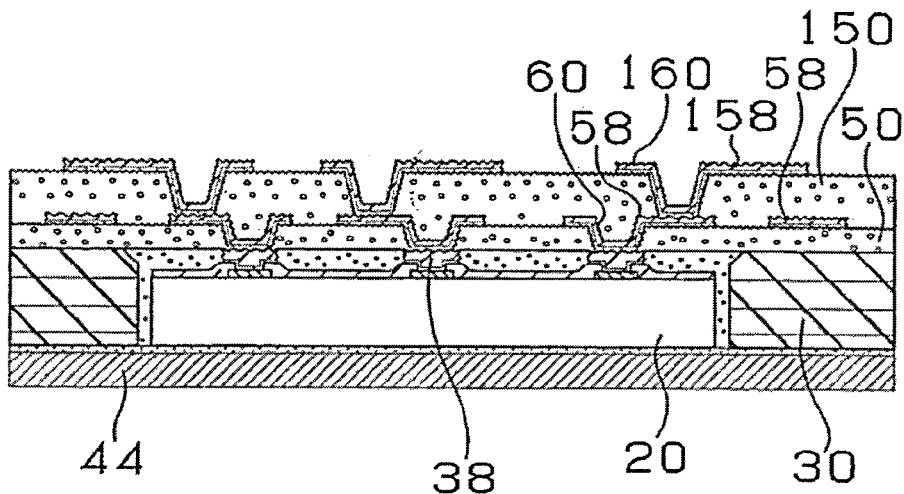
FIGS. 56(A), 56(B) and 56(C) are manufacturing step views of the multilayer printed circuit board according to the fourth embodiment.
Figure 56B:
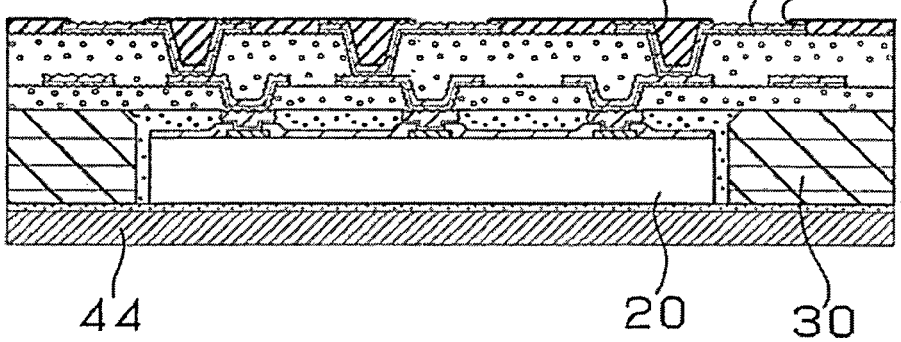
Figure 56C:
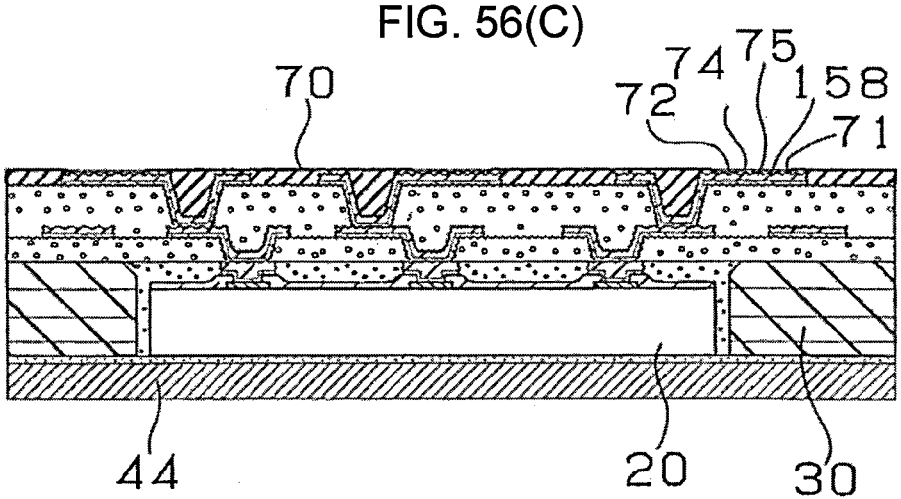

(17) Next, the steps of (6) to (11) stated above are repeated, thereby forming an upper interlayer resin insulating layer 150 and conductor circuits 158 (including via holes 160) (see FIG. 56(A)).

(18) Then, the solder resist composition (or organic resin insulating material) prepared in the same manner as that in the first embodiment is obtained.

(19) Next, the above-stated solder resist composition is applied to the substrate 30 to have a thickness of 20 μm and a drying process is conducted at 70° C. for 20 minutes and 70° C. for 30 minutes. Then, a photomask having a pattern of solder resist opening portions drawn thereon and a thickness of 5 mm is made hermetic contact with the solder resist layer 70, exposure is performed with ultraviolet rays with 1000 mj/cm$^2$ and then a development process is performed with a DMTG solution, thereby developing by DMTG solution, and forming openings 71 each having a diameter of 200 μm (see FIG. 56(B)).

(20) Next, a nickel plated layer 72 having a thickness of 5 μm is formed on each opening portion 71 of the substrate on which the solder resist layer (or organic resin insulating layer) 70 has been formed. Further, a gold plated layer 74 having a thickness of 0.03 μm is formed on the nickel plated layer 72, thereby forming solder pads 75 on the respective conductor circuits 158 (see FIG. 56(C)).

(21) Thereafter, a solder paste is printed on the opening portions 71 of the solder resist layer 70 and reflow is conducted at 200° C., thereby forming solder bumps 76. As a result, it is possible to obtain a multilayer printed circuit board 10 into which the IC chip 20 is integrated and which has the solder bumps 76 (see FIG. 57).

In the fourth embodiment, the IC chip 20 is mounted so that the die pads 38 contact with the UV tape 40, the UV tape 40 is peeled and then the buildup layers are formed on the IC chip 20. Due to this, it is possible to appropriately, electrically connect the IC chip to the via holes 60 of the buildup layers and to manufacture a highly reliable multilayer printed circuit board into which a semiconductor device is integrated.

As stated above, according to the fourth embodiment, the semiconductor device is mounted on the sheet at the bottom of the through hole of the core substrate so that terminals contact with the sheet, the sheet is peeled after the resin is filled into the through hole and the buildup layers are formed. Namely, the semiconductor device is mounted on the sheet so that the terminals contact with the sheet and the buildup layers are formed on the semiconductor device after peeling the sheet. Thus, it is possible to appropriately, electrically connect the terminals to the wirings of the buildup layers and to manufacture a highly reliable multilayer printed circuit board into which the semiconductor device is integrated.

[Fifth Embodiment]

The fifth embodiment of the present invention will be described hereinafter.

The constitution of a multilayer printed circuit board according to the fifth embodiment will be described with reference to FIG. 63 which shows the cross section of a multilayer printed circuit board 10.

Figure 63:
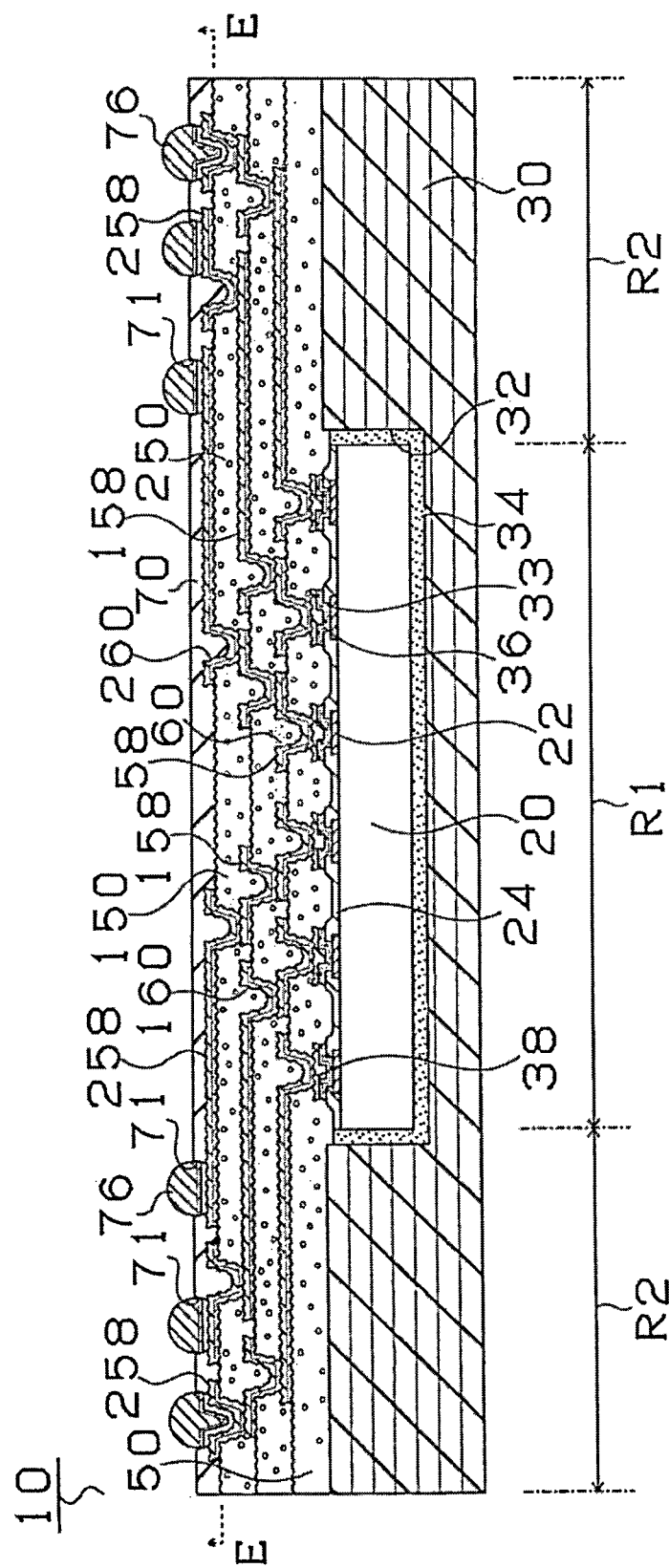
FIG. 63 is a cross-sectional view of the multilayer printed circuit board according to the fifth embodiment.

As shown in FIG. 63, the multilayer printed circuit board 10 comprises a core substrate 30 containing therein an IC chip 20, an interlayer resin insulating layer 50, an interlayer resin insulating layer 150 and an interlayer resin insulating layer 250. Via holes 60 and conductor circuits 58 are formed on the interlayer resin insulating layer 50. Via holes 160 and conductor circuits 158 are formed on the interlayer resin insulating layer 150. Via holes 260 and conductor circuits 258 are formed on the interlayer resin insulating layer 250.

A solder resist layer 70 is provided on the interlayer resin insulating layer 250. BGA's 76 for connecting to an external substrate, not shown, such as a daughter board or a mother board, are provided on the conductor circuits 258 under the respective opening portions 71 of the solder resist layer 70. The BGA's 76 are provided in a region R2 other than a region R1 right above the IC chip 20.

The IC chip 20 is covered with a passivation film 24 protecting the IC chip 20 and die pads 22 each constituting an input/output terminal are provided in the respective openings of the passivation film 24. Transition layers 38 mainly comprising copper are formed on the respective pads 22.

An adhesive material 34, which is a resin material, is filled between the IC chip 20 and the recess 32 of the substrate 30. The adhesive material 34 allows the IC chip 20 to be fixed in the recess of the substrate 30. Since this resin filler material 34 relaxes a stress generated by thermal expansion, it is possible to prevent the cracking of the core substrate 30 and the waviness of the interlayer resin insulating layers 50, 150 and 250 and the solder resist layer 70. Due to this, it is possible to prevent peeling and cracking from occurring to the surroundings of the BGA's 76. It is possible to prevent the detachment and positional error of the solder bumps 76, accordingly. It is, therefore, possible to improve electrical connection characteristics and reliability.

Figure 65:
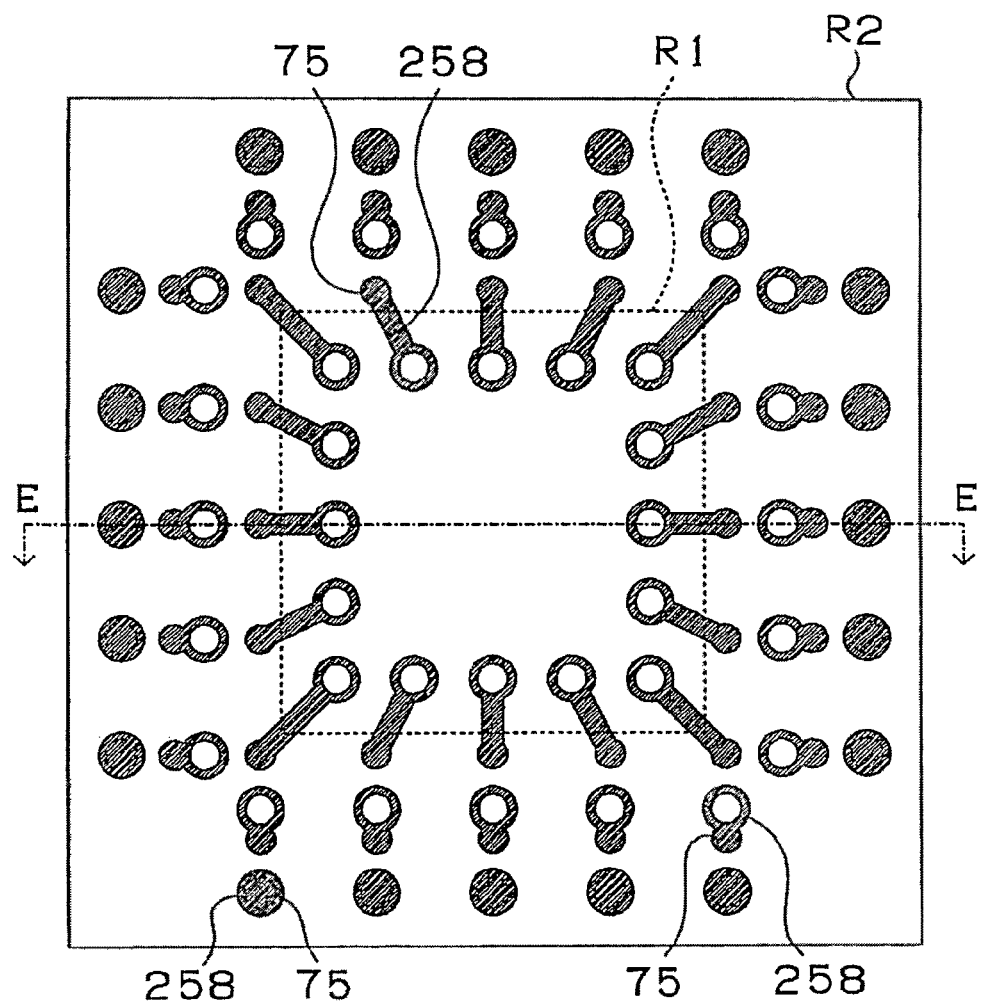
FIG. 65 is a cross-sectional view taken along line E-E of FIG. 63.

FIG. 65 shows the cross-sectional view of the multilayer printed circuit board 10 taken along line E-E of FIG. 63. An inside region denoted by a dotted line in FIG. 65 is a region R1 into which the IC chip 20 is integrated. A region outside of the dotted line and inside of a solid line in FIG. 65 is a region R2 into which the IC chip 20 is not integrated. The conductor circuits 258 are formed to radially spread from the region R1 to the region R2. The solder pads 75 to be connected to the BGA's 76, respectively, are arranged in the region R2 in a grid-like fashion.

Figure 66A:
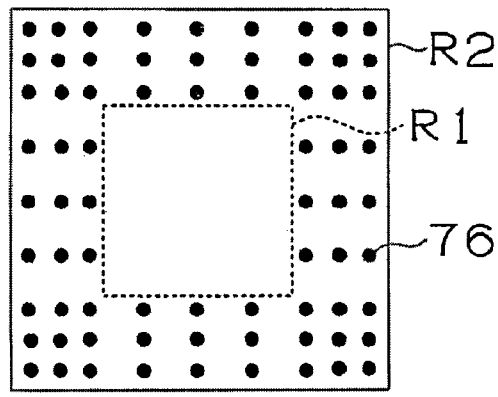
FIG. 66(A) is a plan view of the multilayer printed circuit board according to the fifth embodiment.
Figure 66B:
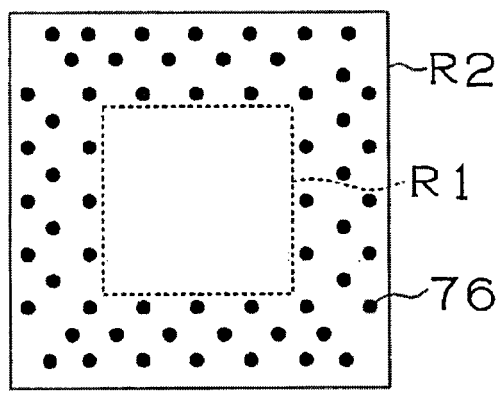
FIG. 66(B) is a plan view of the multilayer printed circuit board on which bumps are arranged in a staggered manner and FIG. 66(C) is a plan view of a multilayer printed circuit board according to a comparison.

FIG. 66(A) is a plan view of the multilayer printed circuit board 10 shown in FIG. 63. The BGA's 76 are arranged in the region R2 in a grid-like fashion and connected to the external substrate, not shown, such as a daughter board or a mother board. The BGA's 76 may be formed in the region R2 in a staggered fashion as shown in FIG. 66(B).

In case of the multilayer printed circuit board in the fifth embodiment, the BGA's 76 are provided in the region R2 on the substrate into which region the IC chip is not integrated.

That is, by providing the BGA's 76 in the region R2 other than the region right above the IC chip 20, it is possible to reduce the influence of the thermal expansion of the IC chip 20 made of ceramic and having a low coefficient of thermal expansion and the interlayer insulating layers 50, 150, 250 and the solder resist layer 70 each of which is made of resin and has a high coefficient of thermal expansion and, therefore, possible to prevent peeling and cracking from occurring to the surroundings of the BGA's 76 and the like. Accordingly, it is possible to prevent the detachment and positional error of the solder bumps 76 and to improve electrical connection characteristics and reliability.

In the multilayer printed circuit board 10 in this embodiment, the IC chip 20 is integrated into the core substrate 30 and the transition layers 38 are provided on the respective pads 22 of the IC chip 20. Due to this, it is possible to electrically connect the IC chip to the multilayer printed circuit board (or package substrate) without using lead members and a sealing resin. Further, since the transition layers 38 are formed on the IC chip portion, the IC chip portion is flattened and the upper interlayer insulating layer 50 is, therefore, flattened to thereby provide uniform film thickness. Further, because of the transition layers, it is possible to maintain the stability of shape even if the via holes 60 provided in the upper layer are formed.

Furthermore, by providing the transition layers 38 made of copper on the respective die pads 22, it is possible to prevent resin residues on the die pads 22 and to prevent the die pads 22 from being discolored or dissolved even after impregnating the multilayer printed circuit board in an acid, an oxidizer or an etching solution in a later step or conducting various annealing steps. Thus, connection characteristic between the die pads of the IC chip and the via holes and reliability can be improved. Besides, by interposing the transition layers 38 each having a diameter of 60 μm or more on the respective pads 22 each having a diameter of 40 μm, it is possible to ensure connecting the via holes each having a diameter of 60 μm.

Next, the method of manufacturing the multilayer printed circuit board in the fifth embodiment described above with reference to FIG. 63 will be described with reference to FIGS. 58 to 62.

(1) First, an insulating resin substrate (or a core substrate) 30 in which prepregs each having a core material made of glass cloths or the like and impregnated with a resin such as epoxy are built up, is prepared as a starting material (see FIG. 58(A)). Next, a recess 32 for containing therein an IC chip is formed on one side of the core substrate 30 by counter boring (see FIG. 58(B)). While the recess is provided by counter boring herein, it is also possible to form a core substrate having a containing section by building up an insulating resin substrate having an opening to an insulating resin substrate without an opening.

As the resin substrate into which an electronic component such as an IC chip is integrated, a resin such as an epoxy resin, a BT resin, a phenol resin or the like impregnated with a reinforcement or a core material such as a glass epoxy resin, a substrate in which prepregs impregnated with an epoxy resin are built up, or the like is used. Normally, a substrate used for a printed circuit board can be used. Alternatively, a two-sided copper-clad laminated board, a one-side board, a resin board which does not include a metallic film or a resin film can be used. It is noted, however, a resin is resolved and carbonated if heated at a temperature of 350° C. or higher.

(2) Thereafter, an adhesive material 34 is applied to the recess 32 using a printing machine. At this time, potting instead of application may be conducted. Next, an IC chip 20 according to the manufacturing method of the first embodiment is mounted on the adhesive material 34 (see FIG. 58(C)). As the adhesive material 34, a resin having a higher coefficient of thermal expansion than that of the core substrate 30 is used. Such an adhesive material absorbs the difference in thermal expansion between the IC chip 20 and the core substrate 30.

(3) Then, the upper surface of the IC chip 20 is depressed or struck to thereby completely contain the IC chip 20 in the recess 32 (see FIG. 58(D)). By doing so, the core substrate 30 can be smoothed. At this moment, the adhesive material 34 is sometimes applied on the upper surface of the IC chip 20. However, as described later, since resin layers are provided on the upper surface of the IC chip 20 and then openings for via holes are provided by laser, the adhesive material 34 does not influence the connection between transition layers 38 and via holes.

(4) A thermosetting resin sheet having a thickness of 50 μm is vacuum-compression laminated onto the substrate 30 which has gone through the above-stated steps at a pressure of 5 kg/cm$^2$ while raising temperature to 50 to 150° C., thereby providing an interlayer resin insulating layer 50 (see FIG. 59(A)). The degree of vacuum at the time of vacuum compression is 10 mmHg.

Also, the interlayer resin insulating layer 50 can be formed by applying a resin composition the viscosity of which has been adjusted in advance by a roll coater or a curtain coater instead of forming the semi-cured resin into a film shape to heat-compress as stated above.

(5) Next, using $CO_2$ gas laser having a wavelength of 10.4 μm, via hole openings 48 each having a diameter of 60 μm are provided in the interlayer resin insulating layer 50 under the conditions of a beam diameter of 5 mm, a top hat mode, a pulse width of 5.0 microseconds, a mask hole diameter of 0.5 mm and one shot (see FIG. 59(B)). Using a permanganic acid at a temperature of 60° C., resin residues in the openings 48 are removed. By providing a transition layer 38 made of copper on each die pad 22, it is possible to prevent resin residues on the pad 22, thereby improving connection characteristic between the pad 22 and a via hole 60 to be described later and improving reliability. Furthermore, by interposing the transition layer 38 having a diameter of 60 μm or more on the die pad 22 having a diameter of 40 μm, it is possible to ensure connecting the via hole opening 48 having a diameter of 60 μm. While the resin residues are removed by using a permanganic acid, a de-smear process can be also conducted using oxygen plasma.

(6) Next, the resultant substrate is immersed in an oxidizer, such as a chromic acid or a permanganic acid, or the like, thereby providing the rough surface 50α of the interlayer resin insulating layer 50 (see FIG. 59(C)). The rough surface 50α is preferably formed to have a thickness in the range of 0.05 to 5 μm. For example, the substrate is immersed in 50 g/l of a sodium permanganate solution at a temperature of 60° C. for 5 to 25 minutes, thereby providing a rough surface 50α of 2 to 3 μm. Alternatively, by performing a plasma process, the rough surface 50α can be formed on the surface of interlayer resin insulating layer 50.

(7) A metallic layer 52 is provided on the interlayer resin insulating layer 50 on which the rough surface 50α has been formed (see FIG. 60(A)). The metallic layer 52 is formed by electroless plating. By supplying a catalyst such as a palladium catalyst to the surface layer of the interlayer resin insulating layer 50 in advance and immersing the substrate into an electroless plating solution for 5 to 60 minutes as in the first embodiment, the metallic layer 52, which is a plated film, is provided in the range of 0.1 to 5 μm.

Alternatively, an Ni/Cu metallic layer 52 can be formed on the surface of the interlayer resin insulating layer 50 using the same device as that used in the above-stated plasma process. The metallic film can be formed by deposition, electro-deposition or the like instead of sputtering. It is also possible to form a thin layer by a physical method such as sputtering, deposition or electro-deposition and to then conduct electroless plating.

(8) A commercially available photosensitive dry film is bonded to the substrate 30 which has been subjected to the above process, a photomask film is mounted, exposure is conducted at 100 mj/cm$^2$ and then a development process is conducted with 0.8% sodium carbonate, thereby providing a plating resist 54 having a thickness of 15 μm (see FIG. 60(B)). Then, electroplating is conducted under the same conditions as those in the first embodiment, thereby forming an electroplated film 56 having a thickness of 15 μm (see FIG. 60(C)).

(9) After peeling and removing the plating resist 54 with 5% NaOH, the metallic layer 52 under the plating resist is dissolved and removed by etching using a mixture solution of a nitric acid, a sulfuric acid and hydrogen peroxide, conductor circuits 58 each comprising the metallic layer 52 and the electroplated film 56 and having a thickness of 16 µm and via holes 60 are formed (see FIG. 61(A)). As the etching solution, cupric chloride, ferric chloride, persalt, hydrogen peroxide/sulfuric acid, alkaline etchant or the like can be used. Next, using an etching solution containing cupric complex, and organic acid, rough surfaces 58α and 60α are formed (see FIG. 61(B)).

(10) Next, the steps of (7) to (12) stated above are repeated, thereby forming an interlayer resin insulating layer 150 and conductor circuits 158 (including via holes 160) are formed on the upper layer of the interlayer resin insulating layer 50 and an interlayer resin insulating layer 250 and conductor circuits 258 (including via holes 260) (see FIG. 61(C)).

(11) Next, a solder resist composition prepared in the same manner as that in the first embodiment is obtained.

(12) Next, the solder resist composition is applied to the substrate 30 to have a thickness of 20 µm and a drying process is conducted. Then, a photomask is made hermetic contact with the solder resist layer 70, exposure and then a development process are performed, thereby forming openings 71 each having a diameter of 200 µm (see FIG. 62(A)).

(13) Next, a nickel plated layer 72 having a thickness of 5 µm is formed on each opening portion 71 of the substrate on which the solder resist layer (or organic resin insulating layer) 70 has been formed. Further, a gold plated layer 74 having a thickness of 0.03 µm is formed on the nickel plated layer 72, thereby forming a solder pad 75 on each conductor circuit 258 (see FIG. 62(B)).

Figure 64:
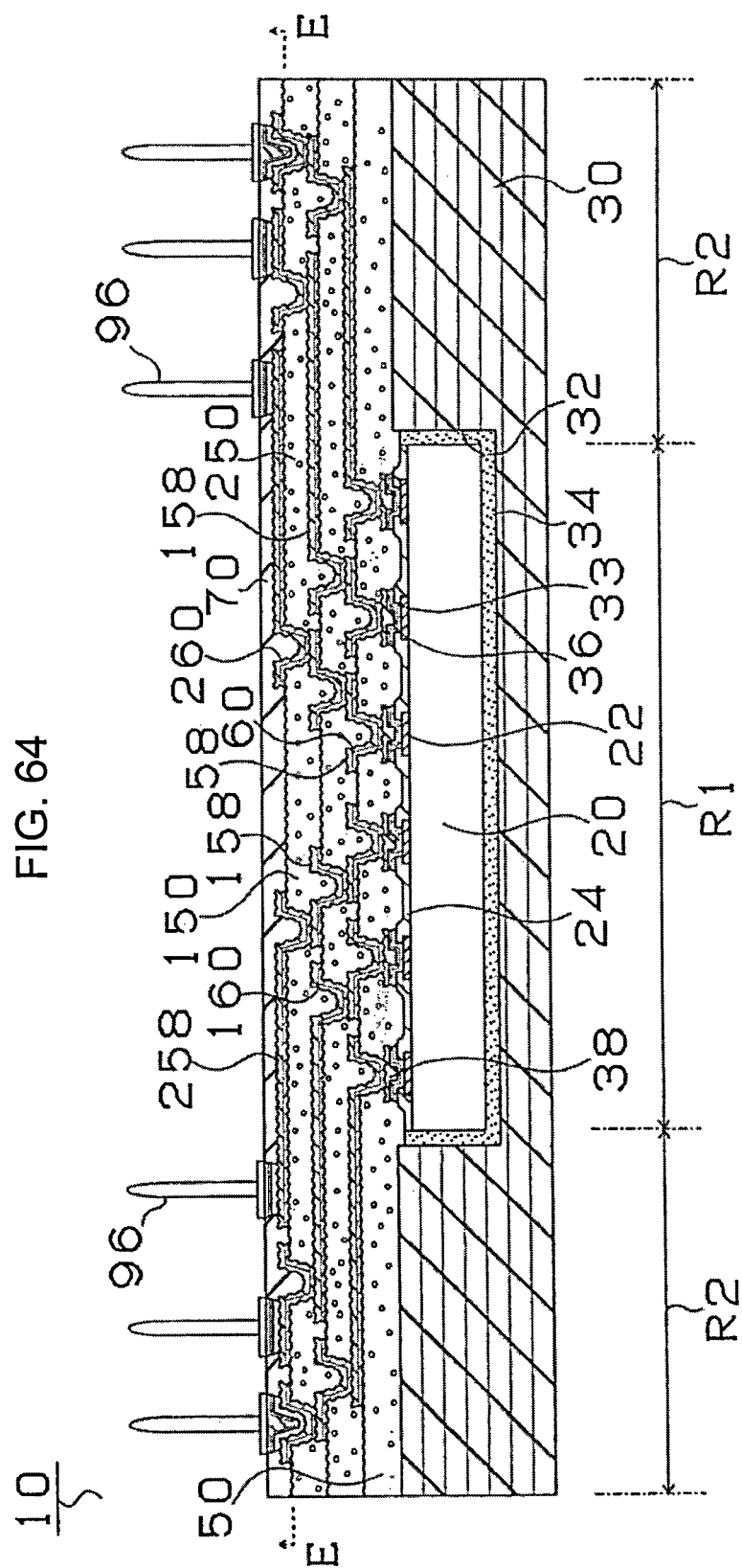
FIG. 64 is a cross-sectional view of the multilayer printed circuit board according to the fifth embodiment.

(14) Thereafter, a solder paste is printed on the opening portions 71 of the solder resist layer 70. As the solder paste, Sn/Pb, Sn/Sb, Sn/Ag, Sn/Ag/Cu or the like may be used. A solder paste of low α radiation ray type may be used. Next, reflow is conducted at 200° C., thereby forming BGA's 76 in the region R2 into which the IC chip 20 is not integrated in a grid-like fashion (or a staggered fashion) (see FIGS. 63, 66(A) and 66(B)). As a result, it is possible to obtain a multilayer printed circuit board 10 into which the IC chip 20 is integrated and which has the BGA's 76 (see FIG. 63). It is noted that the IC chip 20 may be arranged in a deviated position instead of the central portion of the substrate 30. In FIG. 63, the BGA's are arranged as external connection terminals. As shown in FIG. 64, even if PGA's 96 are attached as external connection terminals, it is preferably that the PGA's are provided in the region R2 into which the IC chip 20 is not integrated.

[Other Example of Fifth Embodiment]

Next, description will be given to a multilayer printed circuit board according to the other example of the fifth embodiment. In the fifth embodiment stated above, the via holes are formed in the interlayer resin insulating layers using laser. In this example, by contrast, via holes are formed by exposure. The method of manufacturing a multilayer printed circuit board according to the other example will be described with reference to FIG. 67.

(4) As in the case of the fifth embodiment, a thermosetting epoxy resin 51 having a thickness of 50 µm is applied to the substrate 30 which has gone through the steps (1) to (3) described above (see FIG. 67(A)).

(5) Next, a photomask film having black circles corresponding to via hole formed positions drawn thereon is put on the interlayer resin insulating layer 50 and exposure is conducted. Then, development is conducted by spraying a DMTG solution and a heat process is conducted, thereby providing openings 48 each having a diameter of 85 µm for via holes (see FIG. 67(B)).

(6) The surface of the interlayer resin insulating layer 50 is roughened with a permanganic acid or a chromic acid, thereby forming a rough surface 50α (see FIG. 67(C)). The thickness of the rough surface 50α is preferably in the range of 0.05 to 5 µm. Since following steps are the same as those in the fifth embodiment stated above, no description will be given thereto.

[First Modification of Fifth Embodiment]

Next, the method of manufacturing a multilayer printed circuit board according to the first modification will be described with reference to FIGS. 68 to 70. In the fifth embodiment stated above, the transition layers 38 are formed on the IC chip 20 and then the IC chip 20 is contained in the core substrate 30. In the first modification, by contrast, an IC chip is contained in a core substrate and then transition layers are formed.

(1) First, an insulating resin substrate (or core substrate) 30 in which prepregs each having a core material made of glass cloths or the like and impregnated with a resin such as epoxy are built up, is prepared as a starting material (see FIG. 68(A)). Next, a recess 32 for containing therein an IC chip is formed on one side of the core substrate 30 by counter boring (see FIG. 68(B)).

(2) Thereafter, an adhesive material 34 is applied to the recess 32 using a printing machine. At this time, potting instead of application may be conducted. Next, an IC chip 20 is mounted on the adhesive material 34 (see FIG. 68(C)).

Figure 69A:
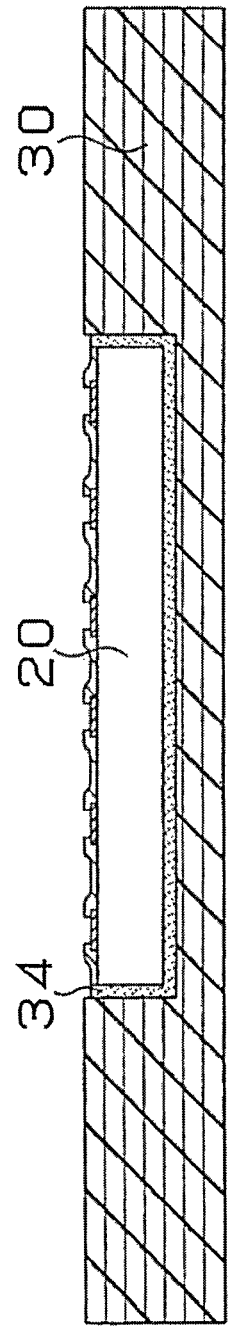
FIGS. 69(A), 69(B) and 69(C) are manufacturing step views of the multilayer printed circuit board according to first modification of the fifth embodiment.

(3) Then, the upper surface of the IC chip 20 is depressed or struck to thereby completely contain the IC chip 20 in the recess 32 (see FIG. 69(A)). By doing so, the core substrate 30 can be smoothed.

Figure 69B:
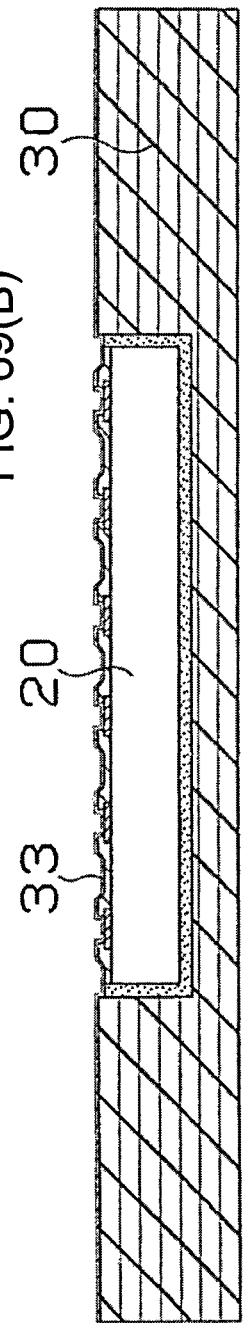

(4) Thereafter, the entire surface of the core substrate 30 which contains the IC chip 20 therein is subjected to physical deposition such as deposition or sputtering to thereby form a conductive metallic layer 33 on the entire surface (FIG. 69(B)). The metallic film may be preferably formed out of one or more metallic layers made of tin, chromium, titanium, nickel, zinc, cobalt, gold or copper or the like. The thickness thereof is preferably in the range of 0.001 to 2.0 µm, more preferably, 0.01 to 1.0 µm.

Figure 69C:
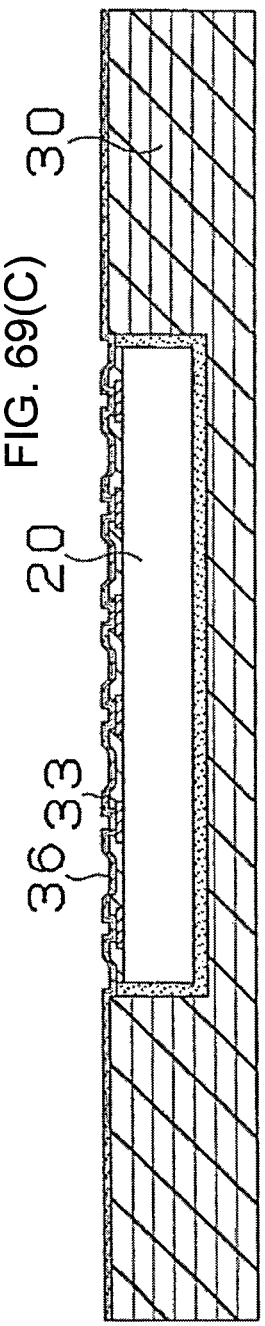

A plated film 36 may be formed on the metallic film 33 by electroless plating (see FIG. 69(C)). The types of plating materials include copper, nickel, gold, silver, zinc, iron and the like. In view of electrical characteristics, inexpensiveness and the fact that a buildup conductor layer to be formed in a later step mainly comprises copper, copper is preferably used. The thickness thereof is preferably in the range of 1 to 20 µm.

(5) Thereafter, a resist is applied, exposure and development are conducted to provide a plating resist 35 so as to provide openings on the upper portions of the respective die pads 22 of the IC chip 20, and electroless plating is conducted to thereby provide an electroless plated film 37 (see FIG. 70(A)). After removing the plating resist 35, the electroless plated film 36 and the metallic film 33 under the plating resist 35 are etched away, thereby forming transition layers 38 on the respective die pads 22 of the IC chip (see FIG. 70(B)). While the transition layers are formed by the plating resist herein, the transition layers 38 may be formed on the respective die pads 22 of the IC chip 20 by, after uniformly forming an electroplated film on the electroless plated film 36, forming an etching resist, conducting exposure and development to expose the metal other than that of the transition layers 38, and conducting etching. The thickness of the electroplated film is preferably in the range of 1 to 20 µm. If the thickness exceeds that range, undercut may possibly occur during the etching to generate gaps in the interfaces between the transition layers to be formed and the via holes.

(6) Next, an etching solution is sprayed onto the substrate and the surfaces of the transition layers 38 is etched, thereby forming rough surfaces 38α (see FIG. 70(C)). Since following steps are the same as those in the fifth embodiment, no description will be given thereto.

[Comparison Example 3]

Figure 66C:
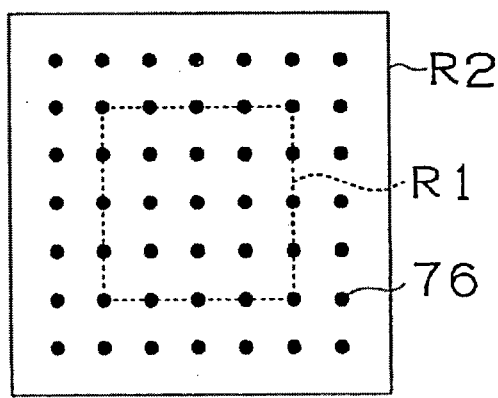

A multilayer printed circuit board according to comparison example 3 will be described. In the fifth embodiment stated above, the BGA's 76 are arranged in the region R2 other than the region right above the IC chip. In the comparison example 3, by contrast, BGA's 76 are uniformly arranged on a solder resist layer as shown in FIG. 66(C). Namely, the BGA's 76 are formed on the entire surface of the solder resist layer in a grid-like (or full grid-like) fashion without differentiating a region R1 from a region R2.

After connecting the multilayer printed circuit board according to the fifth embodiment and the multilayer printed circuit board according to the comparison example 3 to external substrates, respectively, the boards were electrically connected to the respective external substrate and the following items were estimated:

(a) Whether or not cracking and/or peeling occurred after mounting the multilayer printed circuit board onto the external substrate.

(b) Whether or not BGA's defects occurred.

(c) Whether or not cracking and/or peeling occurred after mounting the multilayer printed circuit board onto the external substrate after a reliability test.

(d) Whether or not BGA's defects occurred after the reliability test.

(e) Measurement of contact resistance.

The multilayer printed circuit board according to the fifth embodiment showed an appropriate result. In case of the comparison example 3, however, cracking and/or peeling was found in the surroundings of the BGA's. Also, it was found that the contact resistance increased. The same results were obtained if PGA's instead of the BGA's as shown in FIG. 64 were used.

As stated above, according to the fifth embodiment, the region on the substrate into which region the semiconductor device of the multilayer printed circuit board is integrated and the region on the substrate into which region the semiconductor device is not integrated are differentiated from each other. Then, the external connection terminals (BGA's/PGA's) are arranged in the region on the substrate into which region the semiconductor device is not integrated. Namely, by arranging the external connection terminals (BGA's/PGA's) in the region on the substrate into which region the semiconductor device is not integrated, the influence of thermal expansion can be reduced and peeling and/or cracking can be, therefore, prevented from occurring to the surroundings of the external connection terminals (BGA's/PGA's). Accordingly, it is possible to prevent the detachment or positional error of the external connection terminals (BGA's/PGA's) and to improve electrical connection characteristics and reliability.

What is claimed is:

1. A multilayer device, comprising:
    a resin layer;
    a semiconductor device positioned in the resin layer and comprising an electronic component and a passivation layer having an opening exposing an electrode of the electronic component;
    an intermediate layer comprising a plurality of metal layers and formed in the opening of the passivation layer such that the intermediate layer is connected to the electrode of the electronic component; and
    a buildup layer formed on the resin layer and comprising an insulating layer and a via conductor formed in the insulating layer such that the via conductor is connected to the intermediate layer,
    wherein the resin layer comprises at least one resin material selected from the group consisting of a thermosetting resin material and a thermoplastic resin material.

2. A multilayer device according to claim 1, further comprising:
    a conductive circuit formed on the insulating layer,
    wherein the via conductor formed in the insulating layer is connecting the intermediate layer and the conductive circuit formed on the insulating layer.

3. A multilayer device according to claim 1, wherein the via conductor comprises Cu, and the plurality of metal layers of the intermediate layer has an uppermost metal layer comprising Cu and connected to the via conductor.

4. A multilayer device according to claim 1, wherein the resin layer comprises the resin material and a plurality of inorganic particles.

5. A multilayer device according to claim 1, wherein the electronic component comprises an IC chip.

6. A multilayer device according to claim 2, wherein the via conductor comprises Cu, and the plurality of metal layers of the intermediate layer has an uppermost metal layer comprising Cu and connected to the via conductor.

7. A multilayer device according to claim 1, wherein the resin layer is made of a thermosetting resin material.

8. A multilayer device according to claim 7, further comprising:
    a conductive circuit formed on the insulating layer,
    wherein the via conductor formed in the insulating layer is connecting the intermediate layer and the conductive circuit formed on the insulating layer.

9. A multilayer device according to claim 8, wherein the via conductor comprises Cu, and the plurality of metal layers of the intermediate layer has an uppermost metal layer comprising Cu and connected to the via conductor.

10. A multilayer device according to claim 1, wherein the resin layer is made of a thermoplastic resin material.

11. A multilayer device according to claim 10, further comprising:
    a conductive circuit formed on the insulating layer,
    wherein the via conductor formed in the insulating layer is connecting the intermediate layer and the conductive circuit formed on the insulating layer.

12. A multilayer device according to claim 11, wherein the via conductor comprises Cu, and the plurality of metal layers of the intermediate layer has an uppermost metal layer comprising Cu and connected to the via conductor.

13. A multilayer device according to claim 5 wherein the resin layer is made of a thermosetting resin material.

14. A multilayer device according to claim 13, further comprising:
    a conductive circuit formed on the insulating layer,
    wherein the via conductor formed in the insulating layer is connecting the intermediate layer and the conductive circuit formed on the insulating layer.

15. A multilayer device according to claim 14, wherein the via conductor comprises Cu, and the plurality of metal layers of the intermediate layer has an uppermost metal layer comprising Cu and connected to the via conductor.

16. A multilayer device according to claim 5, wherein the resin layer is made of a thermoplastic resin material.

17. A multilayer device according to claim 16, further comprising:
a conductive circuit formed on the insulating layer,
wherein the via conductor formed in the insulating layer is connecting the intermediate layer and the conductive circuit formed on the insulating layer.

18. A multilayer device according to claim 17, wherein the via conductor comprises Cu, and the plurality of metal layers of the intermediate layer has an uppermost metal layer comprising Cu and connected to the via conductor.

19. A multilayer device according to claim 1, wherein the plurality of metal layers of the intermediate layer comprises a first metal layer, a second metal layer and a third metal layer.

20. A multilayer device according to claim 1, wherein the intermediate layer has a surface which is formed larger than a surface of the electrode of the electronic component.

* * * * *